US010734573B2

(12) United States Patent
Araki

(10) Patent No.: US 10,734,573 B2
(45) Date of Patent: Aug. 4, 2020

(54) THREE-DIMENSIONAL ARRAYS WITH MAGNETIC TUNNEL JUNCTION DEVICES INCLUDING AN ANNULAR DISCONTINUED FREE MAGNETIC LAYER AND A PLANAR REFERENCE MAGNETIC LAYER

(71) Applicant: SPIN MEMORY, INC., Freemont, CA (US)

(72) Inventor: Satoru Araki, San Jose, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

(21) Appl. No.: 16/059,012

(22) Filed: Aug. 8, 2018

(65) Prior Publication Data

US 2019/0296221 A1     Sep. 26, 2019

Related U.S. Application Data

(60) Provisional application No. 62/647,210, filed on Mar. 23, 2018.

(51) Int. Cl.
*H01L 43/02*     (2006.01)
*H01L 43/08*     (2006.01)
(Continued)

(52) U.S. Cl.
CPC ............... *H01L 43/02* (2013.01); *G11C 5/02* (2013.01); *G11C 7/06* (2013.01); *G11C 11/155* (2013.01); *G11C 11/161* (2013.01); *G11C 11/1657* (2013.01); *G11C 11/1659* (2013.01); *G11C 11/1673* (2013.01); *G11C 11/1675* (2013.01); *H01L 21/8221* (2013.01);
(Continued)

(58) Field of Classification Search
CPC ......... H01L 27/222–228; H01L 27/101; H01L 27/2481; H01L 27/249; H01L 43/02; H01L 25/0657; H01L 21/8221; H01L 45/1226; H01L 43/08; H01L 43/10; G11C 11/155; G11C 11/161; G11C 2211/5615
See application file for complete search history.

(56) References Cited

U.S. PATENT DOCUMENTS

| 4,597,487 A | 7/1986 | Crosby et al. |
| 5,541,868 A | 7/1996 | Prinz |

(Continued)

FOREIGN PATENT DOCUMENTS

| CN | 105706259 | 6/2016 |
| FR | 2910716 | 6/2008 |

(Continued)

OTHER PUBLICATIONS

US 7,026,672 B2, 04/2006, Grandis (withdrawn)

(Continued)

*Primary Examiner* — Yu Chen

(57) ABSTRACT

A Magnetic Tunnel Junction (MTJ) can include an annular structure and a planar reference magnetic layer disposed about the annular structure. The annular structure can include an annular non-magnetic layer disposed about an annular conductive layer, an annular free magnetic layer disposed about the annular non-magnetic layer, and an annular tunnel insulator disposed about the annular free magnetic layer. The planar reference magnetic layer can be separated from the free magnetic layer by the annular tunnel barrier layer.

18 Claims, 32 Drawing Sheets

(51) Int. Cl.
   *H01L 27/22* (2006.01)
   *G11C 11/155* (2006.01)
   *G11C 11/16* (2006.01)
   *H01L 43/12* (2006.01)
   *H01L 43/10* (2006.01)
   *G11C 5/02* (2006.01)
   *G11C 7/06* (2006.01)
   *H01L 21/822* (2006.01)

(52) U.S. Cl.
   CPC .......... *H01L 27/226* (2013.01); *H01L 27/228* (2013.01); *H01L 43/08* (2013.01); *H01L 43/10* (2013.01); *H01L 43/12* (2013.01); *G11C 2211/5615* (2013.01)

(56) References Cited

U.S. PATENT DOCUMENTS

| | | |
|---|---|---|
| 5,559,952 A | 9/1996 | Fujimoto |
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Slonczewski |
| 5,732,016 A | 3/1998 | Chen et al. |
| 5,751,647 A | 5/1998 | O'Toole |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,064,948 A | 5/2000 | West |
| 6,075,941 A | 6/2000 | Itoh |
| 6,097,579 A | 8/2000 | Gill |
| 6,112,295 A | 8/2000 | Bhamidipati et al. |
| 6,124,711 A | 9/2000 | Tanaka et al. |
| 6,134,138 A | 10/2000 | Lu et al. |
| 6,140,838 A | 10/2000 | Johnson |
| 6,154,139 A | 11/2000 | Kanai et al. |
| 6,154,349 A | 11/2000 | Kanai et al. |
| 6,172,902 B1 | 1/2001 | Wegrowe et al. |
| 6,233,172 B1 | 5/2001 | Chen et al. |
| 6,233,690 B1 | 5/2001 | Choi et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,442,681 B1 | 8/2002 | Ryan et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,903 B1 | 4/2003 | Savtchenko et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,731,537 B2 | 5/2004 | Kanamori |
| 6,744,086 B2 | 6/2004 | Daughton et al. |
| 6,750,491 B2 | 6/2004 | Sharma et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,785,159 B2 | 8/2004 | Tuttle |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,839,821 B2 | 1/2005 | Estakhri |
| 6,842,317 B2 | 1/2005 | Sugita et al. |
| 6,847,547 B2 | 1/2005 | Albert et al. |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,938,142 B2 | 8/2005 | Pawlowski |
| 6,958,927 B1 | 10/2005 | Nguyen et al. |
| 6,967,863 B2 | 11/2005 | Huai |
| 6,980,469 B2 | 12/2005 | Kent et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,371 B2 | 2/2006 | Matsuoka |
| 7,006,375 B2 | 2/2006 | Covington |
| 7,009,877 B1 | 3/2006 | Huai et al. |
| 7,041,598 B2 | 5/2006 | Sharma |
| 7,045,368 B2 | 5/2006 | Hong et al. |
| 7,057,922 B2 | 6/2006 | Fukumoto |
| 7,170,778 B2 | 1/2007 | Kent et al. |
| 7,187,577 B1 | 3/2007 | Wang |
| 7,190,611 B2 | 3/2007 | Nguyen et al. |
| 7,203,129 B2 | 4/2007 | Lin et al. |
| 7,227,773 B1 | 6/2007 | Nguyen et al. |
| 7,262,941 B2 | 8/2007 | Li et al. |
| 7,307,876 B2 | 12/2007 | Kent et al. |
| 7,324,387 B1 | 1/2008 | Bergemont et al. |
| 7,335,960 B2 | 2/2008 | Han et al. |
| 7,351,594 B2 | 4/2008 | Bae et al. |
| 7,352,021 B2 | 4/2008 | Bae et al. |
| 7,372,722 B2 | 5/2008 | Jeong |
| 7,376,006 B2 | 5/2008 | Bednorz et al. |
| 7,386,765 B2 | 6/2008 | Ellis |
| 7,436,699 B2 | 10/2008 | Tanizaki |
| 7,449,345 B2 | 11/2008 | Horng et al. |
| 7,453,719 B2 | 11/2008 | Sakimura |
| 7,476,919 B2 | 1/2009 | Hong et al. |
| 7,502,249 B1 | 3/2009 | Ding |
| 7,573,737 B2 | 8/2009 | Kent et al. |
| 7,598,555 B1 | 10/2009 | Papworth-Parkin |
| 7,619,431 B2 | 11/2009 | DeWilde et al. |
| 7,642,612 B2 | 1/2010 | Izumi et al. |
| 7,660,161 B2 | 2/2010 | Van Tran |
| 7,733,699 B2 | 6/2010 | Roohparvar |
| 7,773,439 B2 | 8/2010 | Do et al. |
| 7,776,665 B2 | 8/2010 | Izumi et al. |
| 7,852,662 B2 | 12/2010 | Yang |
| 7,881,095 B2 | 2/2011 | Lu |
| 7,911,832 B2 | 3/2011 | Kent et al. |
| 7,936,595 B2 | 5/2011 | Han et al. |
| 7,986,544 B2 | 7/2011 | Kent et al. |
| 8,080,365 B2 | 12/2011 | Nozaki |
| 8,088,556 B2 | 1/2012 | Nozaki |
| 8,094,480 B2 | 1/2012 | Tonomura |
| 8,144,509 B2 | 3/2012 | Lung |
| 8,148,970 B2 | 4/2012 | Fuse |
| 8,255,742 B2 | 8/2012 | Ipek |
| 8,278,996 B2 | 10/2012 | Miki |
| 8,279,666 B2 | 10/2012 | Dieny et al. |
| 8,334,213 B2 | 12/2012 | Mao |
| 8,349,536 B2 | 1/2013 | Nozaki |
| 8,363,465 B2 | 1/2013 | Kent et al. |
| 8,386,836 B2 | 2/2013 | Burger |
| 8,432,727 B2 | 4/2013 | Ryu |
| 8,441,844 B2 | 5/2013 | El Baraji |
| 8,456,883 B1 | 6/2013 | Liu |
| 8,456,926 B2 | 6/2013 | Ong |
| 8,492,881 B2 | 7/2013 | Kuroiwa et al. |

(56) References Cited

U.S. PATENT DOCUMENTS

| | | | |
|---|---|---|---|
| 8,535,952 B2 | 9/2013 | Ranjan et al. |
| 8,539,303 B2 | 9/2013 | Lu |
| 8,549,303 B2 | 10/2013 | Fifield et al. |
| 8,574,928 B2 | 11/2013 | Satoh et al. |
| 8,582,353 B2 | 11/2013 | Lee |
| 8,593,868 B2 | 11/2013 | Park |
| 8,617,408 B2 | 12/2013 | Balamane |
| 8,625,339 B2 | 1/2014 | Ong |
| 8,634,232 B2 | 1/2014 | Oh |
| 8,716,817 B2 | 5/2014 | Saida |
| 8,737,137 B1 | 5/2014 | Choy et al. |
| 8,780,617 B2 | 7/2014 | Kang |
| 8,792,269 B1 | 7/2014 | Abedifard |
| 8,852,760 B2 | 10/2014 | Wang et al. |
| 8,902,628 B2 | 12/2014 | Ha |
| 8,966,345 B2 | 2/2015 | Wilkerson |
| 9,019,754 B1 | 4/2015 | Bedeschi |
| 9,026,888 B2 | 5/2015 | Kwok |
| 9,043,674 B2 | 5/2015 | Wu |
| 9,082,888 B2 | 7/2015 | Kent et al. |
| 9,104,595 B2 | 8/2015 | Sah |
| 9,140,747 B2 | 9/2015 | Kim |
| 9,165,629 B2 | 10/2015 | Chih |
| 9,166,155 B2 | 10/2015 | Deshpande |
| 9,229,853 B2 | 1/2016 | Khan |
| 9,245,608 B2 | 1/2016 | Chen et al. |
| 9,250,990 B2 | 2/2016 | Motwani |
| 9,263,667 B1 | 2/2016 | Pinarbasi |
| 9,298,552 B2 | 3/2016 | Leem et al. |
| 9,299,412 B2 | 3/2016 | Naeimi |
| 9,317,429 B2 | 4/2016 | Ramanujan |
| 9,337,412 B2 | 5/2016 | Pinarbasi et al. |
| 9,362,486 B2 | 6/2016 | Kim et al. |
| 9,378,817 B2 | 6/2016 | Kawai |
| 9,396,991 B2 | 7/2016 | Arvin et al. |
| 9,401,336 B2 | 7/2016 | Arvin et al. |
| 9,406,876 B2 | 8/2016 | Pinarbasi |
| 9,418,721 B2 | 8/2016 | Bose |
| 9,449,720 B1 | 9/2016 | Lung |
| 9,450,180 B1 | 9/2016 | Annunziata |
| 9,455,013 B2 | 9/2016 | Kim |
| 9,472,282 B2 | 10/2016 | Lee |
| 9,472,748 B2 | 10/2016 | Kuo et al. |
| 9,484,527 B2 | 11/2016 | Han et al. |
| 9,488,416 B2 | 11/2016 | Fujita et al. |
| 9,508,456 B1 | 11/2016 | Shim |
| 9,525,126 B1* | 12/2016 | Lin .................. H01L 43/02 |
| 9,548,445 B2 | 1/2017 | Lee et al. |
| 9,553,102 B2 | 1/2017 | Wang |
| 9,583,167 B2 | 2/2017 | Chung |
| 9,728,712 B2 | 8/2017 | Kardasz et al. |
| 9,741,926 B1 | 8/2017 | Pinarbasi et al. |
| 9,772,555 B2 | 9/2017 | Park et al. |
| 9,773,974 B2 | 9/2017 | Pinarbasi et al. |
| 9,853,006 B2 | 12/2017 | Avin et al. |
| 9,853,206 B2 | 12/2017 | Pinarbasi et al. |
| 9,853,292 B2 | 12/2017 | Loveridge et al. |
| 9,865,806 B2 | 1/2018 | Choi et al. |
| 10,026,609 B2 | 7/2018 | Sreenivasan et al. |
| 10,043,851 B1 | 8/2018 | Shen |
| 10,115,446 B1 | 10/2018 | Louie et al. |
| 10,163,479 B2 | 12/2018 | Yoha |
| 2002/0057593 A1 | 5/2002 | Hidaka |
| 2002/0090533 A1 | 7/2002 | Zhang et al. |
| 2002/0105823 A1 | 8/2002 | Redon et al. |
| 2002/0132140 A1 | 9/2002 | Igarashi et al. |
| 2003/0085186 A1 | 5/2003 | Fujioka |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0026369 A1 | 2/2004 | Ying |
| 2004/0047179 A1 | 3/2004 | Chan |
| 2004/0061154 A1 | 4/2004 | Huai et al. |
| 2004/0094785 A1 | 5/2004 | Zhu et al. |
| 2004/0130936 A1 | 7/2004 | Nguyen et al. |
| 2004/0173315 A1 | 9/2004 | Leung |
| 2004/0197174 A1 | 10/2004 | Van Den Berg |
| 2004/0221030 A1 | 11/2004 | Huras |
| 2004/0257717 A1 | 12/2004 | Sharma et al. |
| 2005/0022746 A1 | 2/2005 | Lampe |
| 2005/0029551 A1 | 2/2005 | Atwood et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0160205 A1 | 7/2005 | Kuo |
| 2005/0174702 A1 | 8/2005 | Gill |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0251628 A1 | 11/2005 | Jarvis et al. |
| 2005/0280058 A1 | 12/2005 | Pakala et al. |
| 2005/0285176 A1 | 12/2005 | Kim |
| 2006/0018057 A1 | 1/2006 | Huai |
| 2006/0049472 A1 | 3/2006 | Diao et al. |
| 2006/0077734 A1 | 4/2006 | Fong |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0198202 A1 | 9/2006 | Erez |
| 2006/0227465 A1 | 10/2006 | Inokuchi et al. |
| 2006/0271755 A1 | 11/2006 | Miura |
| 2006/0284183 A1 | 12/2006 | Izumi et al. |
| 2006/0291305 A1 | 12/2006 | Suzuki et al. |
| 2007/0019337 A1 | 1/2007 | Apalkov et al. |
| 2007/0094573 A1 | 4/2007 | Chen |
| 2007/0096229 A1 | 5/2007 | Yoshikawa |
| 2007/0220935 A1 | 9/2007 | Cernea |
| 2007/0226592 A1 | 9/2007 | Radke |
| 2007/0242501 A1 | 10/2007 | Hung et al. |
| 2007/0283313 A1 | 12/2007 | Ogawa |
| 2007/0285972 A1 | 12/2007 | Horii |
| 2008/0049487 A1 | 2/2008 | Yoshimura |
| 2008/0049488 A1 | 2/2008 | Rizzo |
| 2008/0079530 A1 | 4/2008 | Weidman et al. |
| 2008/0112094 A1 | 5/2008 | Kent et al. |
| 2008/0144376 A1 | 6/2008 | Lee |
| 2008/0151614 A1 | 6/2008 | Guo |
| 2008/0181009 A1 | 7/2008 | Arai |
| 2008/0259508 A2 | 10/2008 | Kent et al. |
| 2008/0294938 A1 | 11/2008 | Kondo |
| 2008/0297292 A1 | 12/2008 | Viala et al. |
| 2009/0040825 A1 | 2/2009 | Adusumilli et al. |
| 2009/0046501 A1 | 2/2009 | Ranjan et al. |
| 2009/0072185 A1 | 3/2009 | Raksha et al. |
| 2009/0078927 A1 | 3/2009 | Xiao |
| 2009/0080267 A1 | 3/2009 | Bedeschi |
| 2009/0091037 A1 | 4/2009 | Assefa et al. |
| 2009/0098413 A1 | 4/2009 | Kanegae |
| 2009/0130779 A1 | 5/2009 | Li |
| 2009/0146231 A1 | 6/2009 | Kuper et al. |
| 2009/0161421 A1 | 6/2009 | Cho et al. |
| 2009/0209102 A1 | 8/2009 | Zhong et al. |
| 2009/0231909 A1 | 9/2009 | Dieny et al. |
| 2010/0039136 A1 | 2/2010 | Chua-Eoan |
| 2010/0080040 A1 | 4/2010 | Choi |
| 2010/0087048 A1 | 4/2010 | Izumi et al. |
| 2010/0110803 A1 | 5/2010 | Arai |
| 2010/0124091 A1 | 5/2010 | Cowburn |
| 2010/0162065 A1 | 6/2010 | Norman |
| 2010/0193891 A1 | 8/2010 | Wang et al. |
| 2010/0195362 A1 | 8/2010 | Norman |
| 2010/0195401 A1 | 8/2010 | Jeong et al. |
| 2010/0227275 A1 | 9/2010 | Nozaki |
| 2010/0232206 A1 | 9/2010 | Li |
| 2010/0246254 A1 | 9/2010 | Prejbeanu et al. |
| 2010/0248154 A1 | 9/2010 | Nozaki |
| 2010/0254181 A1 | 10/2010 | Chung |

(56) References Cited

U.S. PATENT DOCUMENTS

| | | |
|---|---|---|
| 2010/0271090 A1 | 10/2010 | Rasmussen |
| 2010/0271870 A1 | 10/2010 | Zheng et al. |
| 2010/0277976 A1 | 11/2010 | Oh |
| 2010/0290275 A1 | 11/2010 | Park et al. |
| 2010/0311243 A1 | 12/2010 | Mao |
| 2011/0001108 A1 | 1/2011 | Greene |
| 2011/0032645 A1 | 2/2011 | Noel et al. |
| 2011/0058412 A1 | 3/2011 | Zheng et al. |
| 2011/0061786 A1 | 3/2011 | Mason |
| 2011/0076620 A1 | 3/2011 | Nozaki |
| 2011/0089511 A1 | 4/2011 | Keshtbod et al. |
| 2011/0133298 A1 | 6/2011 | Chen et al. |
| 2011/0283135 A1 | 11/2011 | Burger |
| 2011/0310691 A1 | 12/2011 | Zhou et al. |
| 2011/0320696 A1 | 12/2011 | Fee et al. |
| 2012/0028373 A1 | 2/2012 | Belen |
| 2012/0052258 A1 | 3/2012 | Op DeBeeck et al. |
| 2012/0069649 A1 | 3/2012 | Ranjan et al. |
| 2012/0127804 A1 | 5/2012 | Ong et al. |
| 2012/0155158 A1 | 6/2012 | Higo |
| 2012/0163113 A1 | 6/2012 | Hatano et al. |
| 2012/0280336 A1 | 6/2012 | Watts |
| 2012/0181642 A1 | 7/2012 | Prejbeanu et al. |
| 2012/0188818 A1 | 7/2012 | Ranjan et al. |
| 2012/0221905 A1 | 8/2012 | Burger |
| 2012/0228728 A1 | 9/2012 | Ueki et al. |
| 2012/0239969 A1 | 9/2012 | Dickens |
| 2012/0254636 A1 | 10/2012 | Tsukamoto et al. |
| 2012/0280339 A1 | 11/2012 | Zhang et al. |
| 2012/0294078 A1 | 11/2012 | Kent et al. |
| 2012/0299133 A1 | 11/2012 | Son et al. |
| 2012/0324274 A1 | 12/2012 | Hori |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0039119 A1 | 2/2013 | Rao |
| 2013/0044537 A1 | 2/2013 | Ishigaki |
| 2013/0075845 A1 | 3/2013 | Chen et al. |
| 2013/0107633 A1 | 5/2013 | Kim |
| 2013/0244344 A1 | 9/2013 | Malmhall et al. |
| 2013/0267042 A1 | 10/2013 | Satoh et al. |
| 2013/0270523 A1 | 10/2013 | Wang et al. |
| 2013/0270661 A1 | 10/2013 | Yi et al. |
| 2013/0275691 A1 | 10/2013 | Chew |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0036573 A1 | 2/2014 | Ishihara |
| 2014/0042571 A1 | 2/2014 | Gan et al. |
| 2014/0048896 A1 | 2/2014 | Huang et al. |
| 2014/0063949 A1 | 3/2014 | Tokiwa |
| 2014/0070341 A1 | 3/2014 | Beach et al. |
| 2014/0089762 A1 | 3/2014 | Pangal et al. |
| 2014/0103469 A1 | 4/2014 | Jan |
| 2014/0103472 A1 | 4/2014 | Kent et al. |
| 2014/0136870 A1 | 5/2014 | Breternitz et al. |
| 2014/0149827 A1 | 5/2014 | Kim et al. |
| 2014/0151837 A1 | 6/2014 | Ryu |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0219034 A1 | 8/2014 | Gomez et al. |
| 2014/0252439 A1 | 9/2014 | Guo |
| 2014/0264671 A1 | 9/2014 | Chepulskyy et al. |
| 2014/0269005 A1 | 9/2014 | Kang |
| 2014/0281284 A1 | 9/2014 | Block et al. |
| 2014/0289358 A1 | 9/2014 | Lindamood |
| 2014/0321196 A1 | 10/2014 | Ikeda |
| 2015/0056368 A1 | 2/2015 | Wang et al. |
| 2015/0098287 A1 | 4/2015 | Lee |
| 2015/0100848 A1 | 4/2015 | Kalamatianos |
| 2015/0135039 A1 | 5/2015 | Mekhanik et al. |
| 2015/0143343 A1 | 5/2015 | Weiss |
| 2015/0154116 A1 | 6/2015 | Dittrich |
| 2015/0171316 A1 | 6/2015 | Park et al. |
| 2015/0206568 A1 | 7/2015 | Bose et al. |
| 2015/0206569 A1 | 7/2015 | Bose et al. |
| 2015/0242269 A1 | 8/2015 | Pelley et al. |
| 2015/0262701 A1 | 9/2015 | Takizawa |
| 2015/0278011 A1 | 10/2015 | Kennel et al. |
| 2015/0279904 A1 | 10/2015 | Pinarbasi et al. |
| 2015/0378814 A1 | 12/2015 | Webb et al. |
| 2015/0380088 A1 | 12/2015 | Naeimi et al. |
| 2016/0027525 A1 | 1/2016 | Kim et al. |
| 2016/0027999 A1 | 1/2016 | Pinarbasi |
| 2016/0043304 A1 | 2/2016 | Chen |
| 2016/0056072 A1 | 2/2016 | Arvin et al. |
| 2016/0085443 A1 | 3/2016 | Tomishima et al. |
| 2016/0085621 A1 | 3/2016 | Motwani |
| 2016/0086600 A1 | 3/2016 | Bauer et al. |
| 2016/0087193 A1 | 3/2016 | Pinarbasi et al. |
| 2016/0093798 A1 | 3/2016 | Kim et al. |
| 2016/0111634 A1 | 4/2016 | Lee et al. |
| 2016/0118249 A1 | 4/2016 | Sreenivasan et al. |
| 2016/0124299 A1 | 5/2016 | Yu et al. |
| 2016/0126201 A1 | 5/2016 | Arvin et al. |
| 2016/0126452 A1 | 5/2016 | Kuo et al. |
| 2016/0126453 A1 | 5/2016 | Chen et al. |
| 2016/0148685 A1 | 5/2016 | Roy |
| 2016/0163965 A1 | 6/2016 | Han et al. |
| 2016/0163973 A1 | 6/2016 | Pinarbasi |
| 2016/0181508 A1 | 6/2016 | Lee et al. |
| 2016/0218278 A1 | 7/2016 | Pinarbasi et al. |
| 2016/0260486 A1 | 9/2016 | Tani |
| 2016/0268499 A1 | 9/2016 | You |
| 2016/0283385 A1 | 9/2016 | Boyd et al. |
| 2016/0284762 A1 | 9/2016 | Wang et al. |
| 2016/0300615 A1 | 10/2016 | Lee |
| 2016/0307860 A1 | 10/2016 | Arvin et al. |
| 2016/0315118 A1 | 10/2016 | Kardasz et al. |
| 2016/0315249 A1 | 10/2016 | Kardasz et al. |
| 2016/0315259 A1 | 10/2016 | Fennimore et al. |
| 2016/0085692 A1 | 12/2016 | Kwok |
| 2016/0358778 A1 | 12/2016 | Park et al. |
| 2016/0372656 A1 | 12/2016 | Pinarbasi et al. |
| 2016/0378592 A1 | 12/2016 | Ikegami et al. |
| 2017/0025472 A1 | 1/2017 | Kim et al. |
| 2017/0033156 A1 | 2/2017 | Gan et al. |
| 2017/0033283 A1 | 2/2017 | Pinarbasi et al. |
| 2017/0047107 A1 | 2/2017 | Berger et al. |
| 2017/0062519 A1* | 3/2017 | Bandic ................. H01L 27/222 |
| 2017/0062712 A1 | 3/2017 | Choi et al. |
| 2017/0069837 A1 | 3/2017 | Choi et al. |
| 2017/0084826 A1 | 3/2017 | Zhou et al. |
| 2017/0123991 A1 | 5/2017 | Sela et al. |
| 2017/0133104 A1 | 5/2017 | Darbari et al. |
| 2017/0199459 A1 | 7/2017 | Ryu et al. |
| 2017/0222132 A1 | 8/2017 | Pinarbasi et al. |
| 2017/0270988 A1 | 9/2017 | Ikegami |
| 2018/0018134 A1 | 1/2018 | Kang |
| 2018/0019343 A1 | 1/2018 | Asami |
| 2018/0033957 A1 | 2/2018 | Zhang |
| 2018/0097175 A1 | 4/2018 | Chuang |
| 2018/0114589 A1 | 4/2018 | El-Baraji et al. |
| 2018/0119278 A1 | 5/2018 | Kornmeyer |
| 2018/0121117 A1 | 5/2018 | Berger et al. |
| 2018/0121355 A1 | 5/2018 | Berger et al. |
| 2018/0121361 A1 | 5/2018 | Berger et al. |
| 2018/0122446 A1 | 5/2018 | Berger et al. |
| 2018/0122447 A1 | 5/2018 | Berger et al. |
| 2018/0122448 A1 | 5/2018 | Berger et al. |
| 2018/0122449 A1 | 5/2018 | Berger et al. |
| 2018/0122450 A1 | 5/2018 | Berger et al. |
| 2018/0122855 A1* | 5/2018 | Chen ................. H01L 21/8221 |
| 2018/0130945 A1 | 5/2018 | Choi et al. |
| 2018/0211821 A1 | 7/2018 | Kogler |
| 2018/0233362 A1 | 8/2018 | Glodde |
| 2018/0233363 A1 | 8/2018 | Glodde |
| 2018/0248110 A1 | 8/2018 | Kardasz et al. |
| 2018/0248113 A1 | 8/2018 | Pinarbasi et al. |
| 2018/0331279 A1 | 11/2018 | Shen |
| 2019/0036013 A1* | 1/2019 | Mo ........................ H01L 43/02 |

(56) References Cited

U.S. PATENT DOCUMENTS

| | | | | |
|---|---|---|---|---|
| 2019/0273202 A1* | 9/2019 | Nikitin | ................ | H01F 10/3286 |
| 2019/0280045 A1* | 9/2019 | Aggarwal | ............. | G11C 11/161 |

FOREIGN PATENT DOCUMENTS

| | | |
|---|---|---|
| JP | 2005-044848 | 2/2005 |
| JP | 2005-150482 | 6/2005 |
| JP | 2005-535111 | 11/2005 |
| JP | 2006128579 | 5/2006 |
| JP | 2008-524830 | 7/2008 |
| JP | 2009-027177 | 2/2009 |
| JP | 2013-012546 | 1/2013 |
| JP | 2014-039061 | 2/2014 |
| JP | 5635666 | 12/2014 |
| KR | 10-2014-015246 | 9/2014 |
| WO | 2009-080636 | 7/2009 |
| WO | 2011-005484 | 1/2011 |
| WO | 2014-062681 | 4/2014 |

OTHER PUBLICATIONS

US 2016/0218273 A1, 06/2016, Pinarbasi (withdrawn)

Helia Naeimi, et al., "STTRAM Scaling and Retention Failure," Intel Technology Journal, vol. 17, Issue 1, 2013, pp. 54-75 (22 pages).

S. Ikeda, et al., "A Perpendicular-Anisotropy CoFeB—MgO Magnetic Tunnel Junction", Nature Materials, vol. 9, Sep. 2010, pp. 721-724 (4 pages).

R.H. Kock, et al., "Thermally Assisted Magnetization Reversal in Submicron-Sized Magnetic Thin Films", Physical Review Letters, The American Physical Society, vol. 84, No, 23, Jun. 5, 2000, pp. 5419-5422 (4 pages).

K.J. Lee, et al., "Analytical Investigation of Spin-Transfer Dynamics Using a Perpendicular-to-Plane Polarizer", Applied Physics Letters, American Insitute of Physics, vol. 86, (2005), pp. 022505-1 to 022505-3 (3 pages).

Kirsten Martens, et al., "Thermally Induced Magnetic Switching in Thin Ferromagnetic Annuli", NSF grants PHY-0351964 (DLS), 2005, 11 pages.

Kristen Martens, et al., "Magnetic Reversal in Nanoscropic Ferromagnetic Rings", NSF grants PHY-0351964 (DLS) 2006, 23 pages.

"Magnetic Technology Spintronics, Media and Interface", Data Storage Institute, R&D Highlights, Sep. 2010, 3 pages.

Daniel Scott Matic, "A Magnetic Tunnel Junction Compact Model for STT-RAM and MeRAM", Master Thesis University of California, Los Angeles, 2013, pp. 43.

Sabpreet Bhatti et al., Spintronics Based Random Access Memory: A Review, Materials Today, Nov. 2017, pp. 530-548, vol. 20, No. 9.

* cited by examiner

THREE-DIMENSIONAL ARRAYS WITH MAGNETIC TUNNEL JUNCTION DEVICES INCLUDING AN ANNULAR DISCONTINUED FREE MAGNETIC LAYER AND A PLANAR REFERENCE MAGNETIC LAYER

CROSS-REFERENCE TO RELATED APPLICATIONS

This application claims the benefit of U.S. Provisional Patent Application No. 62/647,210 filed Mar. 23,2018, which is incorporated herein in its entirety.

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, smart phones, game consoles, servers, distributed computing systems, Internet of Things (IoT) devices, Artificial Intelligence (AI), and the like have facilitated increased productivity and reduced costs in communicating and analyzing data in most areas of entertainment, education, business, and science. One common aspect of computing systems is the computing device readable memory. Computing devices may include one or more types of memory, such as volatile random-access memory, non-volatile flash memory, and the like.

An emerging non-volatile memory technology is Magnetoresistive Random Access Memory (MRAM). In MRAM devices, data can be stored in the magnetization orientation between ferromagnetic layers of a Magnetic Tunnel Junction (MTJ). Referring to FIG. 1, a MTJ, in accordance with the convention art, is shown. The MTJ can include two magnetic layers 110, 120, and a magnetic tunnel barrier layer 130. One of the magnetic layers 110 can have a fixed magnetization polarization 140, while the polarization of the magnetization of the other magnetic layer 120 can switch between opposite directions. Typically, if the magnetic layers 110, 120 have the same magnetization polarization, the MTJ cell will exhibit a relatively low resistance value corresponding to a '1' bit state; while if the magnetization polarization between the two magnetic layers 110, 120 is antiparallel the MTJ cell will exhibit a relatively high resistance value corresponding to a '0' bit state. Because the data is stored in the magnetic fields, MRAM devices are non-volatile memory devices. The state of a MRAM cell can be read by applying a predetermined current through the cell and measuring the resulting voltage, or by applying a predetermined voltage across the cell and measuring the resulting current. The sensed current or voltage is proportional to the resistance of the cell and can be compared to a reference value to determine the state of the cell.

MRAM devices are characterized by densities similar to Dynamic Random-Access Memory (DRAM), power consumption similar to flash memory, and speed similar to Static Random-Access Memory (SRAM). Although MRAM devices exhibit favorable performance characteristics as compared to other memory technologies, there is a continuing need for improved MRAM devices and methods of manufacture thereof.

SUMMARY OF THE INVENTION

The present technology may best be understood by referring to the following description and accompanying drawings that are used to illustrate embodiments of the present technology directed toward Magnetic Tunnel Junction (MTJ) devices.

In one embodiment, an MTJ structure can include an annular structure and a planar reference magnetic layer disposed about the annular structure. The annular structure can include an annular non-magnetic layer disposed about an annular conductive layer, an annular free magnetic layer disposed about the annular non-magnetic layer, and an annular tunnel insulator disposed about the annular free magnetic layer. The planar reference magnetic layer can be separated from the free magnetic layer by the annular tunnel barrier layer. The MTJ structure can also include a first non-magnetic insulator layer disposed on a first side of the planar reference magnetic layer and about the annular structure. A second non-magnetic insulator layer can be disposed on a second side of the planar reference magnetic layer and about the annular structure. The magnetic field of the planar reference magnetic layer can have a fixed polarization substantially perpendicular to a major planar orientation of the planar reference magnetic layer. The magnetic field of the annular free magnetic layer can have a polarization substantially perpendicular to the major planar orientation of the planar reference magnetic layer. The magnetic field of the annular free magnetic layer can switch to being substantially parallel to the magnetic field of the planar reference layer in response to a current flow in a first direction through the conductive annular layer and switch to being substantially anti-parallel to the magnetic field of the planar reference layer in response to a current flow in a second direction through the conductive annular layer.

In another embodiment, a memory device can include an array of MJT cells. Each MTJ cell can include an annular structure and a portion of a planar reference magnetic layer proximate the respective annular structure. Each annular structure can include an similar non-magnetic layer disposed about an annular conductive layer, an annular free magnetic layer disposed about the annular non-magnetic layer, and an annular tunnel insulator disposed about the annular free magnetic layer. The planar reference magnetic layer can be disposed about the plurality of annular structures and separated from the free magnetic layers by the annular tunnel barrier layers.

In yet another embodiment, a memory device can include an array of MTJ cells and a plurality of select elements. The array of MTJ cells can be arranged in cell columns and cell rows in a plurality of cell levels. The MTJ cells in corresponding cell column and cell row positions in the plurality of cell levels can be coupled together in cell strings. Each MTJ cell can include an annular structure including an annular non-magnetic layer disposed about an annular conductive layer, an annular free magnetic layer disposed about the annular non-magnetic layer, and an annular tunnel insulator disposed about the annular free magnetic layer. Each MTJ cell can also include a portion of a respective planar reference magnetic layer disposed about the annular structure, a portion of a respective planar non-magnetic insulator layer disposed on a first side of the planar reference magnetic layer and about the annular structure, and a portion of another respective planar non-magnetic insulator layer disposed on a second side of the planar reference magnetic layer and about the annular structure.

In yet another embodiment, a string of MTJ cells can include one or more annular structures. Each annular structure can include an annular non-magnetic layer disposed about an annular conductive layer, a plurality of annular free magnetic layers disposed about the annular non-magnetic layer, the plurality of annular free magnetic layers separated from each other by corresponding ones of a plurality of non-magnetic separator layers, and an annular tunnel insulator disposed about the annular free magnetic layer. A plurality of planar reference magnetic layers can be disposed about the annular tunnel barrier layer and aligned with corresponding ones of the plurality of portions of the free magnetic layers. Non-magnetic insulator layers can be disposed about the plurality of annular structures and on either side of each planar reference magnetic layer.

In yet another embodiment, the array of MTJ cells can include a plurality of planar reference magnetic layers disposed about respective ones of a plurality of annular structures. Alternatively, the array of MTJ cells can include a plurality of planar reference magnetic layers disposed about a plurality of annular structures. Respective ones of a plurality of bit lines can be disposed on and electrically coupled to respective ones of the plurality of planar reference magnetic layers. In one implementation, the bit lines can be disposed and electrically coupled to the planar reference magnetic layers in a peripheral region of the array of MTJ cells.

In yet another embodiment, fabrication of an MTJ cell can include forming a planar reference magnetic layer on a first planar non-magnetic insulator layer and forming a second planar non-magnetic insulator layer on the planar reference magnetic layer. One or more annular openings can be formed through the second planar non-magnetic insulator layer, the planar reference magnetic layer and the first planar non-magnetic insulator layer. An annular tunnel insulator can be formed on the walls of the one or more annular openings, an annular free magnetic layer can be formed on the annular insulator inside the one or more annular openings, an annular non-magnetic layer can be formed on the annular free magnetic layer inside the one or more annular openings, and an annular conductive core can be formed inside the annular non-magnetic layer in the one or more annular openings.

This Summary is provided to introduce a selection of concepts in a simplified form that are further described below in the Detailed Description. This Summary is not tended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

PIG. 10 shows a device including a string of MTJs, in accordance with aspects of the present technology.

Figure 11:
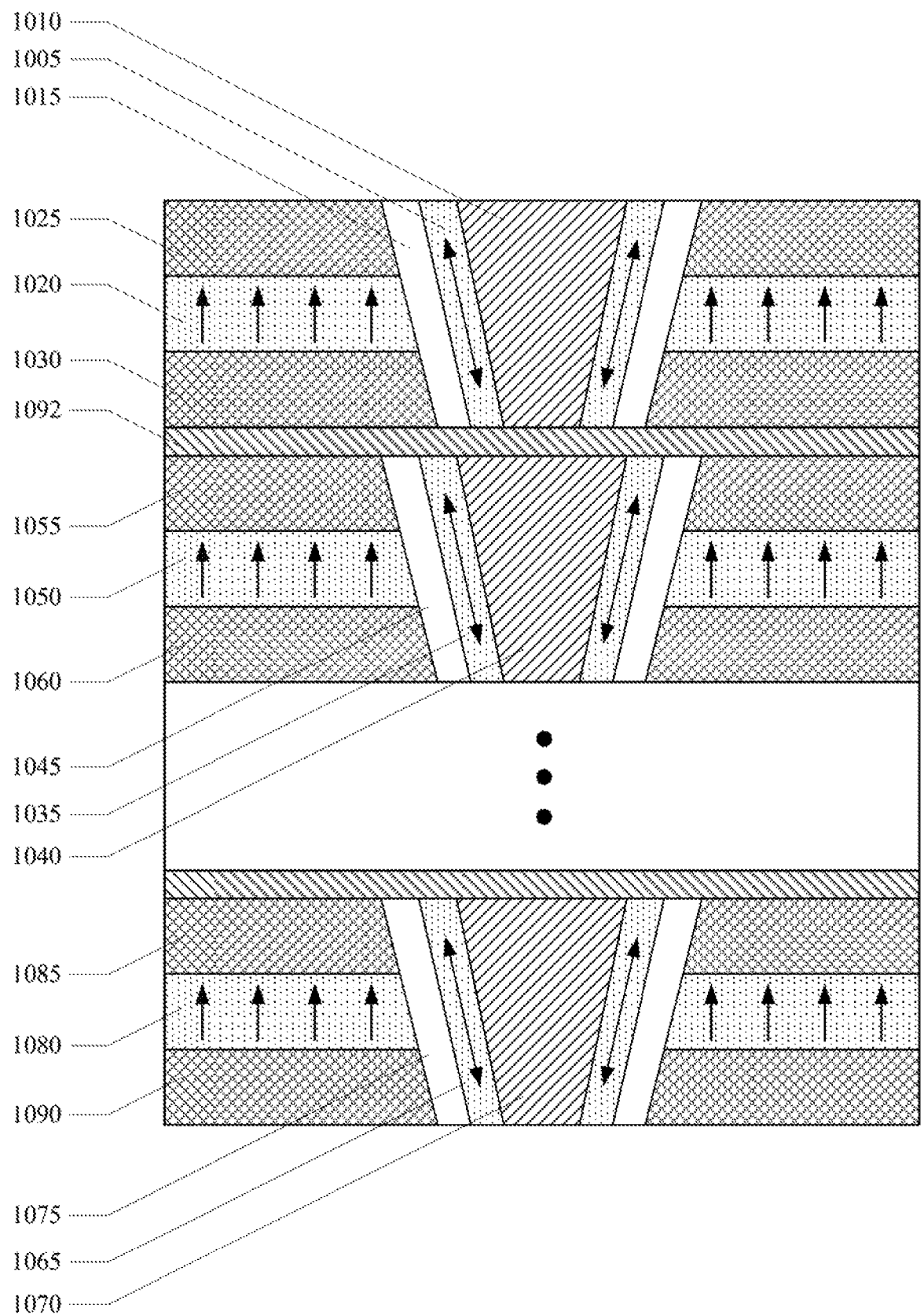

FIG. 11 shows a device including a string of MTJs, in accordance with aspects of the present technology.

Figure 12:
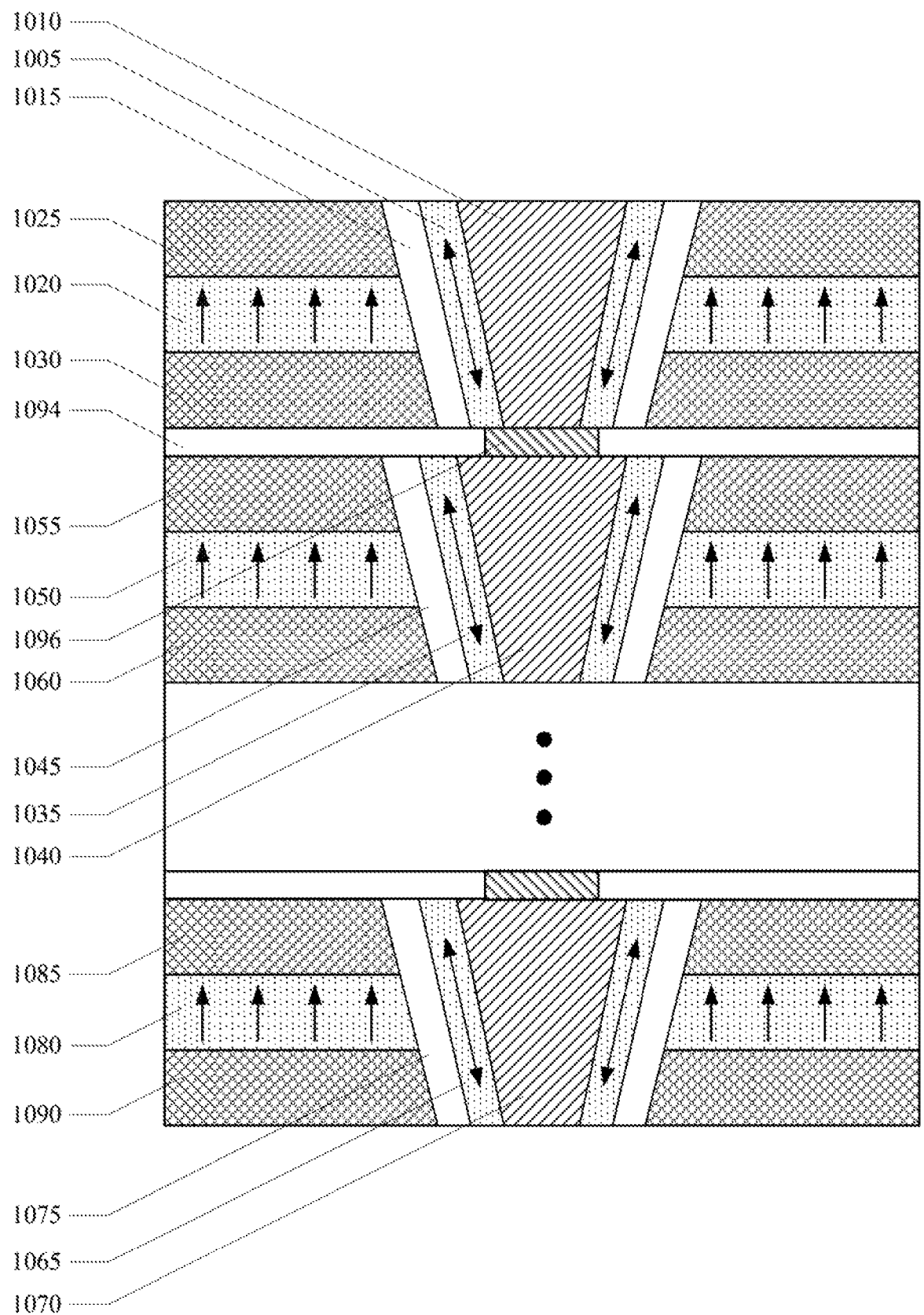

FIG. 12 shows a device including a string of MTJs, in accordance with aspects of the present technology.

Figure 13:
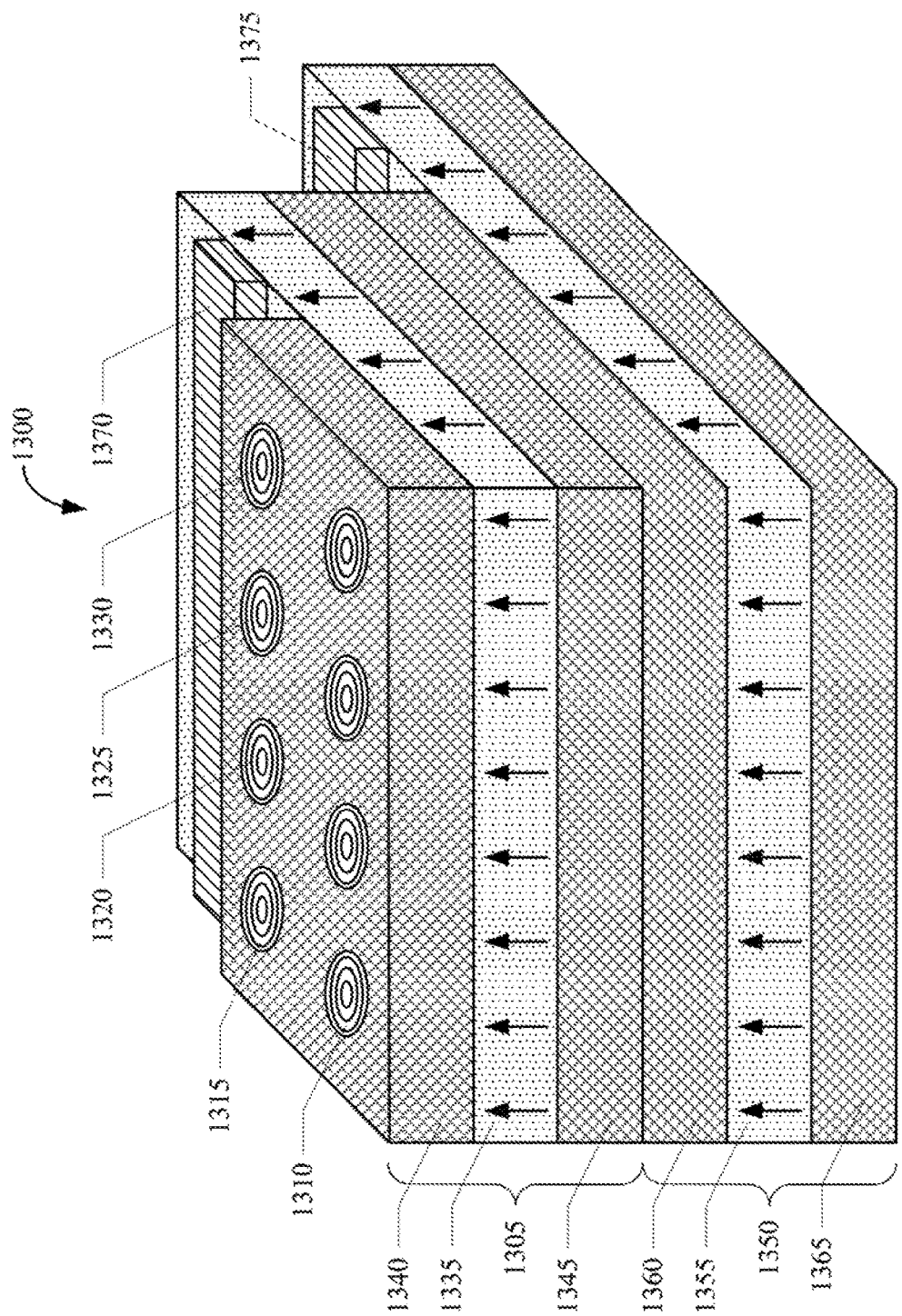

FIG. 13 shows a memory cell array, in accordance with aspect of the present technology.

Figure 14:
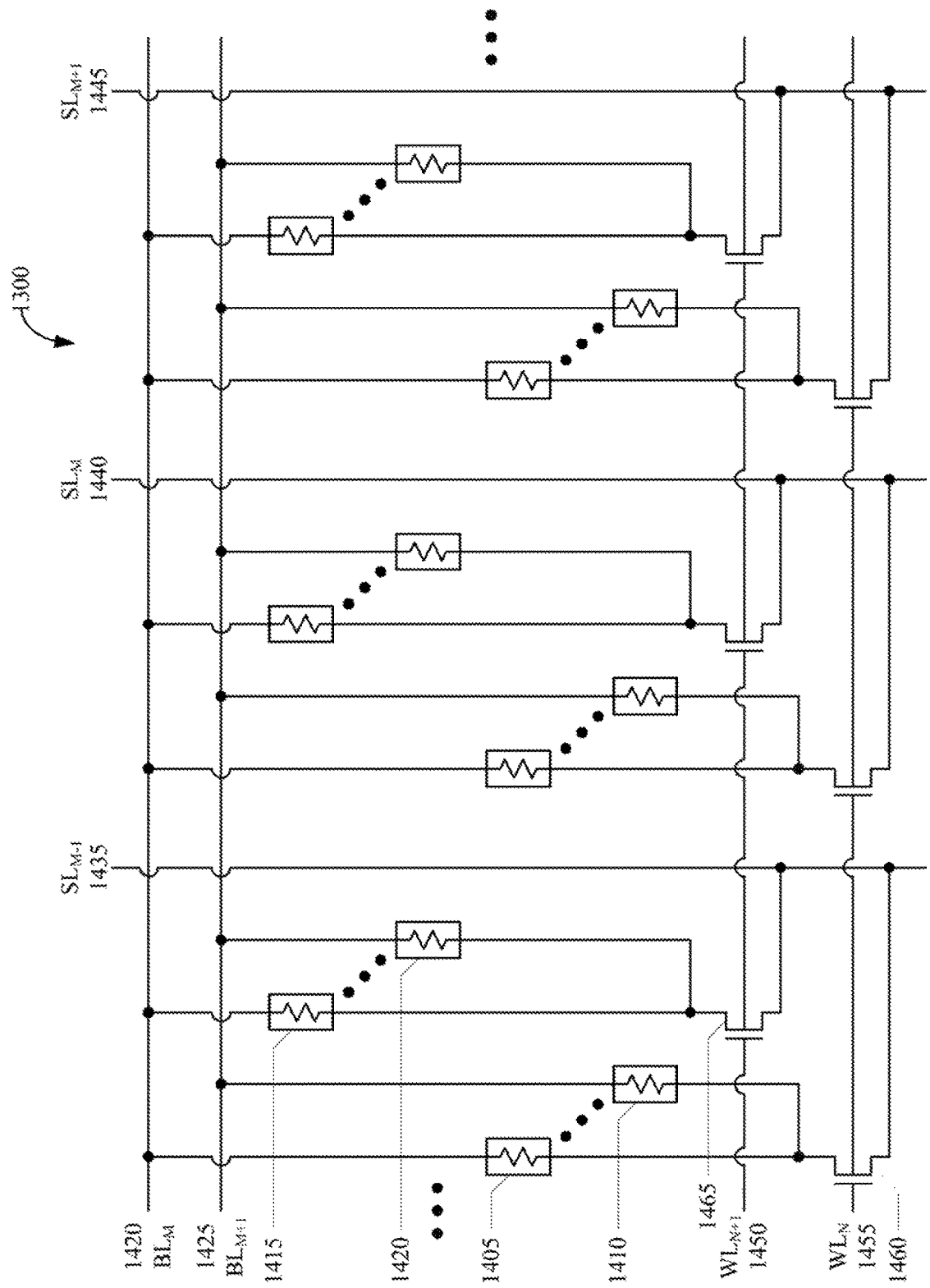

FIG. 14. shows a memory cell array, in accordance with aspect of the present technology.

Figure 15:
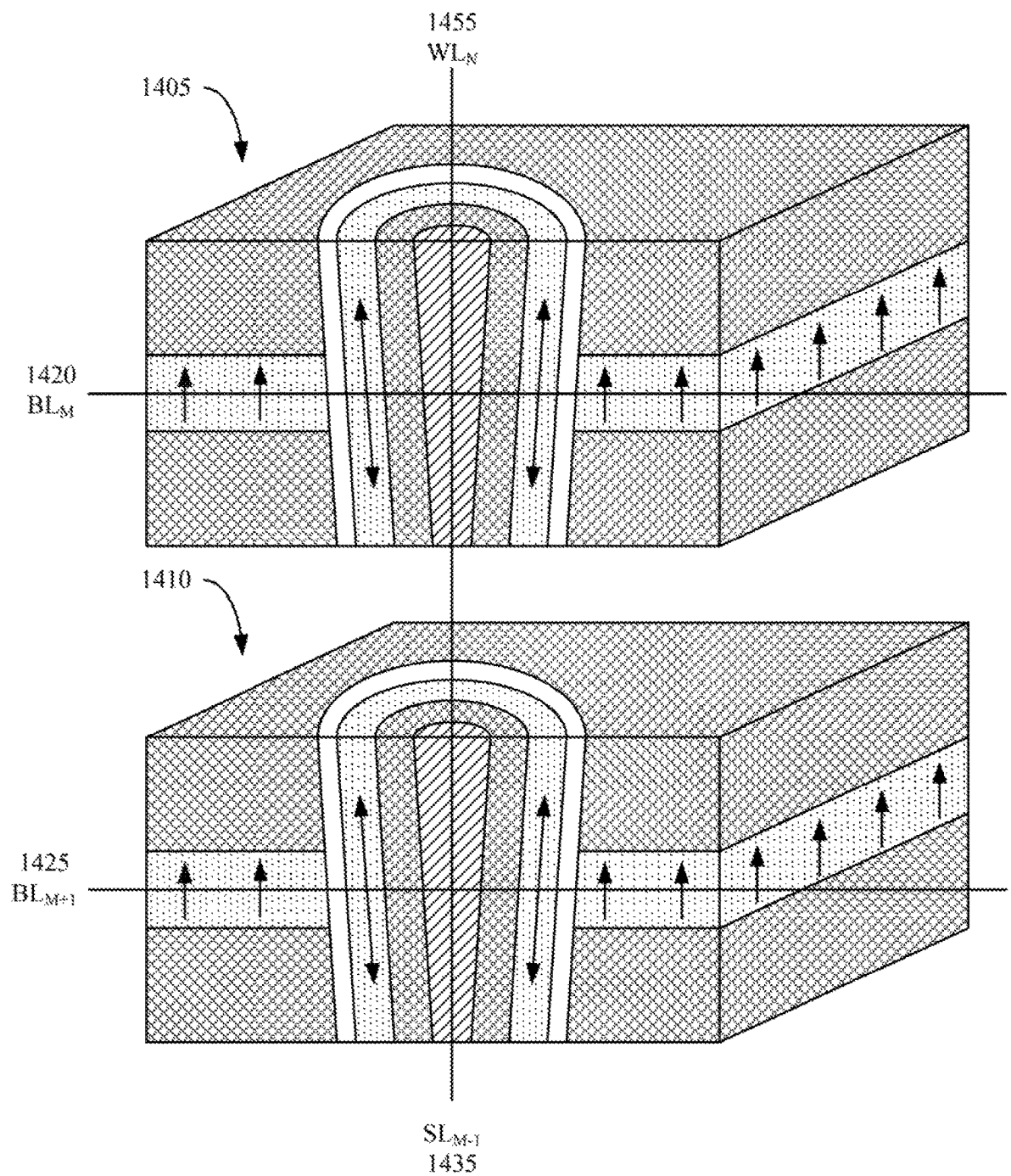

FIG. 15 shows a memory cell array, in accordance with aspect of the present technology.

Figure 16:
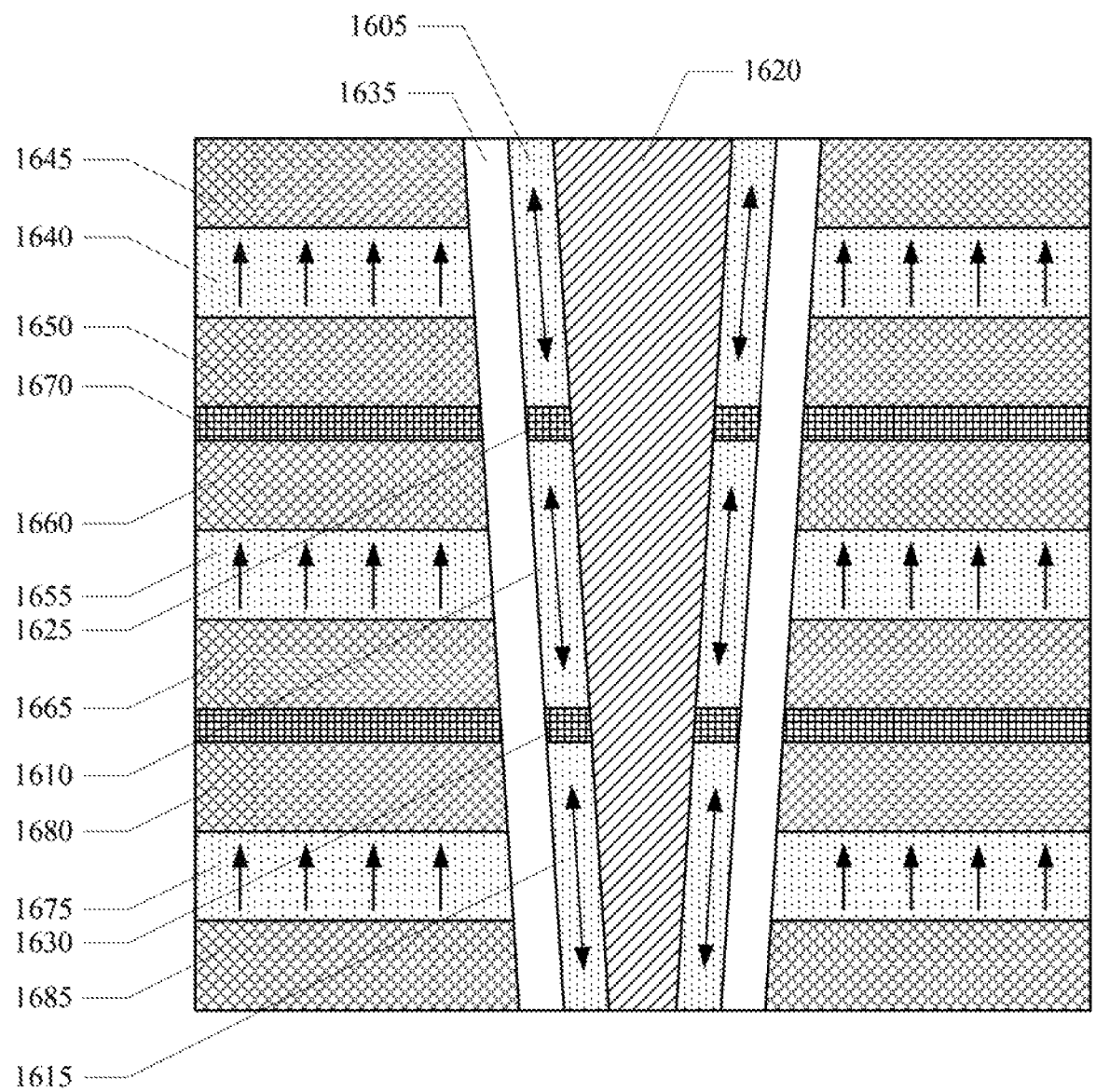

FIG. 16 shows a device including a string of MTJs, in accordance with aspects of the present technology.

Figure 17A:
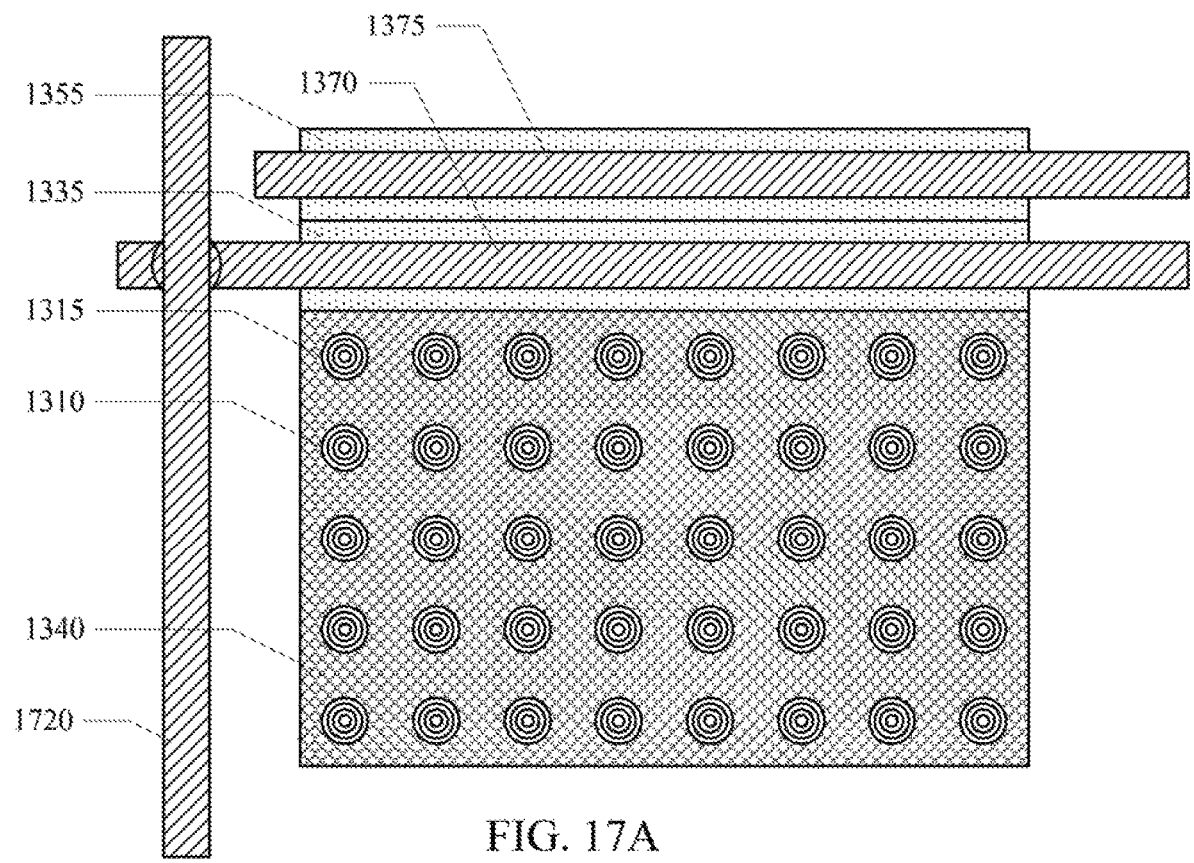
Figure 17B:
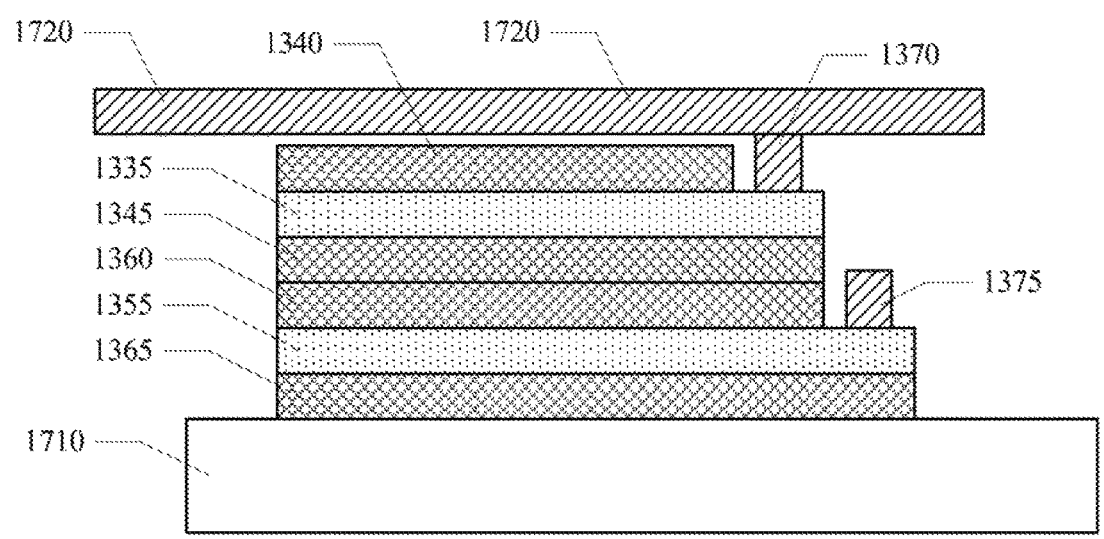

FIGS. 17A and 17B show a memory cell array, in accordance with aspect of the present technology.

Figure 18A:
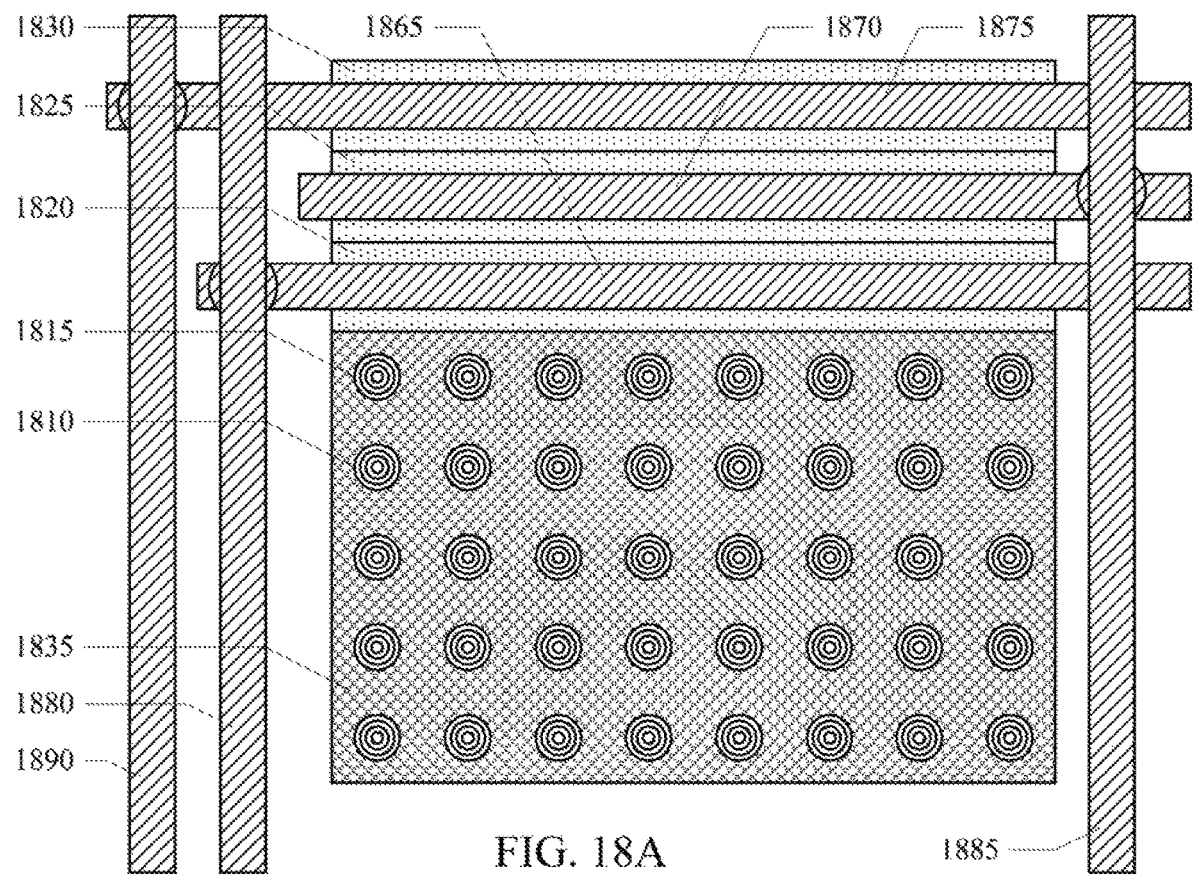
Figure 18B:
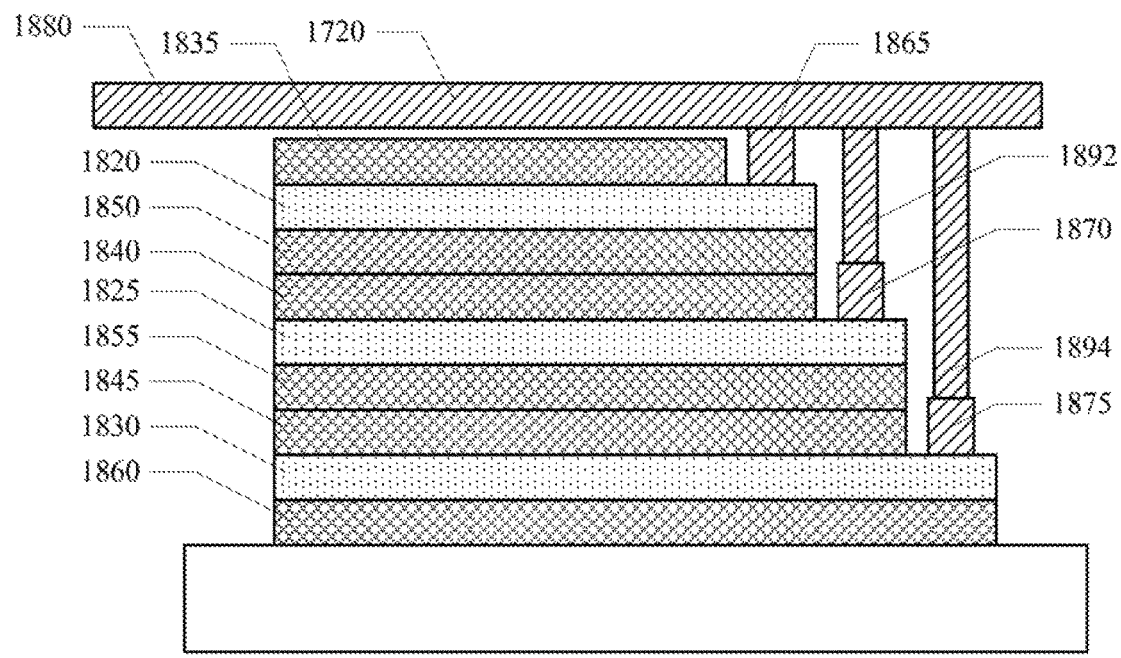

FIGS. 18A and 18B show a memory cell array, in accordance with aspect of the present technology.

Figure 19A:
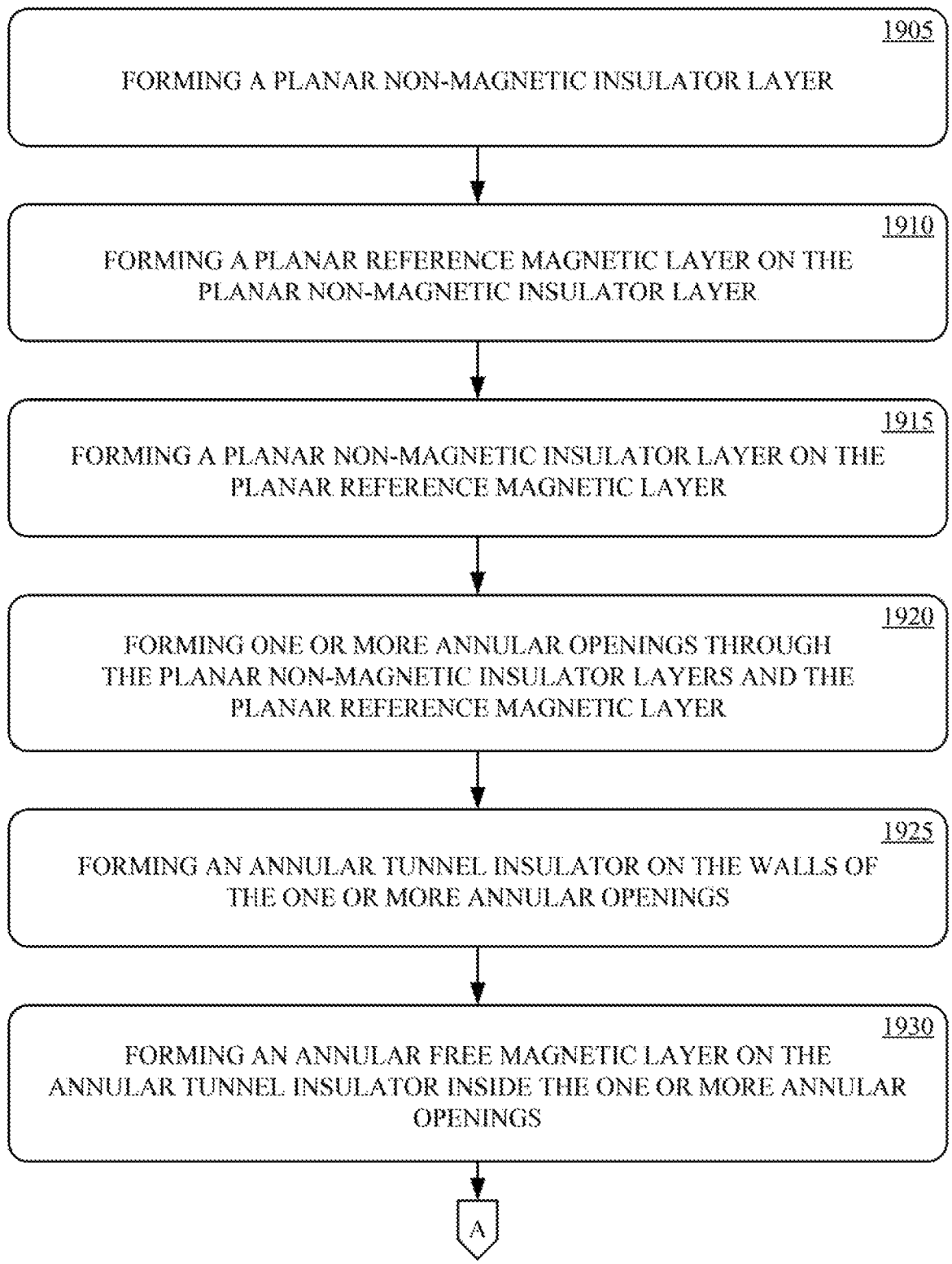
Figure 19B:
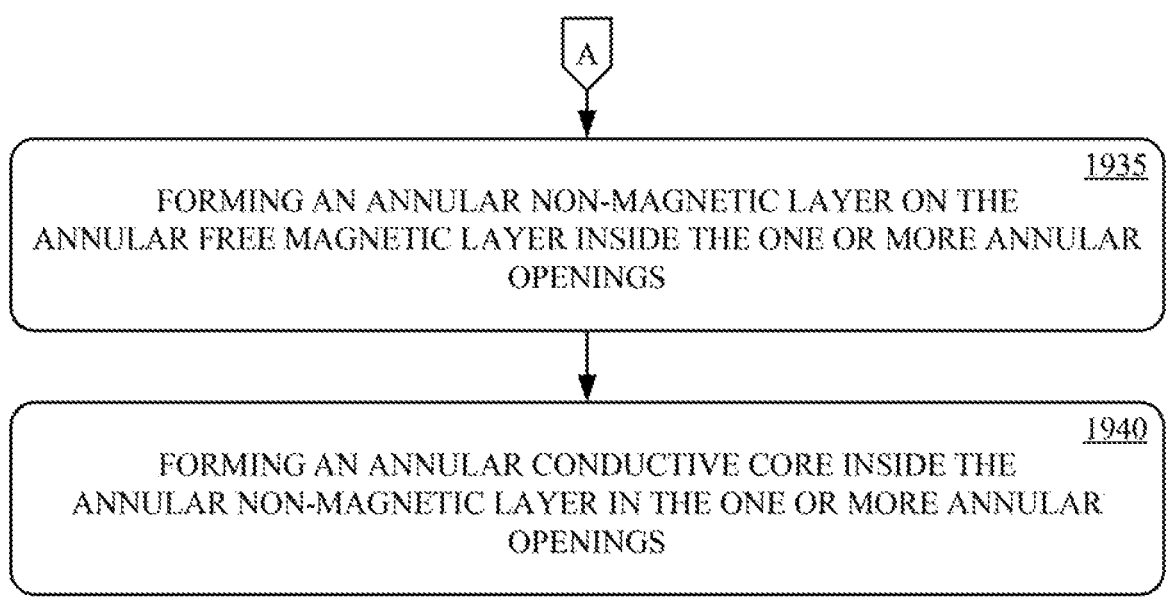

FIGS. 19A-19B show a method of fabricating a MTJ, in accordance with aspects of the present technology.

FIGS. 20A-20F show a method of fabricating a MTJ, in accordance with aspects of the present technology.

Figure 21A:
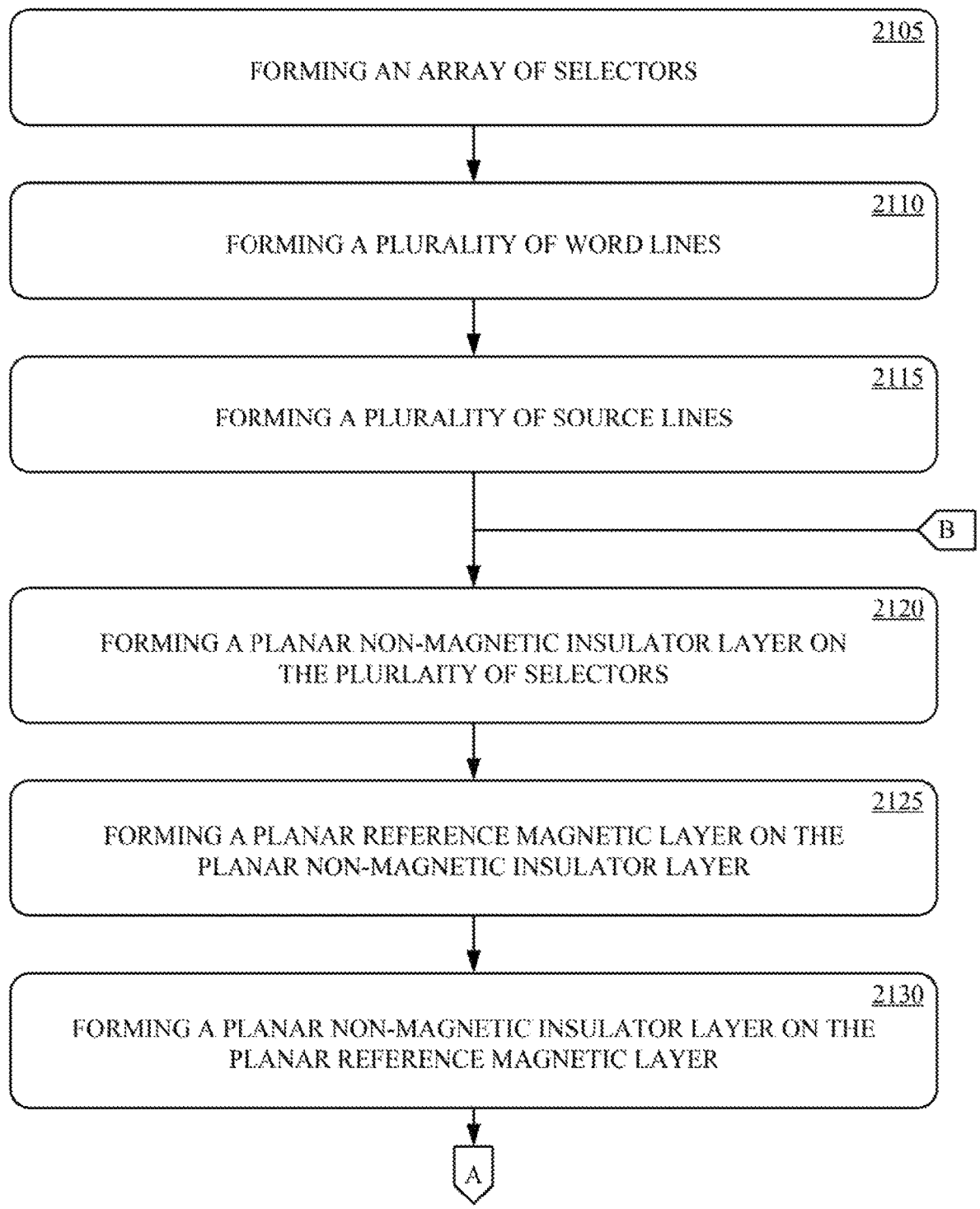
Figure 21B:
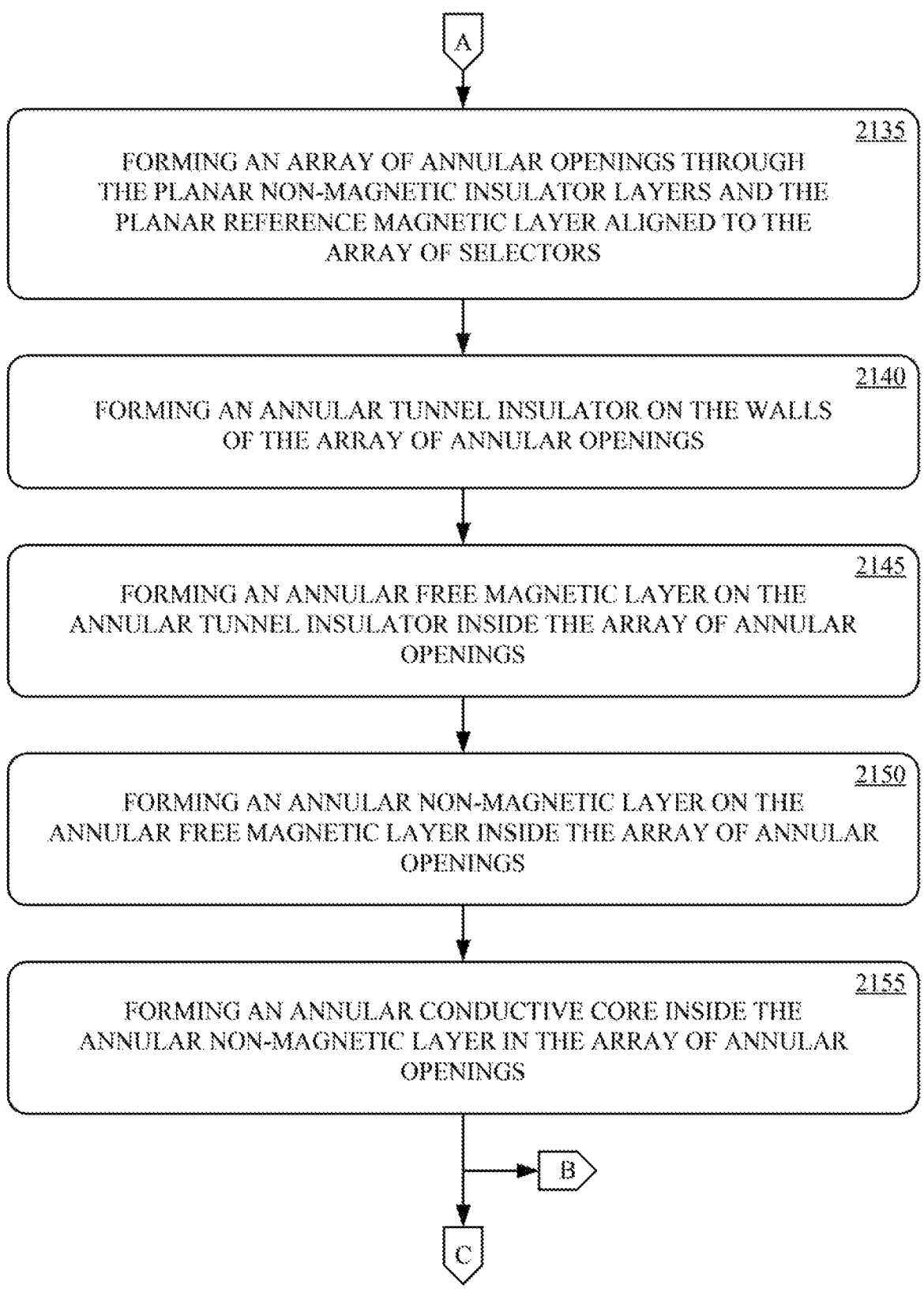
Figure 21C:
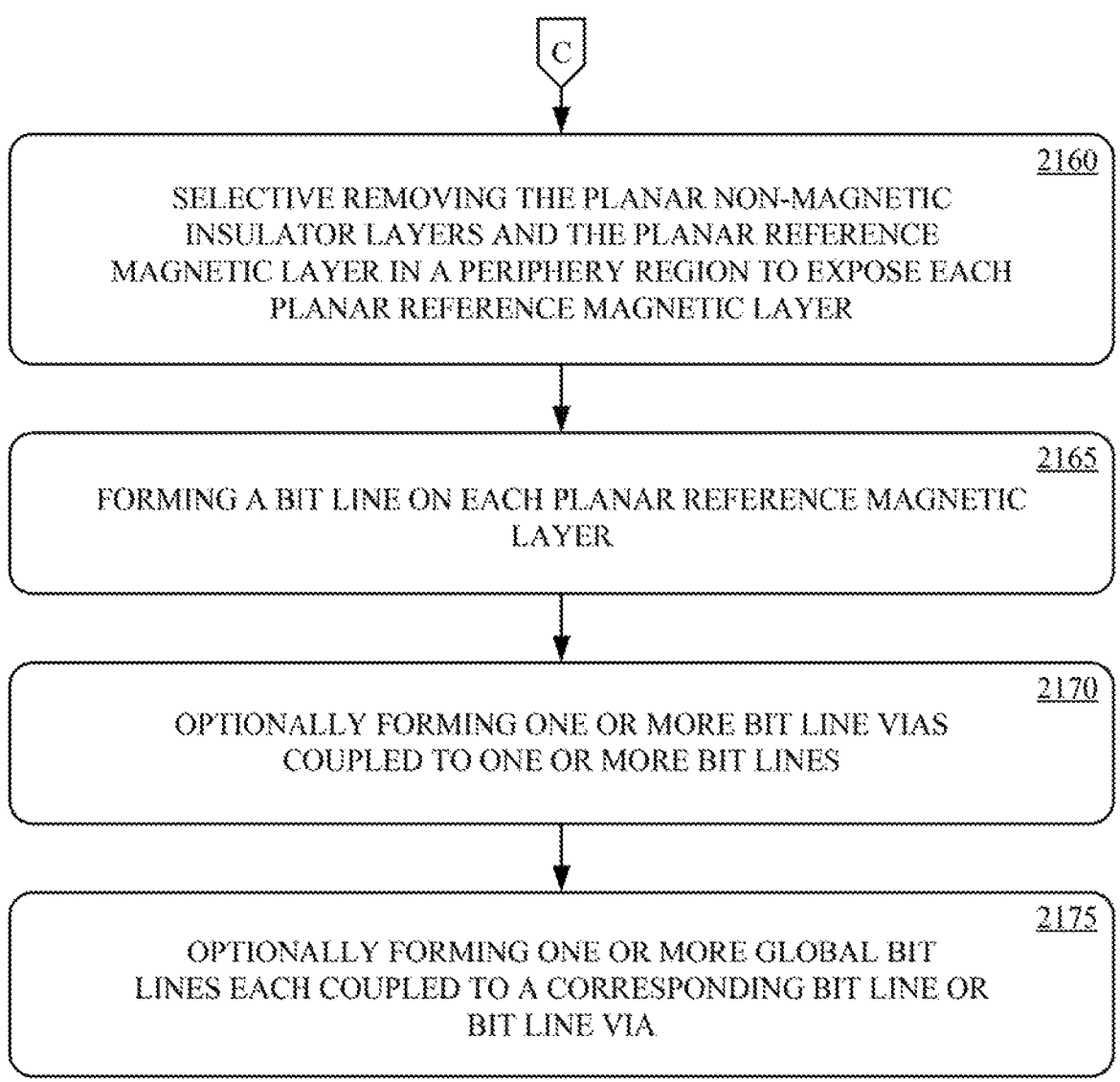

FIGS. 21A-21C show a method of fabricating a memory cell array, in accordance with aspects of the present technology.

Figure 22A:
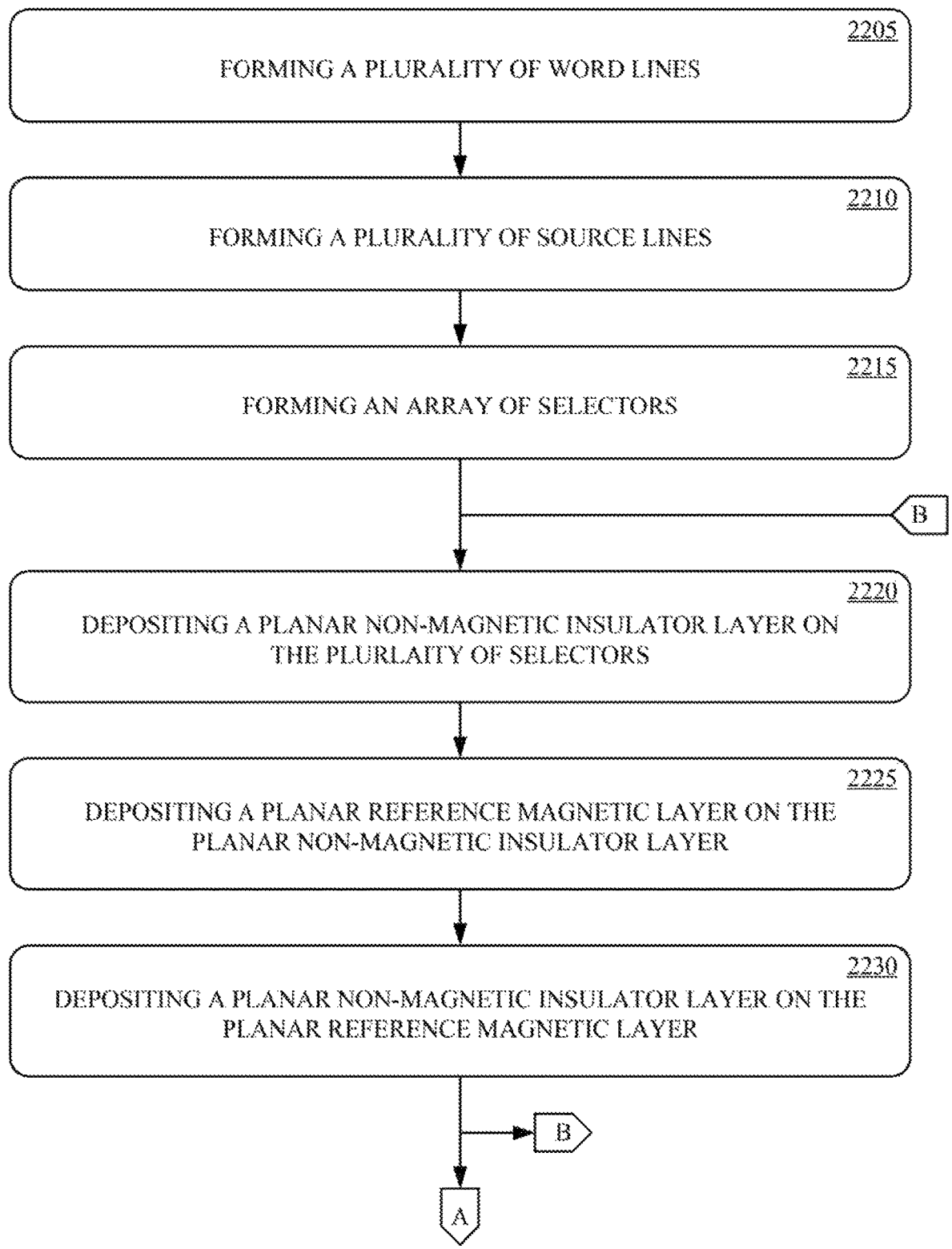
Figure 22B:
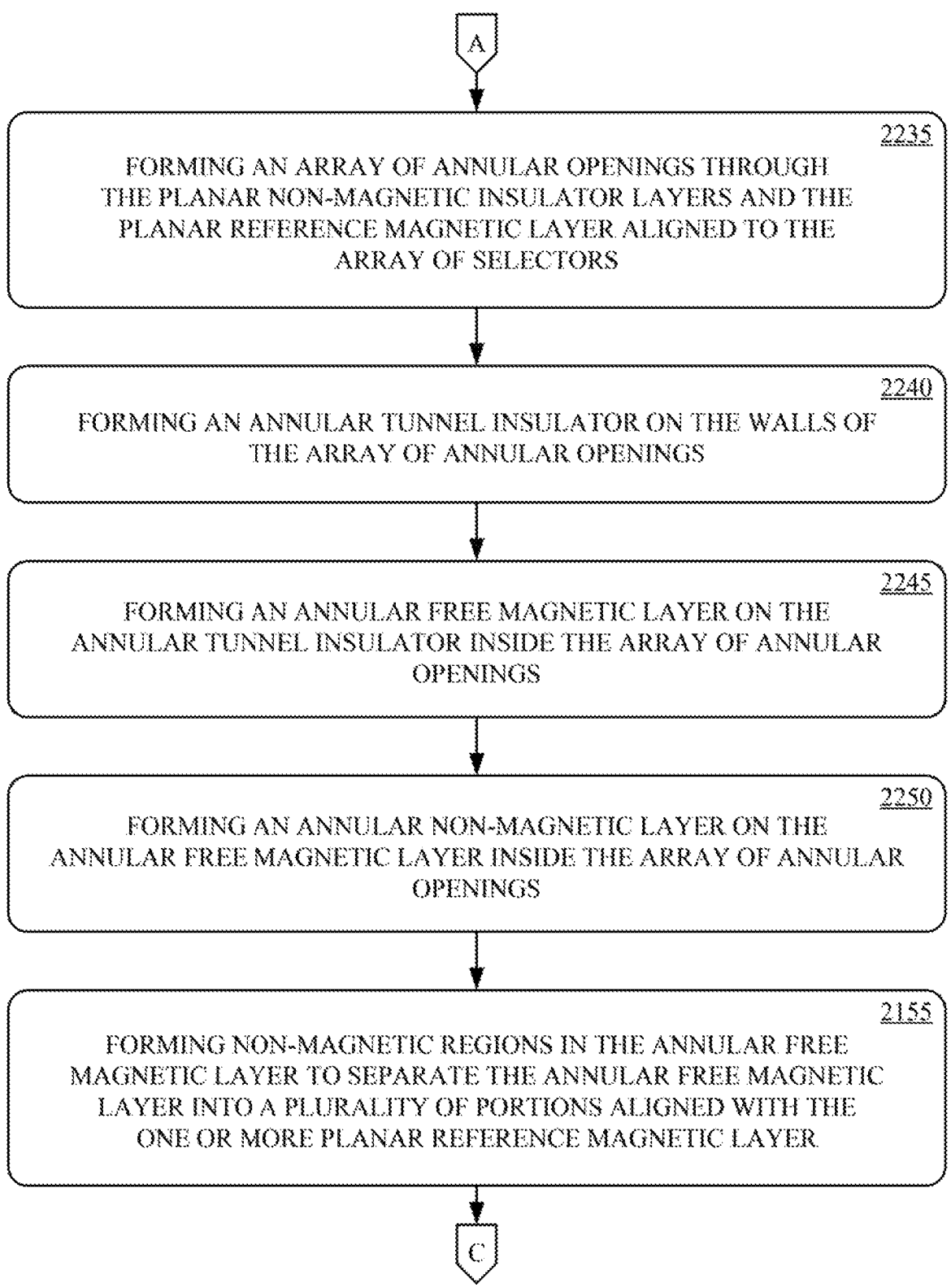
Figure 22C:
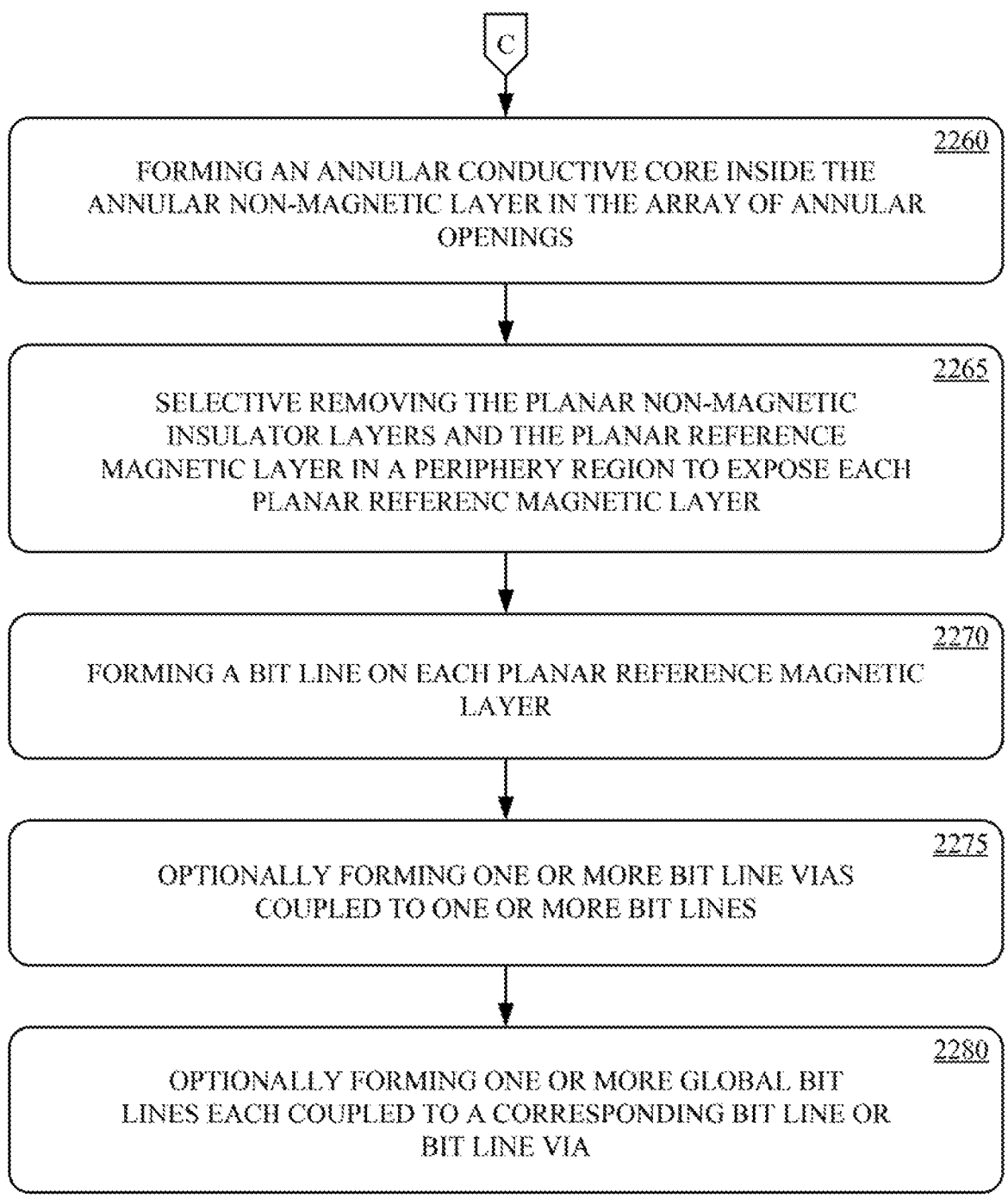

FIGS. 22A-22C show a method of fabricating a memory cell array, in accordance with aspects of the present technology.

FIGS. 23A-23F show a method of fabricating a memory cell array, in accordance with aspects of the present technology.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However. It is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

Figure 1:
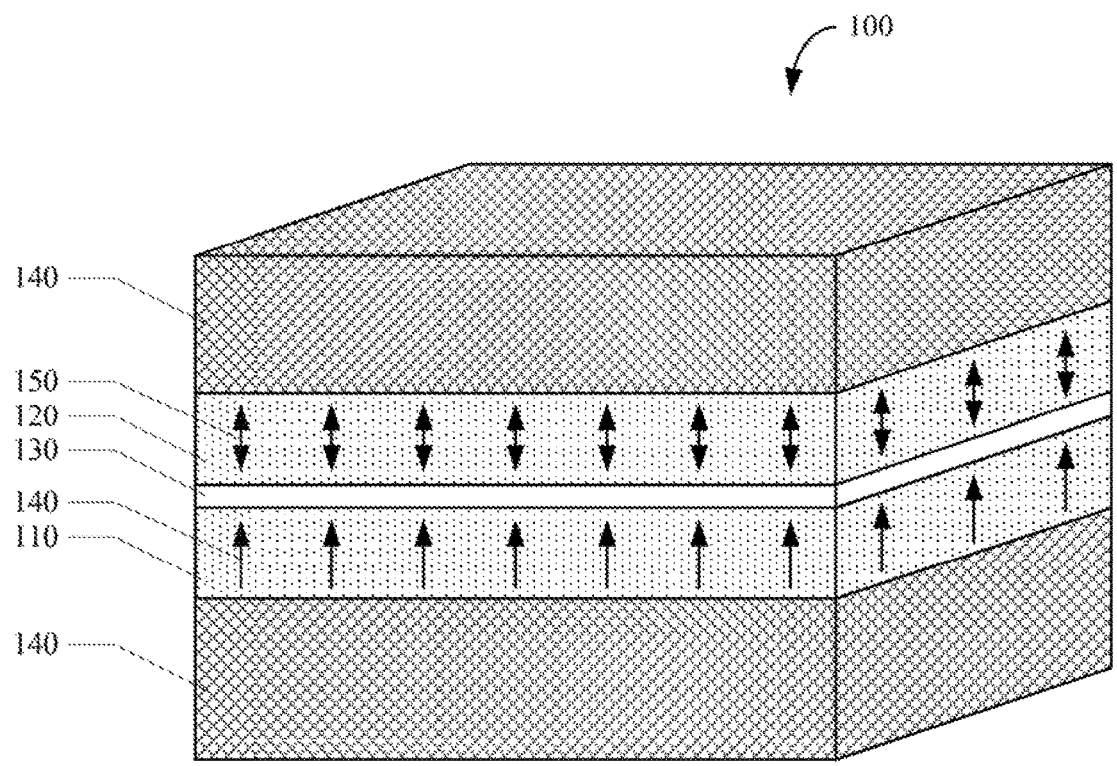
FIG. 1 shows a Magnetic Tunnel junction (MTJ), in accordance with the conventional art.
Figure 2:
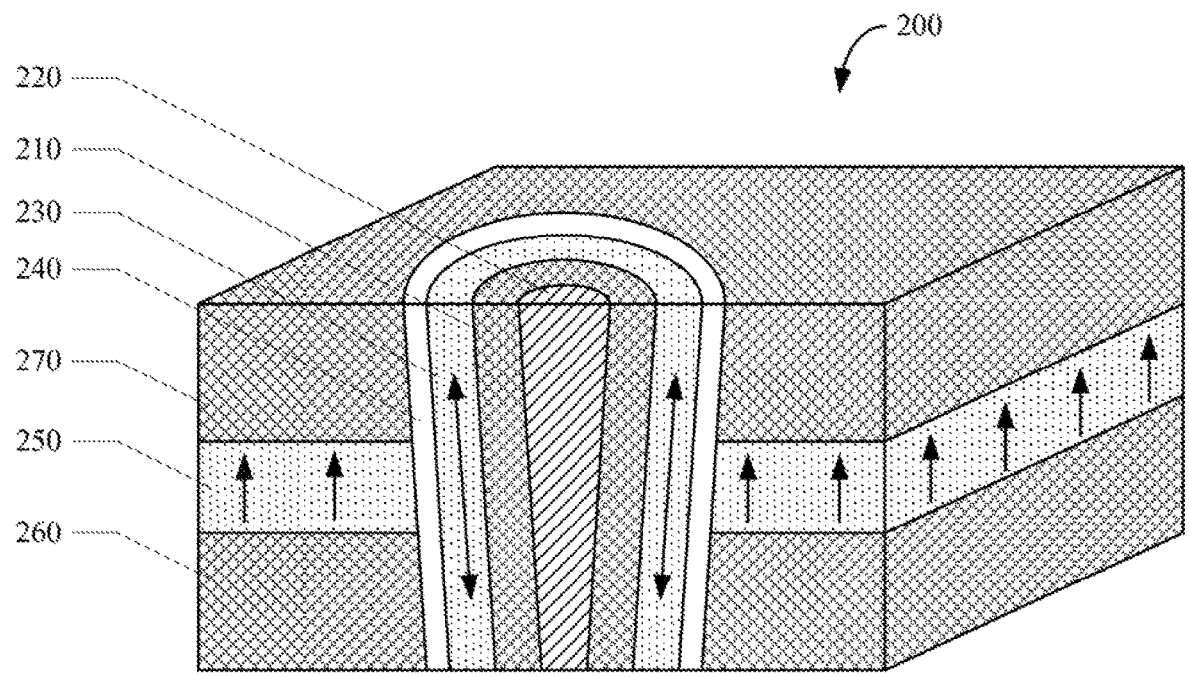
FIG. 2 shows a MTJ, in accordance with aspects of the present technology.

Referring to FIG. 2, a Magnetic Tunnel Junction (MTJ), in accordance with aspects of the present technology, is shown. The MTJ 200 can include an annular structure 210-240 including an annular non-magnetic layer 210 disposed about an annular conductive layer 220, an annular free magnetic layer 230 disposed about the annular non-magnetic layer 220, and an annular tunnel barrier layer 240 disposed about the annular free magnetic layer 230. The MTJ 200 can also include a planar reference magnetic layer 250 disposed about the annular structure 210-240 and separated from the free magnetic layer 230 by the annular tunnel barrier layer 240.

The MTJ 200 can further include a first set of one or more additional layer 260 disposed about the annular structure 210-240 and on a first side (e.g., bottom side) of the planar reference magnetic layer 250, and a second set of one or more additional layers 270 disposed about the annular structure 210-240 and on a second side (e.g., top) of the planar reference magnetic layer 250. The first set of one or more additional layers 260 can include a first planar non-magnetic insulator layer disposed about the annular structure 210-240 and on a first side of the planar reference magnetic layer 250. The first set of one or after additional layers 260 can include, alternatively or in addition, one or more seed layers, one or more Synthetic Antiferromagnetic (SAF) layers, one or more contacts, a substrate, and/or the like. The second set of one or more additional layers 270 can include, a second planar non-magnetic insulator layer disposed about the annular structure 210-240 and on a second side of the planar reference magnetic layer 250. The second set of one or more additional layers 270 can include, alternatively or in addition one or more Perpendicular Magnetic Anisotropy (PMA) enhancing layers, one or more Precessional Spin Current (PSC) layers, one or more insulator layers, one or more contacts, one or more capping layers, and/or the like. The first and second set of one or more additional layers 260, 270 are not germane to an understanding of aspects of the present technology and therefore will not be discussed in further detail.

In one implementation, the planar reference magnetic layer 250 can include one or more layers of a Cobalt-Iron-Boron (Co—Fe—B) alloy, a Cobalt-Iron (CoFe) alloy, a Cobalt-Iron-Nickle (CoFeNi) alloy, an Iron-Nickle (FeNi) alloy, an Iron-Boron (FeB) alloy a multilayer of Cobalt-Platinum (CoPt) and Cobalt Palladium (CoPd), a Heusler Alloy selected from Cobalt-Manganese-Silicon (CoMnSi), Cobalt-Manganese-Germanium (CoMnGe), Cobalt-Manganese-Aluminum (CoMnAl), Cobalt-Manganese-lron-Silicon (CoMnFeSi), Cobalt-Iron-Silicon (CoFeSi), Cobalt-Iron-Aluminum (CoFeAl), Cobalt-Chromium-Iron-Aluminum (CoCrFeAl), Cobalt-Iron-Aluminum-Silicon (CoFeAlSi), or compounds thereof, with a thickness of approximately 1-20 nm, preferably 1 to 10 nm, more preferably 1 to 5 nm. The annular tunnel insulator layer 240 can include one or more layers of a Magnesium Oxide (MgO), Silicon Oxide (SiOx), Aluminum Oxide (AlOx), Titanium Oxide (TiOx) or combination of these oxide materials with a thickness of approximately 0.1-3 nm. The annular free magnetic layer 230 can include one or more layers of a Cobalt-ion-Boron (Co—Fe—B), Cobalt-Nickle-Iron (CoNiFe), Nickle-Iron (NiFe) alloy or their multilayer combinations with a thickness of approximately 0.5-5 nm. The annular non-magnetic layer 210 can include one or more layers of metal protecting layers that can include one or more elements of a Tantalum (Ta), Chromium (Cr), W, V, Pt, Ru, Pd, Cu, Ag, Rh, or their alloy, with a thickness of approximately 1 to 10 nm. The annular conductive layer 220 can include one or more layers of Copper (Cu), Aluminum (Al), Ruthenium (Ru), and/or one or more alloys thereof with a thickness of approximately 5-20 nm. The first and second additional layers 260, 270 can include one or more layers f MgO, SiOx, AlOx, are alloys thereof with a thickness of the first and second additional in the range of 5 to 20 nm, preferably 5 to 10 nm.

In one implementation, the annular structure can be a substantially cylindrical structure with tapered sidewalls, herein referred to as a conical structure. In one implementation, the conical structure can have a taper of approximately 10-45 degrees from a first side of the planar reference magnetic layer 250 to a second side of the planar reference magnetic layer 250. In another expression, the wall angle measured from the normal axis to the horizontal direction of the planar reference magnetic layer 250 can be approximately 10-45 degrees. In one implementation, the annular tunnel insulator 240, the annular free magnetic layer 230, and the annular non-magnetic layer 210 can be concentric regions each bounded by inner and outer respective tapered cylinders having substantially the same axis, disposed about a solid tapered cylindrical region of the annular conductive layer 220.

In aspects, the magnetic field of the planar reference magnetic layer 250 can have a fixed polarization substantially perpendicular to a major planar orientation of the planar reference magnetic layer 250. The magnetic field of the annular free magnetic layer 230 can have a polarization substantially perpendicular to the major planar orientation of the planar reference magnetic layer 250 and selectively switchable between being substantially parallel and substantially antiparallel to the magnetic field of the planar reference layer 250. In one implementation, the magnetic field of the annular free magnetic layer 230 can be configured to switch to being substantially parallel to the magnetic field of the planar reference layer 250 in response to a current flow in a first direction through the conductive annular layer 220 and to switch to being substantially anti-parallel to the magnetic field of the planar reference layer 250 in response to a current flow in a second direction through the conductive annular layer 220. More generally, the polarization direction, either parallel or anti-parallel, can be changed by a corresponding change in the current direction. Therefore, regardless of the definition of the current flowing direction, the polarization of the annular free magnetic layer 230 can switch to the other polarization orientation by switching the current direction.

Figure 3:
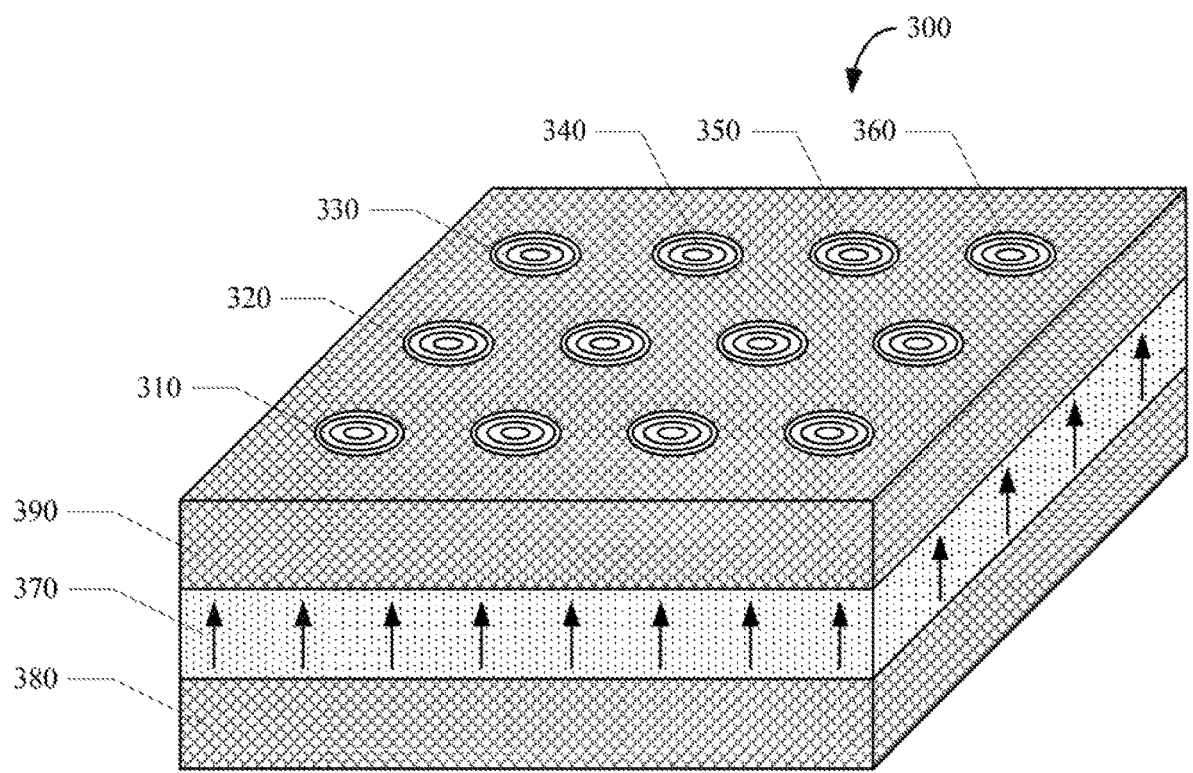
FIG. 3 shows a device including an array of MTJ, in accordance with aspects of the present technology.

Referring now to FIG. 3, a device including an array of Magnetic Tunnel Junctions (MTJs), in accordance with aspects of the present technology, is shown. The device can include a plurality of annular structures 310-360 and a planar reference magnetic layer 370. The plurality of annular structures 310-360 can each include an annular non-magnetic layer 210 disposed about an annular conductive layer 220, an annular free magnetic layer 230 disposed about the annular non-magnetic layer 220, and an annular tunnel insulator 240 disposed about the annular free magnetic layer 230, as described above in more detail with reference to FIG. 2. The planar reference magnetic layer 370 can be disposed about the plurality of annular structures 310-360 and separated from the free magnetic layers 230 by the annular tunnel barrier layers 240. The device can also include a first set of one or more additional layers 380 disposed about the plurality of annular structures 310-360 and on a first side of the planar reference magnetic layer 370. The device can also include a second set of one or more additional layers 390 disposed about the plurality of annular structures 310-360 and on a second side of the planar reference magnetic layer 370.

In aspects, each annular structure 310-360 and the corresponding portion of the planar reference magnetic layer 370 proximate the respective annular structure 310-360 can form a MTJ cell. The magnetic field of the planar reference magnetic layer 370 can have a fixed polarization substantially perpendicular to a major planar orientation of the planar reference magnetic layer 370. The magnetic field of the annular free magnetic layers 230 can have a polarization substantially perpendicular to the major planar orientation of the planar reference magnetic layer 370 and selectively switchable between being substantially parallel and substantially antiparallel to the magnetic field of the planar reference layer 370. In one implementation, the magnetic field of the annular free magnetic layer 230 can be configured to switch to being substantially parallel to the magnetic field of the planar reference layer 370 in response to a current flow in a first direction through a respective conductive annular layer 220 and to switch to being substantially anti-parallel to the magnetic field of the planar reference layer 370 in response to a current flow in a second direction through the respective conductive annular layer 220.

Figure 4:
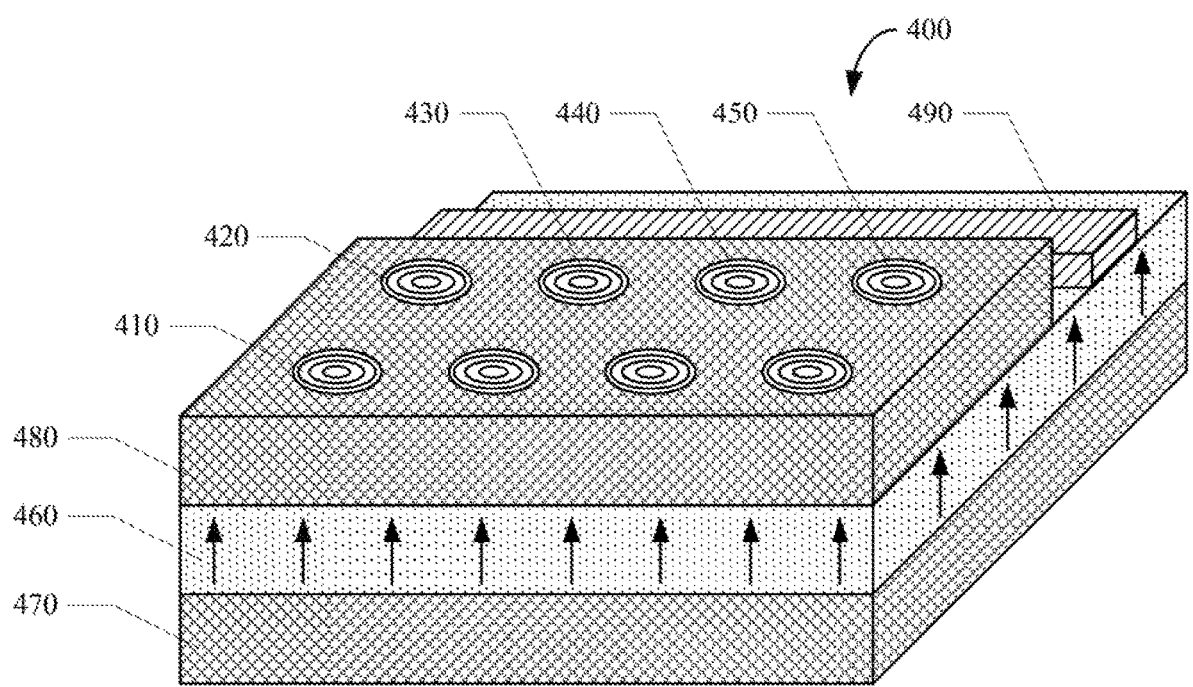
FIG. 4 shows a memory cell array, in accordance with aspects of the present technology.

Referring now to FIG. 4, a memory cell array, in accordance with aspects of the present technology, is shown. The memory cell array can include a plurality of MTJ cells. Each MTJ cell can include an annular structure 410-450 and a corresponding portion of a planar reference magnetic layer 460. The annular structures 410-450 can each include an annular non-magnetic layer 210 disposed about an annular conductive layer 220, an annular free magnetic layer 230 disposed about the annular non-magnetic layer 220, and an annular tunnel insulator 240 disposed about the annular free magnetic layer 230, as described above in more detail with reference to FIG. 2. The planar reference magnetic layer 460 can be disposed about the plurality of annular structures 410-450 and separated from the free magnetic layers 230 by the annular tunnel barrier layers 240. The memory cell array can also include a first set of one or more additional layers 470 disposed about the plurality of annular structures 410-450 and on a first side of the planar reference magnetic layer 460. The memory cell array can also include a second set of one or more additional layers 480 disposed about the plurality of annular structures 410-450 and on a second side of the planar reference magnetic layer 460.

In aspects, the magnetic field of the planar reference magnetic layer 250 can have a fixed polarization substantially perpendicular to a major planar orientation of the planar reference magnetic layer 250. The magnetic field of the annular free magnetic layer 230 can have a polarization substantially perpendicular to the major planar orientation of the planar reference magnetic layer 250 and selectively switchable between being substantially parallel and substantially antiparallel to the magnetic field of the planar reference layer 250. In one implementation, the magnetic field of the annular free magnetic layer 230 can be configured to switch to being substantially parallel to the magnetic field of the planar reference layer 250 in response to a current flow in a first direction through the conductive annular layer 220 and to switch to being substantially anti-parallel to the magnetic field of the planar reference layer 250 in response to a current flow in a second direction through the conductive annular layer 220. Typically, if the planar reference magnetic layer 250 and the annular free magnetic layer 230 have the same magnetization polarization, the MTJ cell will exhibit a relatively low resistance value corresponding to a '1' bit state; while if the magnetization polarization between the two magnetic layers is antiparallel the MTJ cell will exhibit a relatively high resistance value corresponding to a '0' bit state. Accordingly, the MTJ cells can also be schematically represented as resistive cell elements.

The memory cell array can also include a plurality of bit lines 490, a plurality or source lines, a plurality of word lines, and a plurality of select transistors. The plurality of bit lines 490 can be coupled to the planar reference magnetic layer 460. The annular conductive layer 220 of each annular structure 410-450 can comprise a portion of a respective plurality of source line. The memory cell array 400 will be further explained with reference to FIG. 5, which illustrates a schematic representation of the memory cell array.

Figure 5:
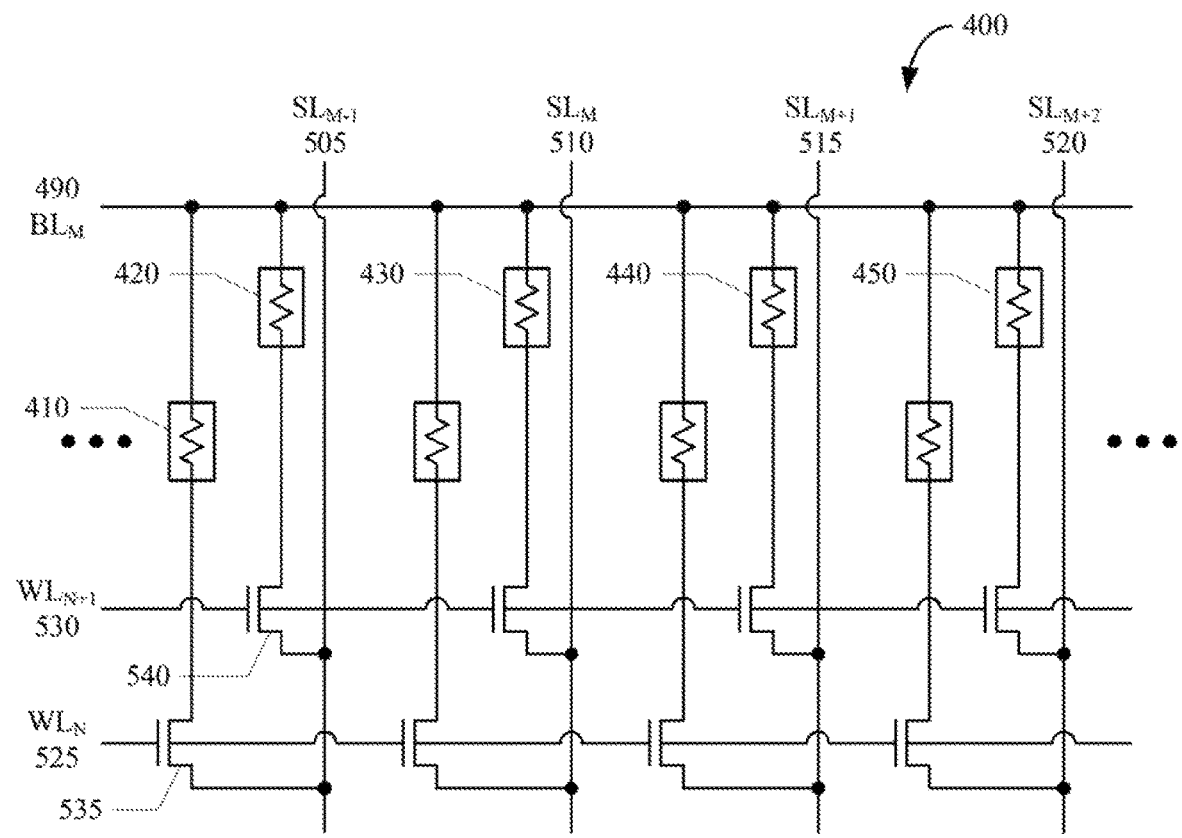
FIG. 5 shows a memory cell array, in accordance with aspects of the present technology.

Referring now to FIG. 5, the memory cell array 500 can include a plurality of MTJ cells 410-450, a plurality of bit lines 490, a plurality of source lines 505-520, a plurality of word lines 525, 530, and a plurality of select transistor 535, 540. The MTJ cells arranged along columns 410, 420 can be coupled by a corresponding select transistor 535, 540 to a respective source line 505. The gate of the select transistors 535, 540 can be coupled to a respective word line 525, 530. In one implementation, a logic '0' state can be written to a given memory cell 410 by biasing the respective bit line 490 at a bit line write potential (e.g., $V_{BLW}$), biasing the respective source line 505 at a ground potential, and driving the respective word line 525 at a word line write potential (e.g., $V_{WLW}=V_{Hi}$). The word lines 530 for the cells that are not being written to can be biased at a ground potential. In addition, the other source lines 510-520 can be biased at a high potential or held in a high impedance state. The high potential can be equal to the bit line write potential or some portion thereof. A logic '1' state can be written to the given memory cell 410 by biasing the respective bit line 490 at a ground potential, biasing the respective source line 505 at a source line write potential (e.g., $V_{SLW}$), and driving the respective word line 525 at the word line write potential (e.g.., $V_{WLW}=V_{Hi}$). The word lines 530 for the cells that are not being written to can be biased at ground potential. In addition, the other source lines 510-520 can be biased at a low potential or held in a high impedance state. The state of the given memory cell 410 can be read by biasing the respective bit line 490 at a bit line read potential (e.g., $V_{BLR}$), biasing the respective source line 505 at a ground potential, driving the respective word line 525 at a word line read potential ($V_{WLR}=V_{Hi}$), and sensing the resulting current on the respective source line 505. The word lines 530 for the cells that are not being read can be biased at a ground potential. In addition, the other source lines 510-520 can be biased at a high potential or held in a high impedance state. The high potential can be equal to the bit line read potential or some portion thereof.

Figure 6:
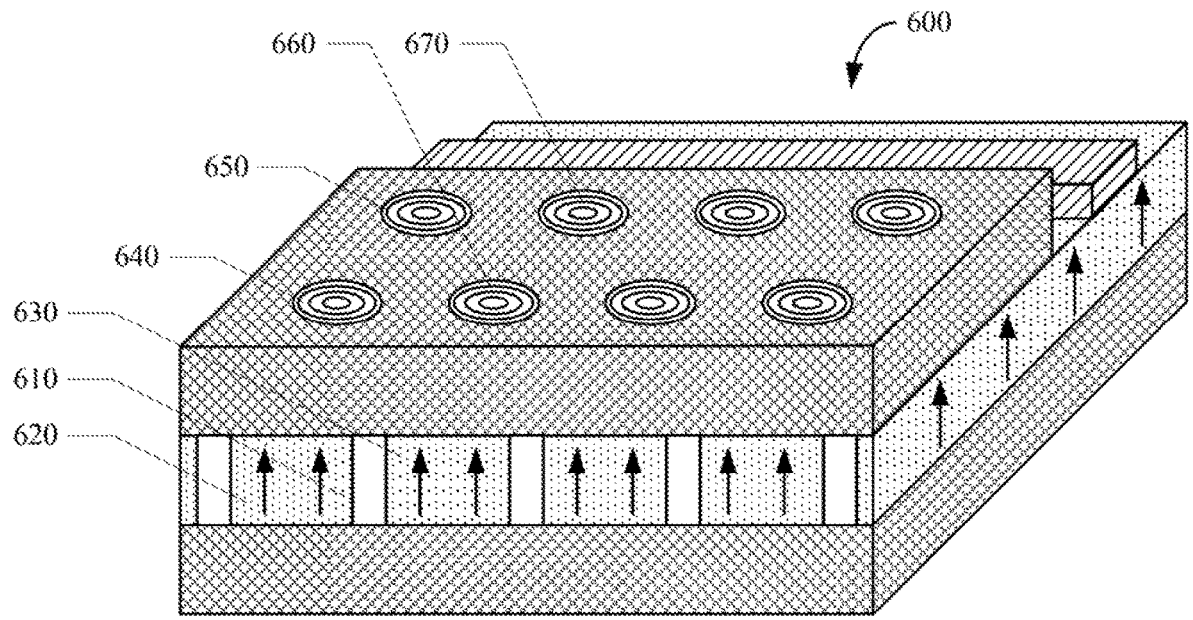
FIG. 6 shows a memory cell array, in accordance with aspects of the present technology.

Referring now to FIG. 6, a memory cell array, in accordance with aspects of the present technology, is shown. The memory cell array can include a plurality of MTJ cells as described above in more detail with respect to FIG. 4. The memory cell array can further include a plurality of insulator regions 610 disposed between portions 620, 630 of the planar reference magnetic layer along columns of the annular structures 640, 650 and 660, 670.

Figure 7:
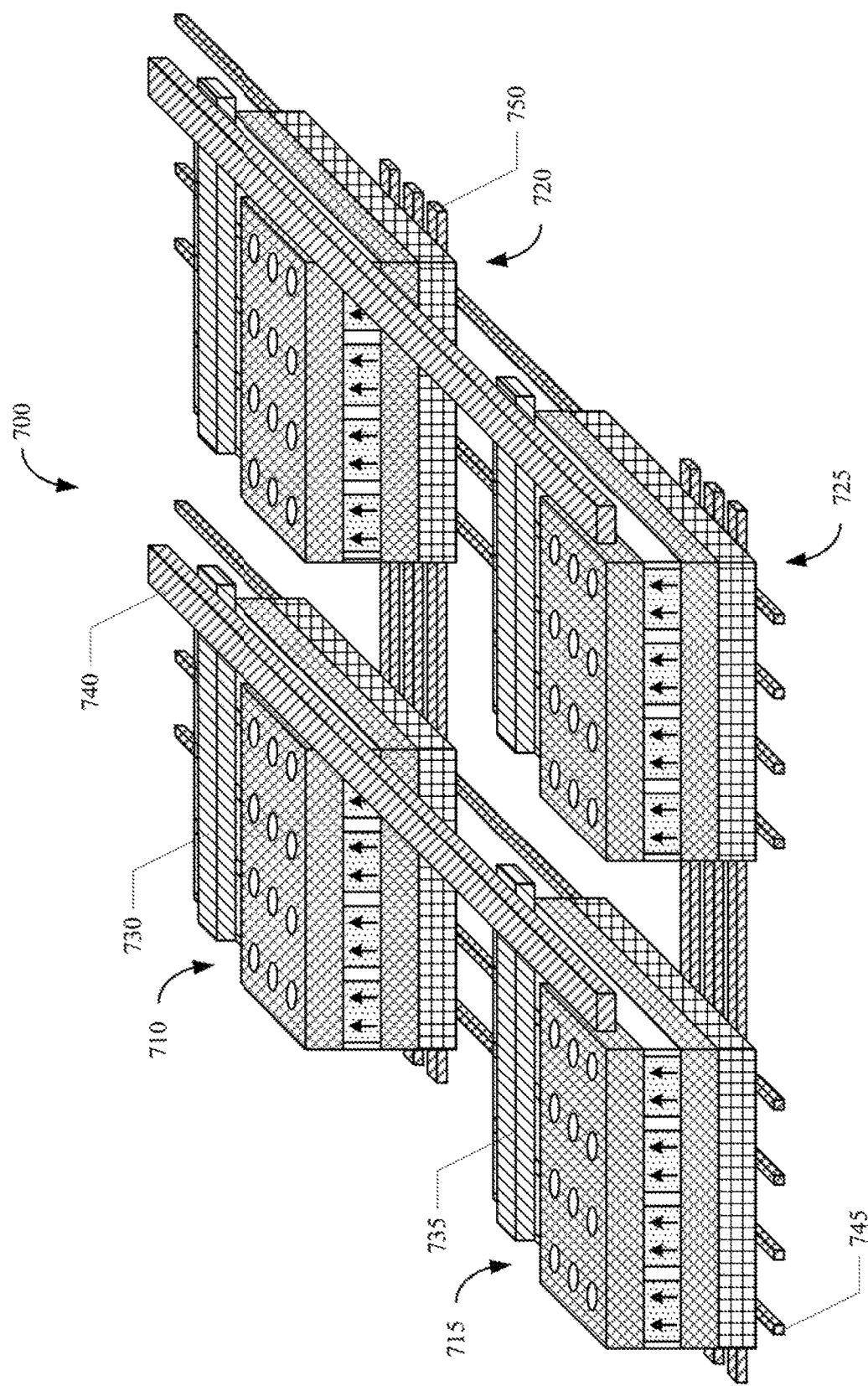
FIG. 7 shows a memory cell array, in accordance with aspects of the present technology.

Referring now to FIG. 7, a memory device, in accordance with aspects of the present technology, is shown. The memory device 700 can include a plurality of memory cell array blocks 705-720. Each memory cell array block 705-720 can include a plurality of MTJ cells as described above in more tail with respect to FIGS. 4 and 6. Two or more bit lines 730, 735 of the memory cell array blocks 710, 715 arranged in respective columns can be coupled together by a corresponding global bit line 740. In addition, the source lines 745 of the memory cell array blocks 710, 715 arranged in respective columns can be coupled together. Likewise, the word lines 750 of the memory cell array blocks 715, 725 arranged in respective rows can be coupled together. The memory device 700 will be further explained with reference to FIG. 8, which illustrates a schematic representation of the memory device.

Figure 8:
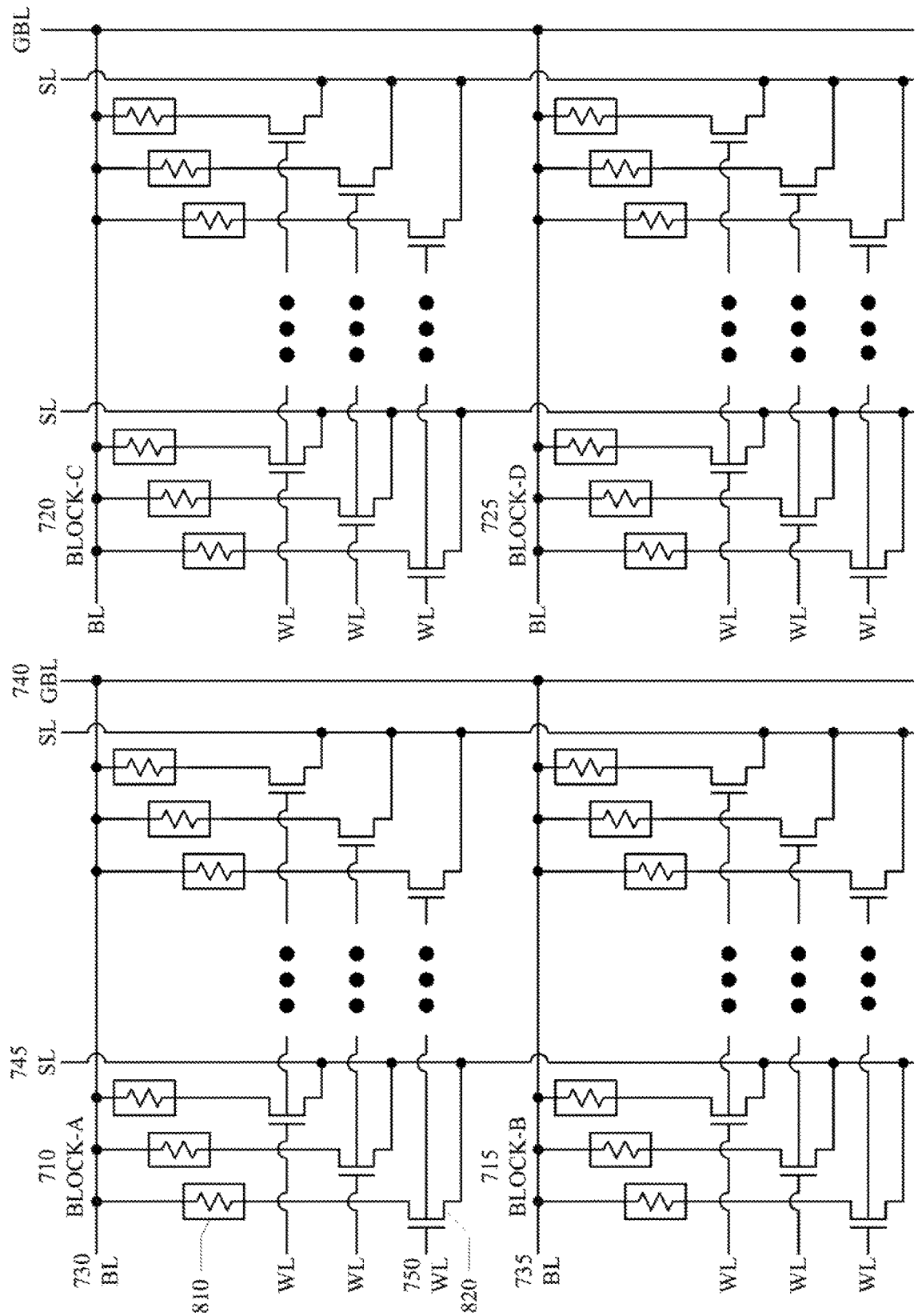
FIG. 8 shows a memory cell array, in accordance with aspects of the present technology.

Referring now to FIG. 8, the memory device 700 can include a plurality of memory cell array blocks 705-720. Each memory cell array block can include a plurality of MTJ cells 810, a plurality of bit lines 730, a plurality of source lines 745, a plurality of word lines 750, and a plurality of select transistor 820. The MTJ cells arranged along columns 810 420 can be coupled by a corresponding select transistor 820 to a respective source line 745. The gate of the select transistors can be coupled to a respective word line 750. Two or more hit lines 730, 735 of the memory cell array blocks 710, 715 arranged in respective columns can be coupled together by a corresponding global bit line 740. In addition, the source lines 745 of the memory cell array blocks 710, 715 arranged in respective columns can be coupled together. Likewise, the word lines 750 of the memory cell array blocks 715, 725 arranged in respective rows can be coupled together.

In one implementation, logic '0' and '1' states can be written to a given memory cell 810 by biasing the global bit line 740 which also biases the respective bit line 730 at a bit line write potential (e.g., $V_{BLW}$), biasing the respective source line 745 at a ground potential, and driving the respective word line 525 at a word line write potential (e.g., $V_{WLW}=V_{Hi}$). The word lines for the cells that are not being written to can be biased at a ground potential. In addition, the other source lines can be biased at a high potential or held in a high impedance state. The high potential can be equal to the bit line write potential or some portion thereof. A logic '1' state can be written to the given memory cell 810 by biasing the global bit line 740 which also biases the respective bit line 730 at a ground potential, biasing the respective source line 745 at a source line write potential (e,g., $V_{SLW}$), and driving the respective word line 750 at the word line write potential (e.g., $V_{WLW}=V_{Hi}$). The word lines for the cells that are not being written to can be biased at ground potential. In addition, the other source lines can be biased at a low potential or held in a high impedance state. The state of the given memory cell 810 can be read by biasing the global bit line 740 which also biases the respective bit line 730 at a bit line read potential (e.g., $V_{BLR}$), biasing the respective source line 745 at a ground potential, driving the respective word line 750 at a word line read potential ($V_{WLR}=V_{Hi}$), and sensing the resulting current on the respective source line 745. The word lines for the cells that are not being read can be biased at a ground potential. In addition, the other source lines can be biased at a high potential or held in a high impedance state. The high, potential can be equal to the bit line read potential or some portion thereof.

Referring now to FIG, 9, a memory device, in accordance with aspects of the present technology, is shown. In one implementation, the memory device can be a Magnetoresistive Random Access Memory (MRAM). The memory device 900 can include a plurality of memory cell array blocks 710-725, one or more word line decoders 905, 910, one or more sense amplifier circuits 915, 920, and peripheral circuits 925. The memory device 900 can include other well-known circuits that are not necessary for an understanding of the present technology and therefore are not discussed herein.

Each memory cell array block 710-725 can include can include a plurality of MTJ cells 810, a plurality of bit lines 730, a plurality of source lines 745, a plurality of word lines 750, and a plurality of select transistor 820 as described in more detail above with reference to FIGS. 7 and 8. The peripheral circuits 925, the word line decoders 905, 910 and sense amplifier circuits 915, 920 can map a given memory address to a particular row of MTJ memory cells in a particular memory cell array block 710-725. The output of the word line drivers 905, 910 can drive the word lines to select a given word line of the array. The sense amplifier circuits 915, 920 utilize the source lines and bit lines of the array to read from and write to memory cells of a selected word line in a selected memory cell array block 710-725.

In one aspect, the peripheral circuits 925 and the word line decoders 905, 910 can be configured to apply appropriate write voltages to bit lines, source lines and, word lines to write data to cells in a selected word. The magnetic polarity, and corresponding logic state, of the free layer of the MTJ cell can be changed to one of two states depending upon the direction of current flowing through the MTJ cell. For read operations, the peripheral circuits 925, the word line decoders 905, 910 and sense amplifier circuits 915, 920 can be configured to apply appropriate read voltages to the bit lines, sources lines and word lines to cause, a current to flow in the source lines that can be sensed by the sense amplifier circuits 915, 920 to read data from cells in a selected word.

Figure 10:
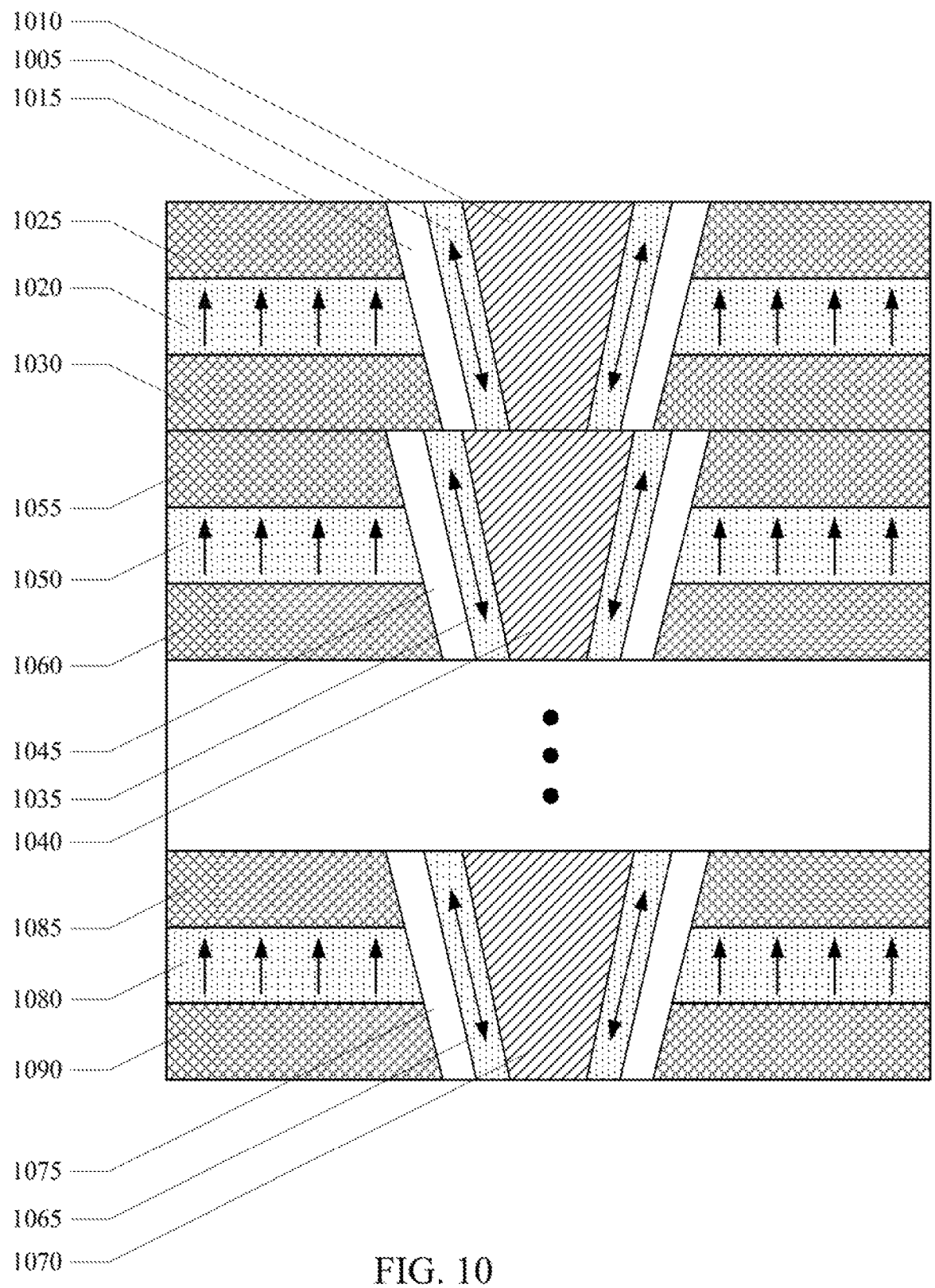

Referring now to FIG. 10 a device including a string of MTJs, in accordance with aspects of the present technology, is shown. The device can include a first annular structure 1005-1015 including an annular free magnetic layer 1005 disposed about an annular conductive layer 1010, and an annular tunnel insulator 1015 disposed about the annular free magnetic layer 1005. The annular structure can optionally include an annular non-magnetic layer (not shown) disposed between the annular conductive layer 1010 and the annular free magnetic layer 1005. A first planar reference magnetic layer 1020 can be disposed about the first annular structure 1005-1015 and separated from the free magnetic layer 1005 of the first annular structure by the annular tunnel barrier layer 1015 of the first annular structure. A first non-magnetic insulator layer 1025 can be disposed about the first annular structure and on a first side of the first planar reference magnetic layer 1020. A second non-magnetic insulator layer 1030 Can be disposed about the first annular structure and on a second side of the first planar reference magnetic layer 1020.

The device can further include a second annular structure 1015-1045. The second annular structure 1035-1045 can be axially aligned with the first annular structure 1005-1015. The second annular structure can include an annular free magnetic layer 1035 disposed about an annular conductive layer 1040, and an annular tunnel insulator 1045 disposed about the annular free magnetic layer 1035. The second annular structure can optionally include an annular non-magnetic layer (not shown) disposed between the annular conductive layer 1040 and the annular free magnetic layer 1035. A second planar reference magnetic layer 1050 can be disposed about the second annular structure 1035-1045 and separated from the free magnetic layer 1035 of the second annular structure by the annular tunnel barrier layer 1045 of the second annular structure. A third non-magnetic insulator layer 1055 can be disposed about the second annular structure, and between the second non-magnetic insulator layer 1030 and a first side of the second planar reference magnetic layer 1050. A fourth non-magnetic insulator layer 1060 can be disposed about the second annular structure and on a second side of the second planar reference magnet cc layer 1050.

Each annular structure and the portions of the planar reference magnetic layer and the non-magnetic insulator layers proximate the respective annular structure can comprise a MTJ cell. The device can include any number of MTJ cells coupled together in a string. For example, a $N^{th}$ level string of MTJ cells can include a $N^{th}$ annular structure 1065-1075. The $N^{th}$ annular structure 1065-1075 can be axially aligned with the first and second annular structures 1005-1015, 1035-1045. The $N^{th}$ annular structure can include an annular free magnetic layer 1065 disposed about an annular conductive layer 1070, and an annular tunnel insulator 1075 disposed about the annular free magnetic layer 1065. The $N^{th}$ annular structure can optionally include an annular non-magnetic layer (not shown) disposed between the annular conductive layer 1070 and the annular free magnetic layer 1065. A $N^{th}$ planar reference magnetic layer 1080 can be disposed about the $N^{th}$ annular structure 1065-1075 and separated from the free magnetic layer 1065 of the $N^{th}$ annular structure by the annular tunnel barrier layer 1075 of the $N^{th}$ annular structure. A $(N-1)^{th}$ non-magnetic insulator layer 1085 can be disposed about the $N^{th}$ annular structure, and between the non-magnetic insulator layer of an adjacent cell and a first side of the second planar reference magnetic layer 1080. A $N^{th}$ non-magnetic insulator layer 1090 can be disposed about the $N^{th}$ annular structure and on a second side of the N planar reference magnetic layer 1080.

The device can optionally include a non-magnetic metal layer 1092 disposed between adjacent MTJ cells, as illustrated in FIG. 11. For example, a non-magnetic metal layer 1092 can be disposed between the second non-magnetic insulator layer 1030 and the third non-magnetic insulator layer 1055 and between the first annular structure 1005-1015 and the second annular structure 1035-1045. Alternatively, the device can optionally include a non-magnetic insulator layer 1094 and a non-magnetic metal plug 1096 disposed between adjacent MTJ cells, as illustrated in FIG. 12. For example, an additional non-magnetic insulator layer 1094 can be disposed between the second non-magnetic insulator layer 1030 and the third non-magnetic insulator layer 1055 and one or more portions of the first and second annular structures 1005-1015, 1035-1045. A non-magnetic metal plug 1096 can be disposed between respective ones of the annular conductive layer 1010 of the first annular structure 1005-1015 and the annular conductive layer 1040 of the second annular structure 1035-1045.

In one implementation, the annual structures 1005-1015, 1035-1045, 1065-1075 can be substantially cylindrical structures with tapered sidewalk, herein referred to as conical structures. In one implementation, the conical structures can have a taper of approximately 10-45 degrees from a first side of the planar reference magnetic layers 1020, 1050, 1080 to a second side of the planar reference magnetic layers 1020, 1050, 1080. In another expression, the wall angle measured from the normal axis to the horizontal direction of the planar reference magnetic layers 1020, 1050, 1080 can be approximately 10-45 degrees. In one implementation, the annular tunnel insulators 1015, 1045, 1075 and the annular free magnetic layer 1005, 1035, 1065 can be concentric regions each bounded by inner and outer respective tapered cylinders having substantially the same axis, disposed about a solid tapered cylindrical region of the annular conductive layers 1010, 1040, 1070. In one implementation, the taper angle of the sidewalk can provide for separating the annular free magnetic layers 1005, 1035, 1065 of the annual structures 1005-1015, 1035-1045, 1065-1075 from each other, while the annular conductive layers 1010, 100, 1070 are coupled together along the string.

In aspects, the magnetic field of the planar reference magnetic layers 1020, 1050, 1080 can have a fixed polarization substantially perpendicular to a major planar orientation of the planar reference magnetic layer 1020, 1050, 1080. The magnetic field of the annular free magnetic layers 1005, 1035, 1065 can have a polarization substantially perpendicular to the motor planar orientation of the planar reference magnetic layers 1020, 1050, 1080 and selectively switchable between being substantially parallel and substantially antiparallel to the magnetic field of the planar reference layers 1020, 1050, 1080. In one implementation, the magnetic field of the annular free magnetic layers 1005, 1035, 1065 can be configured to switch to being substantially parallel to the magnetic field of the planar reference layer 1020, 1050, 1080 in response to a current flow in a first direction through the conductive annular layer 1010, 1040, 1070 and to switch to being substantially anti-parallel to the magnetic field of the planar reference layer 1020, 1050, 1080 in response to a current flow in a second direction through the conductive annular layer 1010, 1040, 1070.

Referring now to FIG. 13, a memory device, in accordance with aspect of the present technology, is shown. The memory device can include an array of MTJ cells arranged in cell columns and cell rows in a plurality of cell levels. The MTJ cells in a given corresponding cell column position and cell row position in the plurality of cell levels can be coupled together in a cell string as described above with reference to FIGS. 10-12 in more detail.

Each MTJ cell can include an annular structure including an annular non-magnetic layer disposed about an annular conductive layer, an annular free magnetic layer disposed about the annular non-magnetic layer, and an annular tunnel insulator disposed about the annular free magnetic layer.

Each eels can thither include a portion of a respective planar reference magnetic layer disposed about the annular structure, a portion of a respective planar non-magnetic insulator layer disposed on a first side of the planar reference magnetic layer and about the annular structure, and a portion of another respective planar non-magnetic insulator layer disposed on a second side of the planar reference magnetic layer and about the annular structure.

For example, the MTJ cells in a first level 1305 can include a first plurality of annular structures 1310-1330 arranged in columns and rows. Each annular structure can include an annular non-magnetic layer disposed about an annular conductive layer, an annular free magnetic layer disposed about the annular non-magnetic layer, and an annular tunnel insulator disposed about the annular free magnetic layer. A first planar reference magnetic layer 1335 can be disposed about the first plurality of annular structures 1310-1330 and separated from the free magnetic layers of the first plurality of annular structures 1310-1330 by the annular tunnel barrier layers of the first plurality of annular structures 1310-1330. A first non-magnetic insulator layer 1340 can be disposed about the first plurality of annular structures 1310-1330 and on a first side of the first planar reference magnetic layer 1335. A second non-magnetic insulator layer 1345 can be disposed about the first plurality of annular structures 1310-1330 and on a second side of the first planar reference magnetic layer 1335.

The MTJ cells in a second level 1350 can include a second plurality of annular structures axially aligned with respective ones the first plurality of annular structures 1310-1330. A second planar reference magnetic layer 1355 can be disposed about the second plurality of annular structures and separated from the free magnetic layer of the second plurality of annular structures by the annular tunnel barrier layers of the second plurality of annular structures. A third non-magnetic insulator layer 1360 can be disposed about the second plurality of annular structures and between the second non-magnetic insulator layer 1345 and a first side of the second planar reference magnetic layer 1355. A fourth non-magnetic insulator layer 1365 can be disposed about the second plurality of annular structures and on a second side of the second planar reference magnetic layer 1355.

The memory device can further include MTJ cells in any number of levels. The memory device can optionally include a non-magnetic metal layer disposed between adjacent levels 1305, 1350, as described above with reference to FIG. 11. Alternatively, the memory device can optionally include a non-magnetic insulator layer and a non-magnetic metal plug disposed between adjacent levels 1305, 1355, as described above with reference to FIG. 12. The memory device can also optionally include a plurality of insulator regions disposed between portions of the planar reference magnetic layers along columns of the annular structures, as described above with reference to FIG. 6.

The memory device can also include a plurality of bit lines 1370, 1375, a plurality of source lines, a plurality of word lures, and a plurality of select transistors. The plurality of bit lines 1370, 1375 can be coupled to respective planar reference magnetic layers 1335, 1355. The annular conductive layer of each annular structure coupled together in a string can comprise a portion of a respective source line. The device 1300 will be further explained with reference to FIG. 14, which illustrates a schematic representation of the memory device.

Referring now to FIG. 14, the memory cell array 1300 can include a plurality of MTJ cells 1405-1420, a plurality of bit lines 1425, 1430, a plurality of source lines 1435-1445, a plurality of word lines 1450, 1455 and a plurality of select transistor 1460, 1465. The MTJ cells arranged along a string 1405, 1410 can be coupled by a corresponding select transistor 1460 to a respective source line 1435. The MTJ cells arranged along a second string 1415, 1420 in the same column can be coupled by another corresponding select transistor 1465 to the same respective source line 1435. The gate of the select transistors 1460, 1465 can be coupled to a respective word line 1450. 14550. The memory device can further include a plurality of memory cell array blocks, as described above with reference to FIGS. 7 and 8.

In one implementation, a logic '0' state can be written to a given memory cell 1405 by biasing the respective bit line 1420 at a bit time write potential (e.g., $V_{BLW}$), biasing the respective source line 1435 at a ground potential, and driving the respective word line 1455 at a word line write potential (e.g., $V_{WLW}=V_{Hi}$). The word lines for the cells that are not being written to can be biased at a ground potential. In addition, the other source lines 1440, 1445 can be biased at a high potential or held in a high impedance state. The high potential can be equal to the hit line write potential or sonic portion thereof. A logic '1' state can be written to the given memory cell 1405 by biasing the respective bit line 1420 at a ground potential, biasing the respective source line 1435 at a source line write potential (e.g., $V_{SLW}$), and driving the respective word line 1455 at the word line write potential (e.g.., $V_{WLW}=V_{Hi}$). The word lines for the cells that are not being written to can be biased at ground potential. In addition, the other source lines 1440, 1445 can be biased at a low potential or held in a high impedance state. The state of the given memory cell 1405 can be read by biasing the respective hit line 1420 at a bit line read potential (e.g., $V_{BLR}$), biasing the respective source line 1435 at a ground potential, driving the respective word line 1455 at a word line read potential ($V_{WLR}=V_{Hi}$), and sensing the resulting current on the respective source line 1435. The word lines for the cells that are not being read can be biased at a ground potential. In addition, the other source lines 1440, 1445 can be biased at a high potential or held in a high impedance state. The high potential can be equal to the bit line read potential or some portion thereof.

Referring now to FIG. 15, two MTJ cells coupled in a string, in accordance with aspects of the present technology, is shown. When writing a '0' to a first MTJ cell 1405, the hit line 1420 can be biased at $V_{BLW}$ and the source line can be biased at ground resulting in a current that flows from the bit line 1420 and out through the source line 1435. However, the bit lines of the second mu cells in the same string 1410 can be biased at ground, which will result in half the current that flows into the bit line 1420 of the first MTJ cell 1405 flowing out the source line 1435 and half the current leaking out through the bit line 1425 of the second MTJ cell. By increasing the potential voltage on the bit line 1420 of the second MTJ cell 1410 or holding the bit line 1420 of the second MTJ cell 1410 in a high impedance state (e.g., floating), the leakage current can be reduced. For example, if the potential on the bit line 1425 of the second MTJ cell 1410 is increased to one half (½) of the applied to the bit line 1420 of the first MTJ cell 1405, the leakage current out through the second MTJ cell 1410 can be reduced to 25%. Similar leakage paths can be present when writing a '1' to a given MTJ cell in a string. By decreasing the potential applied to the bit lines of the other MTJ cells in the string or holding the bit lines of the other strings in a high impedance state, leakage currents through the other MTJ cells can be also be decreased.

Referring now to FIG. 16, a device including a string of MTJs, in accordance with aspects, of the present technology. The device can include one or more annular structures 1605-1635 including a plurality of annular free magnetic layers 1605-1615 disposed about the annular non-magnetic layer 1620. The plurality of annular free magnetic layers 1605-1615 can be separated from each other by non-magnetic separator layers 1625, 1630. The one or more annular structures 1605-1635 can further include an annular tunnel insulator 1635 disposed about the plurality of annular free magnetic layers 1605-1615 and the one or more non-magnetic separator layers 1625, 1630. The one or more annular structures 1605-1635 can optionally include an annular non-magnetic layer (not shown) disposed between the annular conductive layer 1620 and the combination of the plurality of annular free magnetic layers 1605-1635 and one or more non-magnetic separator layers 1625, 1630.

A first planar reference magnetic layer 1640 can be disposed about the one or more annular structures 1605-1635. The first planar reference magnetic layer 1640 can be separated from the free magnetic layers 1605-1615 of the annular structures 1605-1635 by the annular tunnel barrier layer 1635. The first planar reference magnetic layer 1640 can be aligned with a first annular free magnetic layer 1605. A first non-magnetic insulator layer 1645 can be disposed about the one or more annular structures 1605-1635 and on a first side of the first planar reference magnetic layer 1640. A second non-magnetic insulator layer 1650 can be disposed about the one or more annular structures 1605-1635 and on a second side of the first planar reference magnetic layer 1640. A second planar reference magnetic layer 1655 can be disposed about the one or more annular structures 1605-1635. The second planar reference magnetic layer 1655 can be separated from the free magnetic layers 1605-1615 by the annular tunnel barrier layer 1635. The second planar reference magnetic layer 1655 can be aligned with a second annular five magnetic layer 1610. A third non-magnetic insulator layer 1660 can be disposed about the one or more annular structures 1605-1635 and on a first side of the second planar reference magnetic layer 1655. A fourth non-magnetic insulator layer 1665 can be disposed about the one or more annular structures 1605-1635 and on a second side of the second planar reference magnetic layer 1655. An optional non-magnetic metal layer 1670 can be disposed between the second non-magnetic insulator layer 1650 and the third non-magnetic insulator layer 1660.

The device can include any number of annular free magnetic layers disposed about the annular non-magnetic layer and corresponding set of planar reference magnetic layers and non-magnetic insulator layers. For example, the device can include a third planar reference magnetic layer 1675 that can be disposed about the one or more annular structures 1605-1635. The third planar reference magnetic layer 1675 can be separated from the free magnetic layers 1605-1615 of the annular structures 1605-1635 by the annular tunnel barrier layer 1635. The third planar reference magnetic layer 1675 can be aligned with a third annular free magnetic layer 1615. A fifth non-magnetic insulator layer 1680 can be disposed about the one or more annular structures 1605-1635 and on a first side of the third planar reference magnetic layer 1675. A sixth non-magnetic insulator layer 1685 can be disposed about the one or more annular structures 1605-1635 and on a second side of the third planar reference magnetic layer 1675. An optional non-magnetic metal layer can also be disposed between the fourth non-magnetic insulator layer 1665 and the fifth non-magnetic insulator layer 1680.

In one implementation, the annular structure 1605-1635 can be substantially cylindrical structures with tapered sidewalls, herein referred to as conical structures. In one implementation, the conical structures can have a taper of approximately 10-45 degrees from a first side of the planar reference magnetic layers 1640, 1655, 1675 to a second side of the planar reference magnetic layers 1640, 1655, 1675. In another expression, the wall angle measured from the normal axis to the horizontal direction of the, planar reference magnetic layers 1640, 1655, 1675 can be approximately 10-45 degrees. In one implementation, the annular tunnel insulator 1635, and the annular free magnetic layer 1605, 1610, 1615 can be concentric regions each bounded by inner and outer respective tapered cylinders having substantially the same axis, disposed about a solid tapered cylindrical region of the annular conductive layer 1620.

In one implementation, the planar reference magnetic layers 1640, 1655, 1675 can include one or more layers of a Cobalt-Iron-Boron (Co—Fe—B) alloy, a Cobalt-Iron (CoFe) alloy, a Cobalt-Iron-Nickle (CoFeNi) alloy, an Iron-Nickle (FeNi) alloy, an Iron-Boron (FeB) alloy, a multilayer of Cobalt-Platinum (CoPt) and Cobalt Paradium (CoPd), a Heusler Alloy selected from Cobalt-Manganese-Silicon (CoMnSi), Cobalt-Manganese-Germanium (CoMnGe), Cobalt-Manganese-Aluminum (CoMnAl), Cobalt-Manganese-Iron-Silicon (CoMnFeSi), Cobalt-Iron-Silicon (CoFeSi), Cobalt-Iron-Aluminium (CoFeAl), Cobalt-Chromium-Iron-Aluminum (CoCrFeAl), Cobalt-Iron-Aluminum-Silicon (CoFeAlSi), or compounds thereof, with a thickness of approximately 1-20 nm, preferably 1 to 10 nm, more preferably 1 to 5 nm, The annular tunnel insulator layer 1635 can include one or more layers of Magnesium Oxide (MgO), Silicon Oxide (SiOx), Aluminum Oxide (AlOx), Titanium Oxide (TiOx), or combination of these oxide materials with a thickness of approximately 0.1-3 nm. The annular free magnetic layers 1605-1615 can include one or more layers of a Cobalt-Iron-Boron (Co—Fe—B), Cobalt Nickle Iron (CoNiFe), Nickle Iron (NiFe) alloy or their multilayer combinations with a thickness of approximately 0.5-5 nm. The non-magnetic separator layers 1625, 1630 can include an oxide alloy of Cobalt-Iron-Boron (Co—Fe—B), CoNiFe, NiFe or their multilayer combinations that also includes a non-magnetic material such as Copper (Cu), Aluminum (Al), and Ruthenium (Ru), Gallium (Ga), or Silicon (Si). The optional annular non-magnetic layer can include one or more layers of metal protecting layers that can include one or more elements of a Tantalum (Ta), Chromium (Cr), W, V, Pt, Ru, Pd, Cu, Ag, Rh or their alloy, with a thickness of approximately 1 to 10 nm. The annular conductive layer 1620 can include one or more layers of Copper (Cu), Aluminum (Al), Ruthenium (Ru), and/or one or more alloys thereof with a thickness of approximately 5-20 nm. The non-magnetic insulator layers 1645, 1650, 1660, 1665, 1680, 1685 can include one or more layers of MgO, SiOx AlOx. are alloys thereof with a thickness of the first and second additional layers in the range of 5 to 20 nm, preferably 5 to 10 nm. The optional, non-magnetic metal layers 1670 can include Nitrogen (N), Hydrogen (H), and Boron (B).

Each portion of the annular structure 1605-1635 including an annular free magnetic layer and corresponding portions of a planar reference magnetic layer and non-magnetic insulator layers aligned with the annular free magnetic layer can comprise a MTJ cell. In aspects, the magnetic field of the planar reference magnetic layers 1640, 1655, 1675 can have a fixed polarization substantially perpendicular to a major planar orientation of the planar reference magnetic layers

1640, 1655, 1675. The magnetic field of the annular free magnetic layers 1605, 1610, 1615 can have a polarization substantially perpendicular to the major planar orientation of the planar reference magnetic layers 1640, 1655, 1675 and selectively switchable between being substantially parallel and substantially antiparallel to the magnetic field of the planar reference layers 1640, 1655, 1675. In one implementation, the magnetic field of the annular free magnetic layers 1605, 1610, 1615 can be configured to switch to being substantially parallel to the magnetic field of the planar reference layers 1640, 1655, 1675 in response to a current flow in a first direction through the conductive annular layer 1620 and to switch to being substantially anti-parallel to the magnetic field of the planar reference layers 1640, 1655, 1675 in response to a current flow in a second direction through the conductive annular layer 1620.

The MTJ cells of a plurality of annular structures 1605-1635 can be arranged in cell columns and cell rows in a plurality of cell levels of a memory device similar to as described above in FIGS. 13 and 14. The memory device can also include a plurality of bit lines, a plurality of source lines, a plurality of word lines and a plurality of select transistors. The plurality of bit lines can be coupled to respective planar reference magnetic layers 1640, 1655, 1675. The annular conductive layer of each annular structure can comprise a portion of a respective source line. The MTJ cells arranged along an annular structure can be coupled to a corresponding select transistor 1460 to a respective source line 1435. The MTJ cells arranged along a second annular structure in the same column can be coupled by another corresponding select transistor 1465 to the same respective source line 1435. The gate of the select transistors 1460, 1465 can be coupled to a respective word line 1450, 1455. The memory device can also include a plurality of insulator regions disposed in the plurality of planar reference magnetic layers 1640, 1655, 1675 between respective pairs of columns of the plurality of annular structures 1605-1635 similar to as described above with reference to FIGS. 6 and 7. The memory device can further include a plurality of memory cell array blocks similar to as described above with reference to FIGS. 7 and 8.

Referring now to FIGS. 17A and 17B, a memory device, in accordance with aspect of the present technology, is shown. FIGS. 17A and 17B show a top view and a right-side view of the memory device shown in FIG. 13. The memory device can include an array of MTJ cells arranged in cell columns and cell rows in a plurality of cell levels. The MTJ cells in a given corresponding cell column position and cell row position in the plurality of cell levels can be coupled together in a cell string as described above with reference to FIGS. 10-12. Alternatively, the MTJ cells can be arranged in cell columns and cell rows in a plurality of levels, wherein the MTJ cells in corresponding cell columns and cell row positions in the plurality of cell levels are coupled together in cell strings as described above with reference to FIG. 16.

In one implementation, the MTJ cells in a first level can include a first plurality of annular structures 1310-1330 arranged in columns and rows. Each annular structure can include an annular non-magnetic layer disposed about an annular conductive layer, an annular free magnetic layer disposed about the annular non-magnetic layer, and an annular tunnel insulator disposed about the annular free magnetic layer. A first planar reference magnetic layer 1335 can be disposed about the first plurality of annular structures 1310-1330 and can be separated from the free magnetic layers of the first plurality of annular structures 1310-1330 by the annular tunnel barrier layers of the first plurality of annular structures 1310-1330. A first non-magnetic insulator layer 1340 can be disposed about the first plurality of annular structures 1310-1330 and on a first side of the first planar reference magnetic layer 1335. A second non-magnetic insulator layer 1345 can be disposed about the first plurality of annular structures 1310-1330 and on a second side of the first planar reference magnetic layer 1335.

The MTJ cells in a second level can include a second plurality of annular structures axially aligned with respective ones the first plurality of annular structures 1310-1330. A second planar reference magnetic layer 1355 can be disposed about the second plurality of annular structures and can be separated from the free magnetic layer of the second plurality of annular structures by the annular tunnel barrier layers of the second plurality of annular structures. A third non-magnetic insulator layer 1360 can be disposed about the second plurality of annular structures and between the second non-magnetic insulator layer 1345 and a first side of the second planar reference magnetic layer 1355. A fourth non-magnetic insulator layer 1365 can be disposed about the second plurality of annular structures and on a second side of the second planar reference magnetic layer 1355.

The multiple levels of MTJ cell array can be disposed on one or more additional layers 1710 that can include word lines, source lines, select elements, and or the like. The memory device can optionally include a non-magnetic metal layer disposed between adjacent levels 1305, 1350, as described above with reference to FIG. 11. Alternatively, the memory device can optionally include a non-magnetic insulator layer and a non-magnetic metal plug disposed between adjacent levels 1305, 1355, as described above with reference to FIG. 12. The memory device can also optionally include a plurality of insulator regions disposed between portions of the planar reference magnetic layers along columns of the annular structures, as described above with reference to FIG. 6.

In another implementation, one annular structures can include a plurality of annular free magnetic layers disposed about the annular non-magnetic layer. The plurality of annular free magnetic layers can be separated from each other by non-magnetic separator layers. The one or more annular structures can further include an annular tunnel Sculptor disposed about the plurality of annular free magnetic layers and the one or more non-magnetic separator layers. The one or more annular structures can optionally include an annular non-magnetic layer (not shown) disposed between the annular conductive layer and the combination of the plurality of annular tree magnetic layers and one or more a non-magnetic separator layers.

A first planar reference magnetic layer can be disposed about the one or more annular structures. The first planar reference magnetic layer can be separated from the free magnetic layers of the annular structures by the annular tunnel barrier layer. The first planar reference magnetic layer con be aligned with a first annular from magnetic layer. A first non-magnetic insulator layer can be disposed about the one or more annular structures and on a first side of the first planar reference magnetic layer. A second non-magnetic insulator layer can be disposed about the one or more annular structures and concept as second side of the first planar reference magnetic layer. A second planar reference magnetic layer can be disposed about the one or more annular structures. The second planar reference magnetic layer can be separated from the free magnetic layers by the annular tunnel barrier layer. The second planar reference magnetic layer can be aligned with a second annular free magnetic layer. A third non-magnetic insulator layer can be disposed about the one or more annular structures and on a first side of the second planar reference magnetic layer. A fourth non-magnetic insulator layer can be disposed about the one or more annular structures and on a second side of the second planar reference magnetic layer. An optional non-magnetic metal layer can be disposed between the second non-magnetic insulator layer and the third non-magnetic insulator layer.

Each portion of the annular structure including an annular free magnetic layer and corresponding portions of a planar reference magnetic layer and non-magnetic insulator layers aligned with the annular free magnetic layer can comprise a MTJ cell, as described above with reference to FIG. 16. The memory device can also optionally include a plurality of insulator regions disposed between portions of the planar reference magnetic layers along columns of the annular structures, as described above with reference to FIG. 6.

The memory device can also include a plurality of bit lines 1370, 1375 disposed on and electrically coupled to respective planar reference magnetic layers 1335, 13550. For example, a first bit line 1370 can be disposed on and coupled to a first planar reference magnetic layer 1335, and a second bit line 1375 can be disposed on and coupled to a second planar reference magnetic layer 1355. In aspect, the plurality of bit lines 1370, 1375 can be disposed at a periphery of the plurality of planar reference magnetic layers 1335, 1375.

Figure 9:
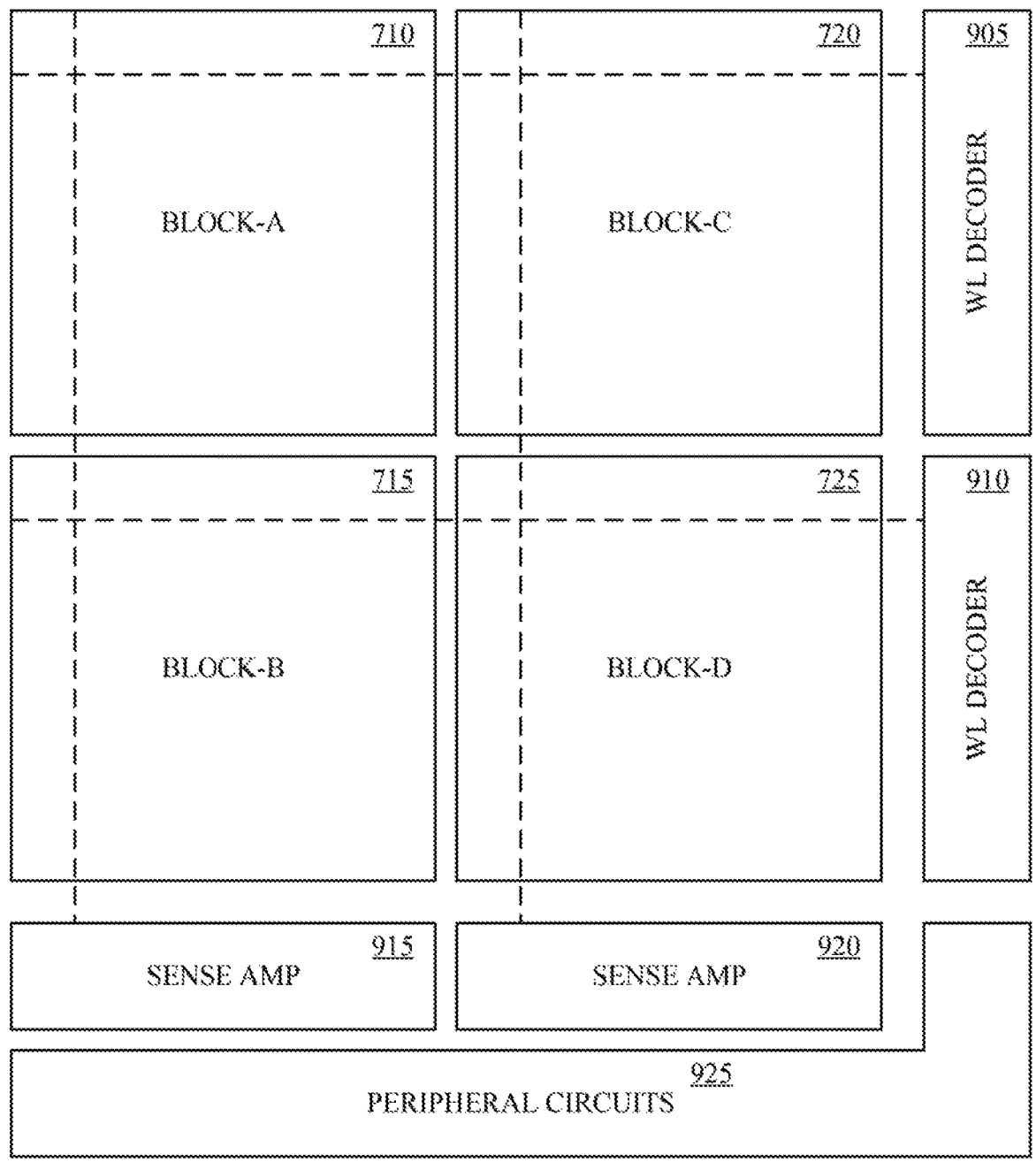
FIG. 9 shows a memory device. In accordance aspects of the present technology.

The memory device, can optionally include a plurality of memory cell array blocks, as described above with reference to FIGS. 7-9. The same planar reference layer arranged in respective rows of the memory cell array blocks can be coupled together by a respective bit line. For example, the first bit line 1370 can be electrically coupled to the first planar reference magnetic layer 1335 of each block in a respective row, of the memory cell array blocks. The second bit line 1375 can be electrically coupled to the second planar reference magnetic layer 1355 of each block in a respective row of the memory cell array blocks. In addition, two or more hit lines arranged in respective columns of the memory cell array blocks can be coupled together by a corresponding global bit line 1720. For example the first bit line 1370 can be coupled by a first global bit line 1720 to other corresponding bit lines in a respective column of the memory cell array blocks.

The device can be extended to include any number of planar reference magnetic layers disposed about the columns and rows of annular structures to implement strings or layers of any number of MTJ cells. For example, a memory device including strings or layers of three MTJ cells, in accordance with aspect of the present technology, is shown in FIGS. 18A and 18B. In one implementation, the MTJ cells in corresponding cell column and cell row positions in a plurality of cell levels can be coupled together in cell strings. Each MTJ cell can include an annular structure 1810, 1815 that includes an annular non-magnetic layer disposed about the annular non-magnetic layer, and an annular tunnel insulator disposed about the annular free magnetic layer. Portion of respective planar reference magnetic layers 1820, 1825, 1830 can be disposed about the annular structures 1810, 1815. Respective planar non-magnetic insulator layers 1835, 1840, 1845 can be disposed on a first side of the planar reference magnetic layers 1820, 1825, 1830 and about the annular structures 1810, 1815. Respective planar non-magnetic insulator layers 1850, 1855, 1860 can also be disposed on a second side of the planar reference magnetic layers 1820-1830 and about the annular structures 1810, 1815. The array of MTJ cells can also include a plurality of bit lines 1865, 1870, 1875 and a plurality of select elements. Respective bit lines 1865, 1870, 1875 can be disposed on and electrically coupled to respective planar magnetic layers 1820. 1825, 1830 of respective cell levels. For example, a first bit line 1865 can be disposed on and electrically coupled to a first planar reference magnetic layer 1820, a second hit line 1870 can be disposed on and electrically coupled to a second planar reference magnetic layer 1825, and a third bit line 1875 can be disposed on and electrically coupled to a third planar reference magnetic layer 1830 of each block in a respective row of memory call array blocks. In addition, two or more bit lines arranged in respective columns of the memory cell array blocks can be coupled together by a corresponding global bit line 1880, 1885, 1890 as described above with reference to FIGS, 8 and 9. For example, the first bit line 1865 can be coupled by a first global bit line 1880 to other corresponding bit lines in a respective column of the memory cell array blocks. The second bit line 1870 can be coupled by a via 1892 to a second global bit line 1885 and similarly to other corresponding hit lines in a respective column of the memory cell array blocks.. The third bit line 1875 can be coupled by a via 1894 to a third global bit line 1890 and similarly to other corresponding bit lines in a respective column of the memory cell array blocks.

In another implementation, the MTJ cells in each cell string can include an annular structure 1810, 1815 that includes an annular non-magnetic layer disposed about an annular conductive layer, a plurality of annular free magnetic layers disposed about the annular non-magnetic layer, the annular free magnetic layer separated front each other by corresponding ones of a plurality of non-magnetic separator layers, and an annular tunnel insulator disposed about the annular free magnetic layer. A portion of corresponding ones of planar reference magnetic layers 1820, 1825, 1830 can be disposed about the annular structures 1810, 1815 and aligned with corresponding ones of the plurality of portions of the free magnetic layer. Planar non-magnetic insulator layers 1835, 1840, 1845 can be disposed on a first side of each of the plurality of planar reference magnetic layers 1820, 1825, 1830 and about the annular structure 1810, 18150. Other planar non-magnetic insulator layers 1850, 1855, 1860 can be disposed on a second side of each of the plurality of planar reference magnetic layers 1820, 1825, 1830 and about the annular structure 1810, 1815. The array of MTJ cells can also include a plurality of bit lines 1865, 1870, 1875 and a plurality of select elements. Respective bit lines 1865, 1870, 1875 can be disposed on and electrically coupled to respective planar magnetic layers 1820, 1825, 1830 of respective cell levels. Again, for example, a first bit line 1865 can be disposed on and electrically coupled to a first planar reference at layer 1820, a second bit line 1870 can be disposed on and electrically coupled to a second planar reference magnetic layer 1825, and a third bit line 1875 can be disposed cm and electrically coupled to a third planar reference magnetic layer 1830 of each block in a respective row of memory cell array blocks. In addition, two or more bit lines arranged in respective columns of the memory cell array blocks can be coupled together by a corresponding global bit line 1880, 1885, 1890 as described above with reference to FIGS, 8 and 9. For example, the first bit line 1865 can be coupled by a first global bit line 1880 to other corresponding bit lines in a respective column of the memory cell array blocks. The second bit line 1870 can be coupled by a via 1892 to a second global bit line 1885 and similarly to other corresponding bit times in a respective column of the memory cell array blocks. The third bit line 1875 can be coupled by a via 1894 to a third global bit line

1890 and similarly to other corresponding bit lines in a respective column of the memory cell array blocks.

Figure 20A:
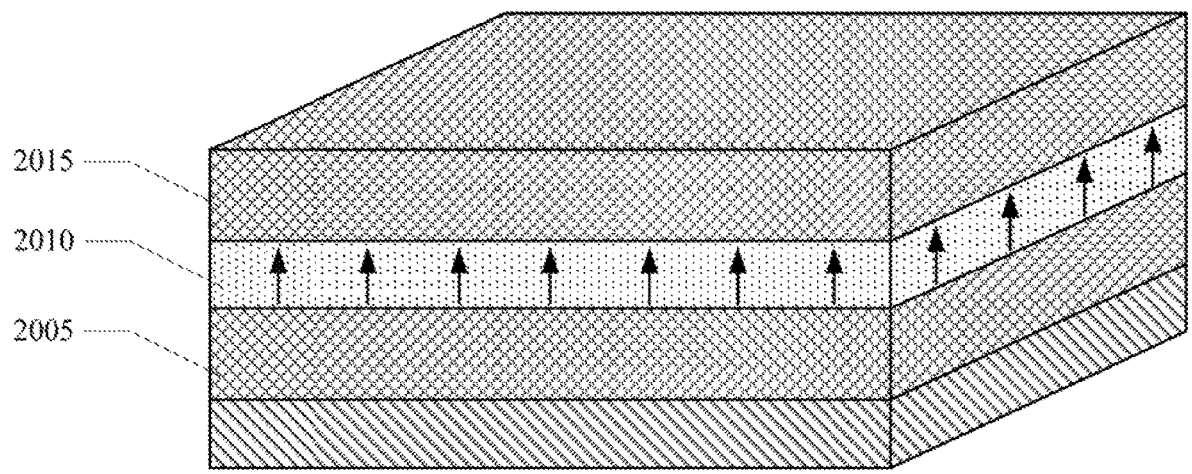

Referring now to FIGS. 19A-19B, a method of fabricating a Magnetic Tunnel Junction (MTJ) in accordance aspects of the present technology, is shown. The method of fabrication can include forming one or more planar non-magnetic insulator layers, at 1905. In one implementation, one or more layers of Magnesium Oxide (MgO), Silicon Oxide (SiOx), Aluminum Oxide (AlOx) or alloys thereof can be deposited on a substrate or other integrated circuit layer. At 1910, one or more planar reference magnetic layers can be deposited on the one or more planar non-magnetic insulator layers. In one implementation, one or more layers Cobalt-Iron-Boron (Co—Fe—B) alloy, a Cobalt-Iron (CoFe) alloy, a Cobalt-Iron-Nickle (CoFeNi) alloy, an Iron-Nickle (FeNi) alloy, an Iron-Boron (FeB) alloy, a multilayer of Cobalt-Platinum (CoPt) and Cobalt Paradium (CoPd), a Heusler Alloy selected from Cobalt-Manganese-Silicon (CoMnSi), Cobalt-Manganese-Germanium (CoMnGe), Cobalt-Manganese-Aluminum (CoMnAl), Cobalt-Manganese-Iron-Silicon (CoMnFeSi). Cobalt-Iron-Silicon (CoFeSi), Cobalt-Iron-Aluminum (CoFeAl), Cobalt-Chromium-Iron-Aluminum (CoCrFeAl), Cobalt-Iron-Aluminum-Silicon (CoFeAl), or compounds thereof can be deposited on the one or more planar non-magnetic insulator layers. At 1915, one or more planar non-magnetic insulator layers can be deposited on the one or more planar reference magnetic layers. In one implementation, one or more layers of MgO, SiOx, AlOx or alloys thereof can be deposited on the one or more planar reference magnetic layers. Accordingly, one or more planar non-magnetic insulator layers 2005 can be disposed on a first side of the one or more planar reference magnetic layer 2010, and one or more other planar non-magnetic insulator layers 2015 can be disposed on a second side of the one or more planar reference magnetic layers 2010 as illustrated in FIG. 20A. The magnetic field of the planar reference magnetic layer 2010 can have, a fixed polarization substantially perpendicular to a major planar orientation of the planar reference magnetic layer 2010.

Figure 20B:
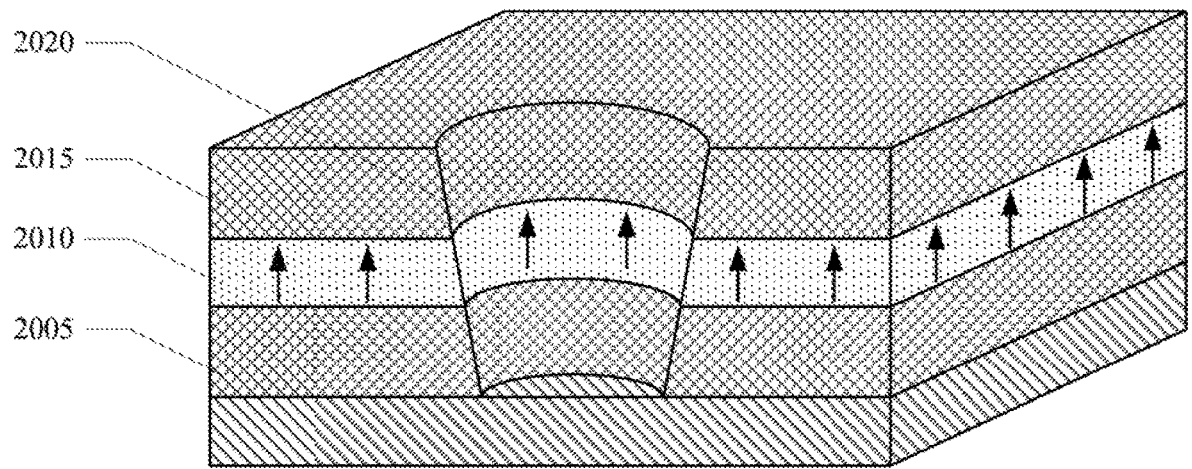

At 1920, one or more annular openings can be formed through the planar non-magnetic insulator layers and the planar reference magnetic layer. The annular openings 2020 can be substantially cylindrical with tapered sidewalls, as illustrated in FIG. 20B. The annular openings can have a taper of approximately 10-45 degrees from a first side of the planar reference magnetic layer to a second side of the planar reference magnetic layer. In another expression, the wall angle measured from the normal axis to the horizontal direction of the planar reference magnetic layer can be approximately 10-45 degrees.

Figure 20C:
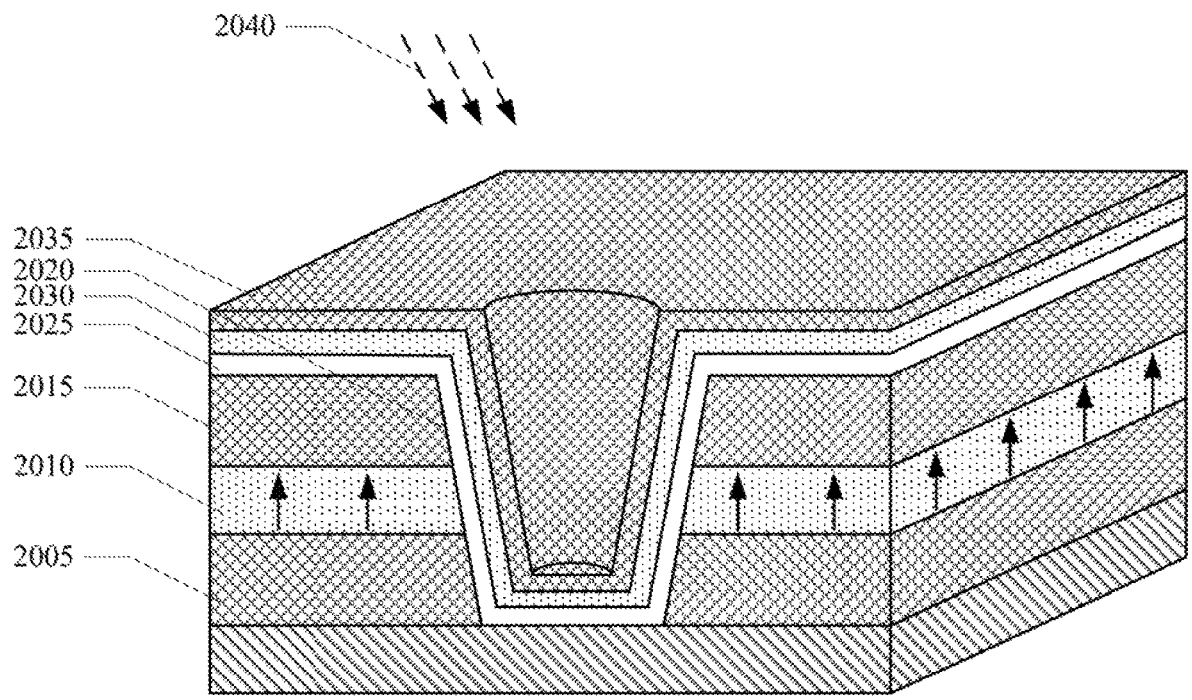
Figure 20D:
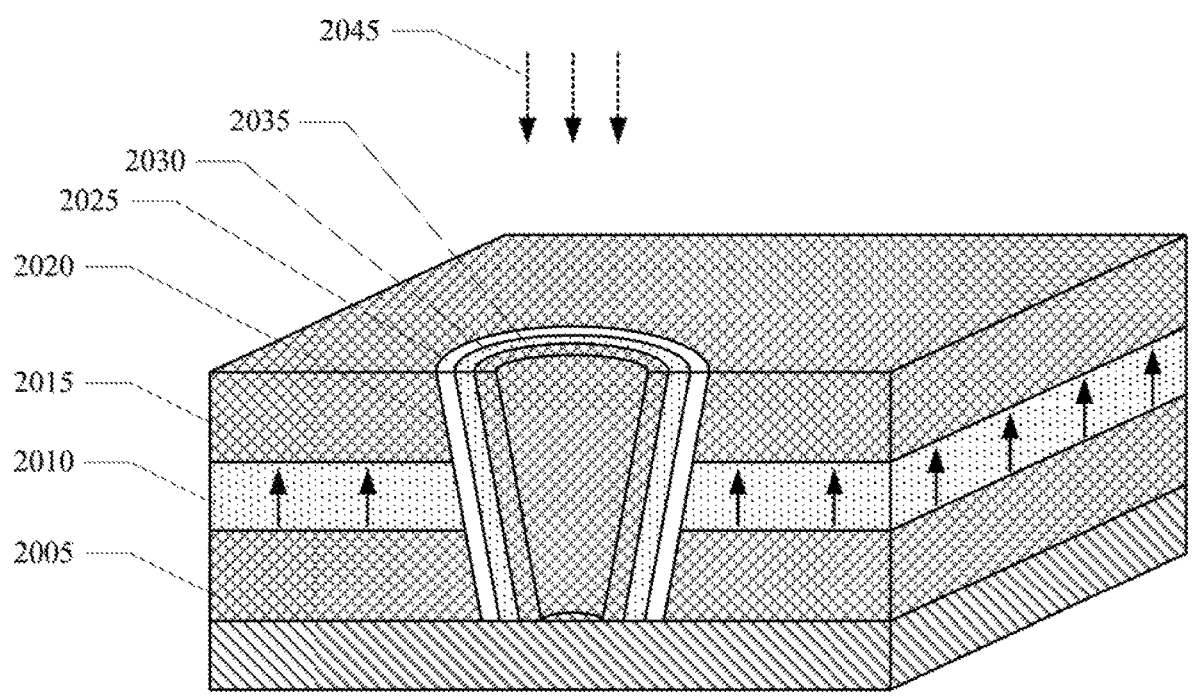

At 1925, an annular tunnel insulator can be formed on the walls of the one or more annular openings. At 1930, an annular free magnetic layer can be formed on the annular tunnel insulator inside the one or more annular openings. At 1935, an annular non-magnetic layer can be formed on the annular free magnetic layer inside the one or more annular openings. In one implementation, an annular tunnel insulator layer 2025 can be deposited on the surface of the planar non-magnetic insulator layer 2015 and the sidewalls the one or more annular openings 2020, as illustrated in FIG. 20C. The annular tunnel insulator layer can include one or more layers of a Magnesium Oxide (MgO), Silicon Oxide (SiOx), Aluminum Oxide (AlOx), Titanium Oxide (TiOx) or a combination of these oxide materials. An annular free magnetic layer 2030 can be deposited on the surface of the annular tunnel insulator layer 2025 inside and outside the one or more annular openings 2020. The annular free magnetic layer can include one or more layers of a Cobalt-Iron-Boron (Co—Fe—B), Cobalt-Nickle-Iron (CoNiFe), Nickle-Iron (NiFe) alloy or their multilayer combinations. The magnetic field of the annular free magnetic layer can have a polarization substantially perpendicular to the major planar orientation of the planar reference magnetic layer and selectively switchable between being substantially parallel and substantially antiparallel to the magnetic field of the planar reference layer. An annular non-magnetic layer 2035 can be deposited on the surface of the annular free magnetic layer 2030 inside outside of the one or more annular openings 2020. The annular non-magnetic layer can include one or more layers of that can include one or more elements of a Tantalum (Ta), Chromium (Cr) W, V, Pt, Ru, Pd Cu, Ag, Rh, or their alloy. The materials of the annular tunnel insulator 2025, the annular free magnetic layer 2030 and the annular non-magnetic layer 2035 can be deposited by an angular deposition process 2040 to improve deposition in the annular openings, as illustrated in FIG. 20C. The portions of the annular tunnel insulator layer 2025, the annular free magnetic layer 2030 and the annular non-magnetic layer 2035 at the bottom of the one or more annular openings 2020 and on top of the planar non-magnetic insular layer 2015 can be removed by one or more selective etching, milling or the like processes 2045, as illustrated in FIG. 20D. Alternatively, the portions of the annular tunnel insulator layer, the annular free magnetic layer and the annular non-magnetic layer at bottom of the one or more annular openings and on top of the planar non-magnetic insular layers can be removed by successive etching, milling or the like processes before the subsequent layer is deposited.

Figure 20E:
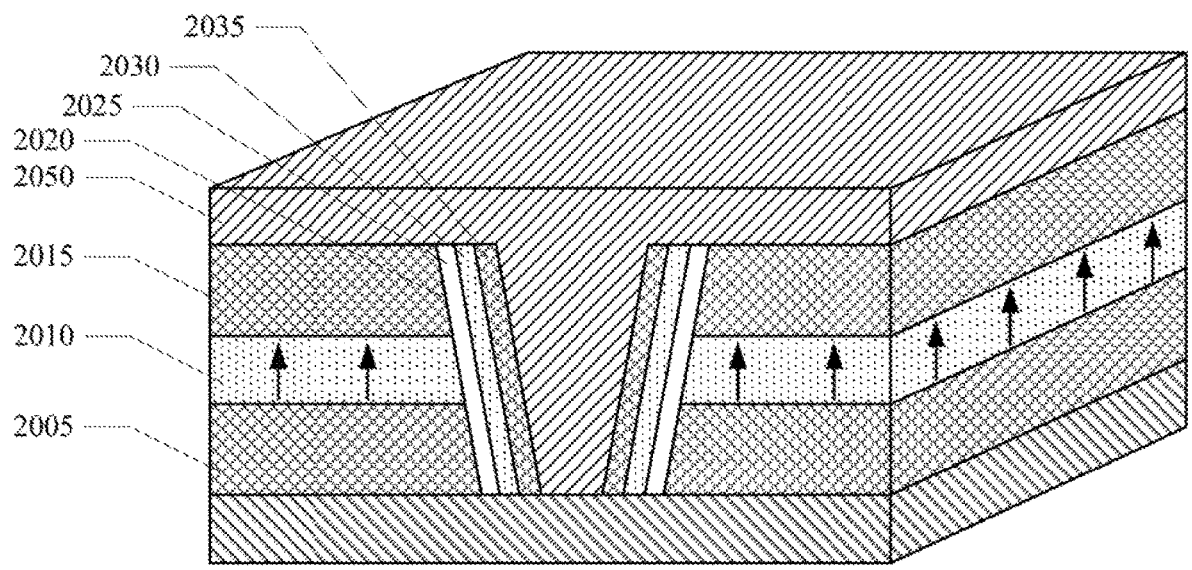
Figure 20F:
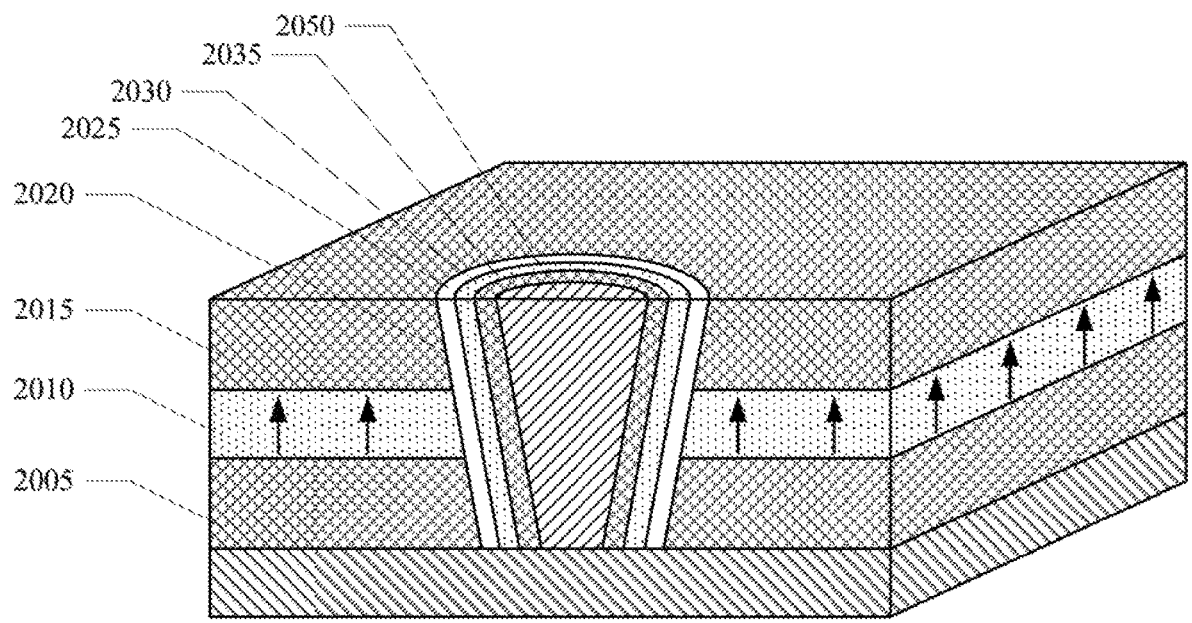

At 1940, an annular conductive core can be formed inside the annular non-magnetic layers in the one or more annular openings. In one implementation, an annular conductive core layer 2040 can be deposited on the surface of the annular magnetic layer 2015 inside and outside of the one or, more annular openings 2020, as illustrated in FIG. 20E. The annular conductive core can include one or more layers of Copper (Cu), Aluminum (Al), Ruthenium (Ru), and/or one or more alloys thereof. Excess material of the annular conductive core layer 2050 can be removed by Chemical Mechanical Polishing (CMP) or other similar process to form annular conductive cores 2050 in the one or more annular openings 2020, as illustrated in FIG. 20F. The processes of 1905 through 1940 can optionally be repeated a plurality of times to form a string of MTJ as illustrated in FIG. 10.

Referring now to FIGS. 21A-21C, a method of fabricating a memory cell array, in accordance with aspects of the present technology, is shown. The method of fabrication can include forming an array of selectors on a substrate, at 2105. There a numerous selectors and methods of fabrication that can be utilized for the array of selectors. The specific selector and processes are not germane to an understanding of aspects of the present technology and therefore will not be described in further detail.

At 2010, a plurality of word lines can be formed on a substrate and coupled to the selectors in respective rows. In one implementation, a conductive layer can be deposited on a substrate. A word line pattern mask can be formed on the conductive layer and a selective etching process can be performed to remove the portions of the conductive layer exposed by the word line pattern mask to form the plurality of word lines coupled to the selectors. In another embodiment, a word line can be formed by electro-plating on to the framed photo-resist pattern that has a vacancy for word line portions. The word lines can be disposed as a plurality of substantially parallel traces in a first direction (e.g., rows) of the substrate. There are numerous conductive materials that can be utilized for the word lines, and there are numerous deposition, masking, etching, photoresist-framing, and electro-plating process that can be utilized for forming the plurality of word lines. The specific materials and processes are not germane to an understanding of aspects of the present technology and therefore will not be described in further detail.

At 2115, a plurality of source lines can be formed on the substrate and coupled to the selectors in respective columns. In one implementation, an insulator layer can be formed over the plurality of word lines, and a second conductive layer can be deposited over the insulator layer. A source line pattern mask can be formed on the second conductive layer and a selective etching process can be performed to remove the portions of the second conductive layer exposed by the word line pattern mask to form the plurality of source lines. The source lines can be disposed as a plurality of substantially parallel traces in a second direction (e.g., columns) on the substrate that is perpendicular to the first direction of the word lines. There are numerous conductive materials that can be utilized for the source lines, and there are numerous deposition, masking, etching, photoresist-framing, and electro-plating process that can be utilized for forming the plurality of source lines. The specific materials and processes are not germane to an understanding of aspects of the present technology and therefore will not be described in further detail.

At 2120, one or more planar non-magnetic insulator layers can be deposited on the plurality of selectors. In one implementation, one or more layers of Magnesium Oxide (MgO), Silicon Oxide (SiOx), Aluminum Oxide (AlOx) or alloys thereof can be deposited on the plurality of selectors. At 2425, one or more planar reference magnetic layers can be deposited on the one or more planar non-magnetic insulator layers. In one implementation, one or more layers Cobalt-Iron-Boron (Co—Fe—B) alloy, a Cobalt-Iron (CoFe) alloy, a Cobalt-Iron-Nickle (CoFeNi) alloy, an Iron-Nickle (FeNi) alloy, an Iron-Boron (FeB) alloy, a multilayer of Cobalt-Platinum (CoPt) and Cobalt Paradium (CoPd), at Heusler Alloy selected from Cobalt-Manganese-Silicon (CoMnSi), Cobalt-Manganese-Germanium (CoMnGe), Cobalt-Manganese-Aluminum (CoMnAl), Cobalt-Manganese-Iron-Silicon (CoMnFeSi), Cobalt-Iron-Silicon (CoFeSi), Cobalt-Iron-Aluminum (CoFeAl), Cobalt-Chromium-Iron-Aluminum (CoCrFeAl), Cobalt-Iron-Aluminum-Silicon (CoFeAlSi)., or compounds thereof can be deposited on the one or more planar non-magnetic insulator layers. At 2130, one or more planar non-magnetic insulator layers can be deposited on the one or more planar reference magnetic layers. In one implementation, one or more layers of MgO, SiOx, AlOx or alloys thereof can be deposited on the one or more planar reference magnetic layers. Accordingly, one or more planar non-magnetic insulator layers 2005 can be disposed on a first side of the one or more planar reference magnetic layer 2010, and one or more other planar non-magnetic insulator layers 2015 can be disposed on a second side of the one or more planar reference magnetic layers 2010 as illustrated in FIG. 20A. The magnetic field of the planar reference magnetic layer 2010 can have a fixed polarization substantially perpendicular to a major planar orientation of the planar reference magnetic layer 2010.

At 2135, an array of annular openings can be formed through the planar non-magnetic insulator layers and the planar reference magnetic layer. The array of annular openings can be aligned with the array of selectors. The annular openings 2020 can be substantially cylindrical with tapered sidewalls, as illustrated in FIG. 20B. The annular openings can have a taper of approximately 10-45 degrees from a first side of the planar reference magnetic layer to a second side of the planar reference magnetic layer. In another expression, the wall angle measured from the normal axis to the horizontal direction of the planar reference magnetic layer can be approximately 10-45 degrees.

At 2140, an annular tunnel insulator can be formed on the walls of the array of annular openings. At 2145, an annular free magnetic layer can be formed on the annular tunnel insulator inside the array of annular openings. At 2150, an annular non-magnetic layer can be formed on the annular free magnetic layer inside the array of annular openings. In one implementation, an annular tunnel insulator layer 2025 can be deposited on the surface of the planar non-magnetic insulator layer 2015 and the sidewalk of the array of annular openings 2020, as illustrated in FIG. 20C. The annular tunnel insulator layer can include one or more layers of a Magnesium Oxide (MgO), Silicon Oxide (SiOx), Aluminum Oxide (AlOx), Titanium Oxide (TiOx) or a combination of these oxide materials. An annular free magnetic layer 2050 can be deposited on the surface of the annular tunnel insulator layer 2025 inside and outside the array of annular openings 2020. The annular free magnetic layer include one or more layers of a Cobalt-Iron-Boron (Co—Fe—B), Cobalt-Nickle-Iron (CoNiFe), Nickle-Iron(NiFe) alloy or their multilayer combinations. The magnetic field of the annular free magnetic layer can have a polarization substantially perpendicular to the major planar orientation of the planar reference magnetic layer and selectively switchable between being substantially parallel and substantially anti-parallel to the magnetic field of the planar reference layer. An annular non-magnetic layer 2035 can be deposited on the surface of the annular free magnetic layer 2030 inside and outside of the array of annular openings 2020. The annular non-magnetic layer can include one or more layers of that can include one or more elements of a Tantalum (Ta), Chromium (Cr), W, V, Pt, Ru Pd, Cu, Ag, Rh, or their alloy. The materials of the annular tunnel it insulator 2025, the annular free magnetic layer 2030 and the annular non-magnetic layer 20 can be deposited by an angular deposition process 2040 to improve deposition in the annular openings, as illustrated in FIG. 20C. The portions of the annular tunnel insulator layer 2025, the annular free magnetic layer 2030 and the annular non-magnetic layer 2035 at the bottom of the array of annular openings 2020 and on top of the planar non-magnetic insular layer 2015 can be removed by one or more selective etching, milling or the like processes 2045, as illustrated in FIG. 20D. Alternatively, the portions of the annular tunnel insulator layer, the annular free magnetic layer and the annular non-magnetic layer at the bottom of the array of annular openings and on top of the planar non-magnetic insular layers can be removed by successive etching, milling or the like processes before the subsequent layer is deposited.

At 2155, an annular conductive core can be formed inside the annular non-magnetic layers in the array of annular openings. The annular conductive cores in the array of annular openings can be coupled to a corresponding select transistor. In one implementation, an annular conductive core layer 2050 can be deposited on the surface of the lar magnetic layer 2015 inside and outside of the array of annular openings 2020, as illustrated in FIG. 20E. The annular conductive core can include one or more layers of Copper (Cu), Aluminum (Al), Ruthenium (Ru), and/or one or more alloys thereof. Excess material of the annular conductive core layer 2050 can be removed by Chemical Mechanical Polishing (CMP) or other similar process to form annular conductive cores 2050 in the array of annular openings 2020, as illustrated in FIG. 20F. The processes of 2120 through 2155 can optionally be repeated a plurality of times to form a string of MTJ is as illustrated in FIG. 10.

At 2160, portions of one or more planar non-magnetic insulator layers and one or more planar reference magnetic layers can be removed in a periphery region to expose each planar reference magnetic layer. The periphery region can be outside the array of annular openings. In one implementation, a series of one or more etching, milling or the like processes can be used to step down through the planar non-magnetic insulator layers and the planar reference magnetic layers. At 2165, a bit line can be formed on each planar reference magnetic layer. In one implementation, a conductive layer can be deposited. A bit line pattern mask can be formed on the conductive layer and a selective etching process can be performed to remove the portions of the conductive layer exposed by the bit line pattern mask to form the plurality of bit lines on corresponding ones of the planar reference magnetic layers. In another implementation, a photo-resist frame is made by photo process before depositing a bit line material. The photo-resist frame has an opening to form a bit line inside. The electric-plating process is used to form a metal bit line inside the photo-resist frame. After the electrical plating process, the photo-resist frame is removed. The bit lines can be disposed as a plurality of substantially parallel traces in a first direction (e.g., rows) on respective planar reference magnetic layers, as illustrated in FIG. 13.

At 2170, one or more bit line vias can optionally be formed. The one or more bit line vias can be coupled to respective bit lines, as illustrated in FIGS. 18A and 18B. There are numerous conductive materials that can be utilized for the bit line vias, and there are numerous deposition, masking, and etching process that can be utilized for forming the plurality of bit line vias. The specific materials and processes are not germane to an understanding of aspects of the present technology and therefore will not be described in further detail.

At 2175, one or more global bit lines can be formed. The one or more global bit lines can be coupled to corresponding bit lines or bit line vias, as illustrated in FIGS. 7, 18A and 18B. In one implementation, two or more bit lines arranged in respective columns can be coupled together by a corresponding global bit line. There are numerous conductive materials that can be utilized for the global bit lines, and there are numerous deposition, masking, and etching process that can be utilized for forming the plurality of global bit lines. The specific materials and processes are not germane to an understanding of aspects of the present technology and therefore will not be described in further detail.

Referring now to FIGS. 22A-22C, a method of fabricating a memory cell array, in accordance with aspects of the present technology, is shown. The method of fabrication can include forming an array of selectors on a substrate, at 2205. There a numerous selectors and methods of fabrication that can be utilized for the array of selectors. The specific selector and processes are not germane to an understanding of aspects of the present technology and therefore will not be described in further detail.

At 2210, a plurality of word lines can be formed on the substrate and coupled to the selectors in respective rows. In one implementation, a conductive layer can be deposited on a substrate. A word line pattern mask can be formed on the conductive layer and a selective etching process can be performed to remove the portions of the conductive layer exposed by the word line pattern mask to form the plurality of word lines. In another embodiment, a word line can be formed by electro-plating to the framed photo-resist pattern that has a vacancy for word line portion. The word lines can be disposed as a plurality of substantially parallel traces in a first direction (e.g., rows) of the substrate. There are numerous conductive materials that can be utilized for the word lines, and there are numerous deposition, masking, and etching process that can be utilized for forming the plurality of word lines. The specific materials and processes are not germane to an understanding of aspects of the present technology and therefore will not be described in further detail.

At 2215, a plurality of source lines can be formed on the substrate and coupled to the selectors in respective rows. In one implementation, an insulator layer can be formed over the plurality of word lines, and a second conductive layer can be deposited over the insulator layer. A source line pattern mask can be formed on the second conductive layer a selective etching process can be performed to remove the portions of the second conductive layer exposed by the word line pattern mask to form the plurality of source lines. The source lines can be disposed as a plurality of substantially parallel traces in a second direction (e.g., columns) on the substrate that is perpendicular to the first direction of the word lines. There are numerous conductive materials that can be utilized for the source lines, and there are numerous deposition, masking, and etching process that can be utilized for forming the plurality of source lines. The specific materials and processes are not germane to an understanding of aspects of the present technology and therefore will not be described in further detail.

Figure 23A:
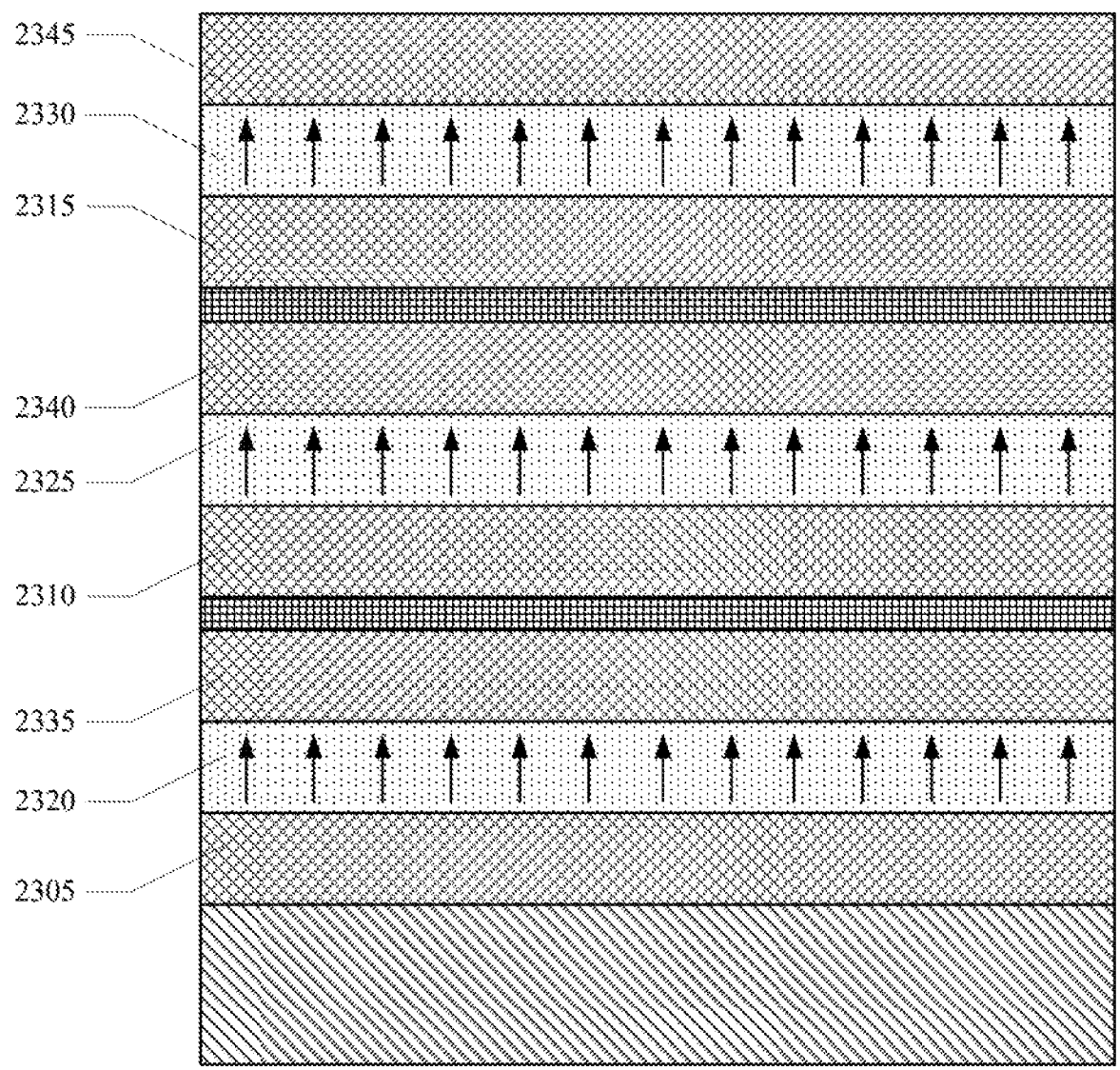

At 2220, one or more planar non-magnetic insulator layers can be deposited on the plurality of selectors. In one implementation, one or more layers of Magnesium Oxide (MgO), Silicon Oxide (SiOx), Aluminum Oxide (AlOx) or alloys thereof can be deposited on the plurality of selectors. At 2225, one or more planar reference magnetic layers can be deposited on the one or more planar non-magnetic insulator layers, in one implementation, one or more layers Cobalt-Iron-Boron (Co—Fe—B) alloy, a Cobalt-Iron (CoFe) alloy, a Cobalt-Iron-Nickle (CoFeNi) alloy, an Iron-Nickle (FeNi) alloy, an Iron-Boron (FeB) alloy, a multilayer of Cobalt-Platinum (CoPt) and Cobalt Paradium (CoPd), a Heusler Alloy selected from Cobalt-Manganese-Silicon (CoMnSi), Cobalt-Manganese-Germanium (CoMnGe), Cobalt-Manganese-Aluminum (CoMnAl), Cobalt-Manganese-Iron-Silicon (CoMnFeSi), Cobalt-Iron-Silicon (CoFeSi), Cobalt-Iron-Aluminum (CoFeAl), Cobalt-Chromium-Iron-Aluminum (CoCrFeAl), Cobalt-Iron-Aluminum-Silicon (CoFeAlSi), or compounds thereof can be deposited on the one or more planar non-magnetic insulator layers. At 2230, one or more planar non-magnetic insulator layers can be deposited on the one or more planar reference magnetic layers. In one implementation, one or more layers of MgO, SiOx, AlOx or alloys thereof can be deposited on the one or more planar reference magnetic layers. The processes of 2220 through 2230 can be repeated a plurality of times to form a string of MTJs, as illustrated in FIG. 23A. Accordingly, one or more planar non-magnetic insulator layers 2105, 2310, 2315 can be disposed on a first side of the one or more planar reference magnetic layers 2320, 2325, 2330, and one or more other planar non-magnetic insulator layers 2335, 2340, 2345 can be disposed on a second side of the one or more planar reference magnetic layers 2320, 2325, 2330, as illustrated in FIG. 23A. The magnetic field of the planar reference magnetic layer can have a fixed polarization substantially perpendicular to a major planar orientation of the planar reference magnetic layer.

Figure 23B:
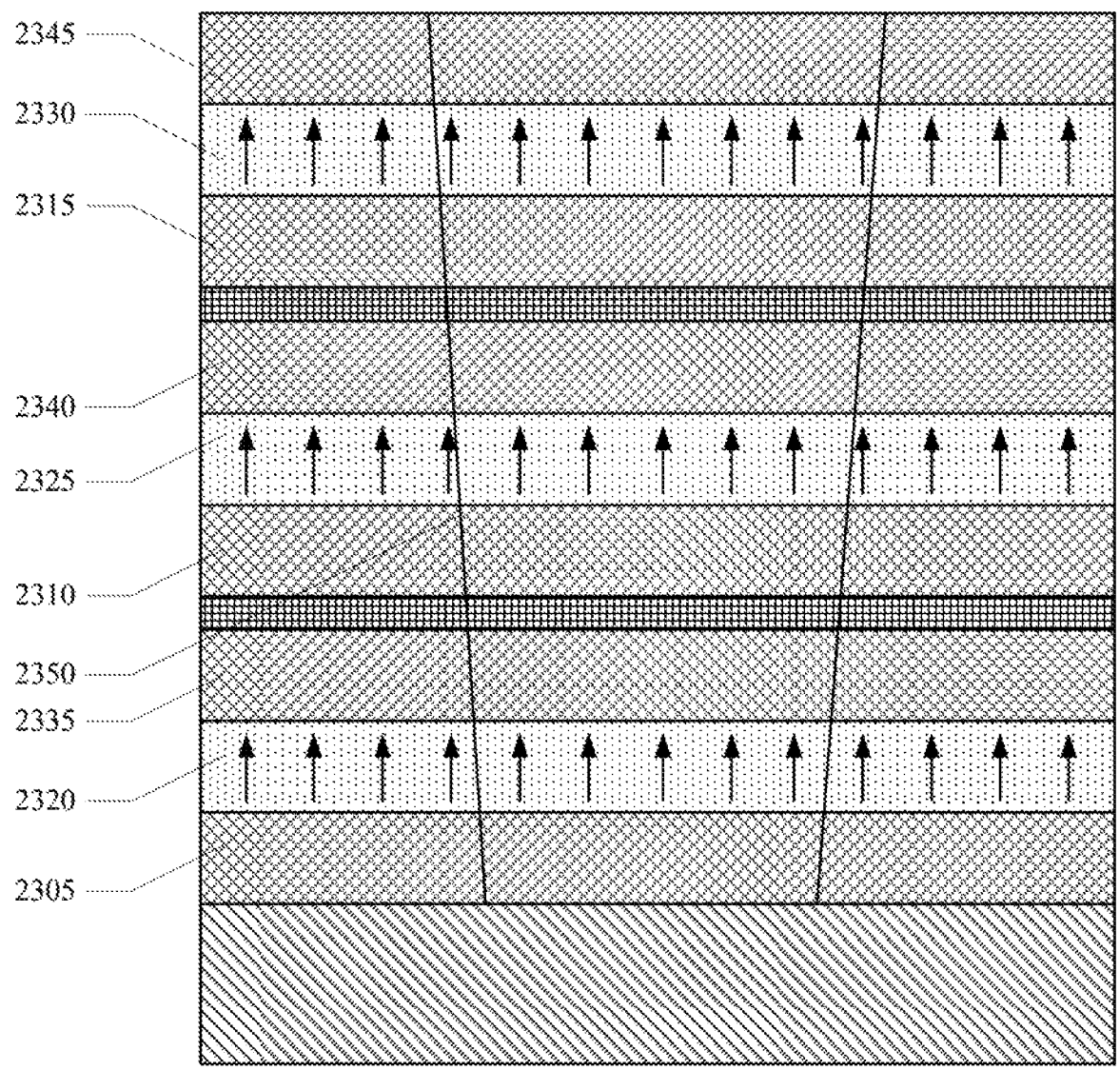

At 2235, an array of annular openings can be formed through the plurality of stacks of planar non-magnetic insulator layers and the planar reference magnetic layer. The array of annular openings can be aligned with the array of selectors. The annular openings 2350 can be substantially cylindrical with tapered sidewalk, as illustrated in FIG. 23B. The annular openings can have a taper of approximately 10-45 degrees from a first side of the planar reference magnetic layer to a second side of the planar reference magnetic layer. In another expression, the wall angle measured from the normal axis to the horizontal direction of the planar reference magnetic layer can be approximately 10-45 degrees.

Figure 23C:
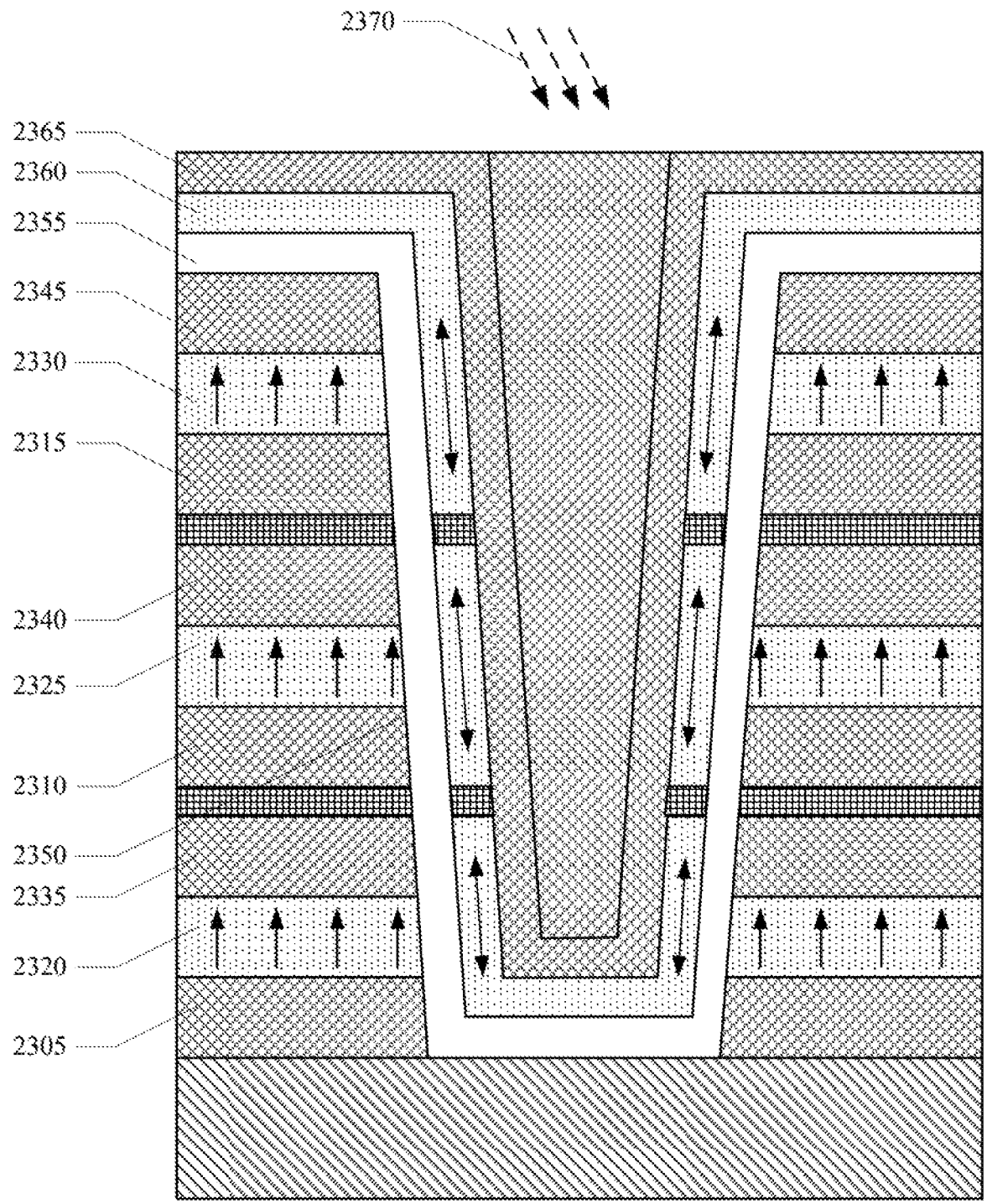
Figure 23D:
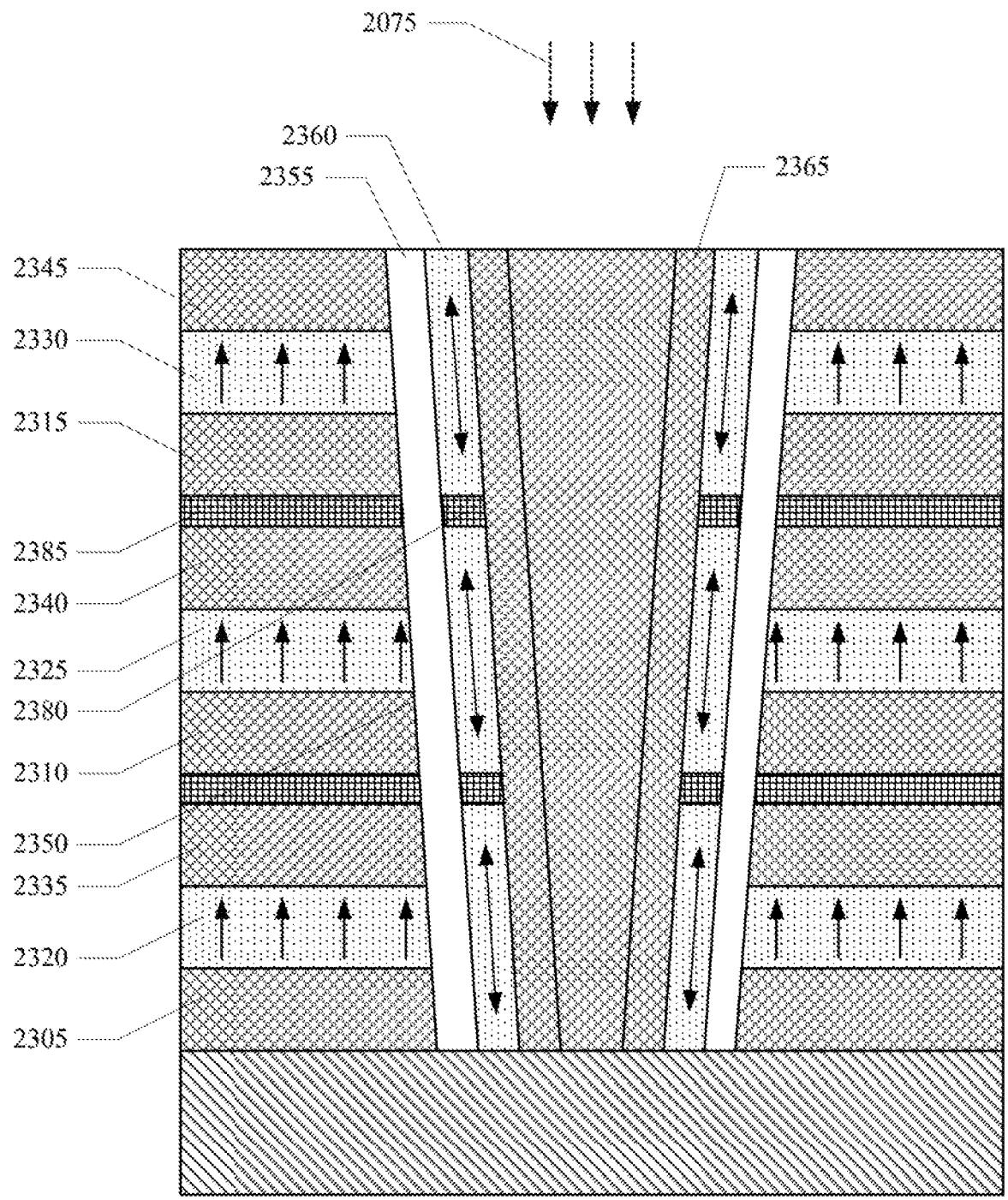

At 2240, an annular tunnel insulator can be formed on the wall of the array of annular openings. At 2245, an annular free magnetic layer can be formed on the annular tunnel insulator inside the array of annular openings. At 2250, an annular non-magnetic layer can be formed on the annular free magnetic layer inside the array of annular openings. In one implementation. an annular tunnel insulator layer 2355 can be deposited on the surface of the planar non-magnetic insulator layer 2345 and the sidewalls of the array of annular openings 2350, as illustrated in. FIG. 23C. The annular tunnel insulator layer can include one or more layers of a Magnesium Oxide (MgO), Silicon Oxide (SiOx.), Aluminum Oxide (AlOx), Titanium Oxide (TiOx) or a combination of these oxide materials. An annular free magnetic layer 2360 can be deposited on the surface of the annular tunnel insulator layer 2355 inside and outside the array of annular openings 2350. The annular free magnetic layer can include one or more layers of a Cobalt-Iron-Boron (Co—Fe—B). Cobalt-Nickle-Iron (CoNiFe), Nickle-Iron (NiFe) alloy or their multilayer combinations. An annular non-magnetic layer 2365 can be deposited on the surface of the annular free magnetic 2360 inside and outside of the array of annular openings 2350. The magnetic field of the annular free magnetic layer can have a polarization substantially perpendicular to the major planar orientation of the planar reference magnetic layer and selectively switchable between being substantially parallel and substantially antiparallel to the magnetic field of the planar reference layer. The materials of the annular tunnel insulator 2355, the annular free magnetic layer 2360 and the annular non-magnetic layer 2365 can be deposited by an angular deposition process 2370 to improve deposition in the annular openings, as illustrated in FIG. 23C. The portions of the annular tunnel insulator layer 2355, the annular free magnetic layer 2360 and the annular non-magnetic layer 2365 at the bottom of the array of annular openings 2350 and on top of the planar non-magnetic insular layer 2345 can be removed by one or more selective etching, milling or the like processes 2375, as illustrated in FIG. 23D. Alternatively, the portions of the annular tunnel insulator layer, the annular free magnetic layer and the annular non-magnetic layer at the bottom of the array of annular openings and on top of the planar non-magnetic insular layers can be removed by successive etching, milling or the like processes before the subsequent layer is deposited. At 2255, non-magnetic regions can be formed in the annular free magnetic layer to separate the annular free magnetic layer into a plurality of portions aligned with the one or more planar reference magnetic layers. In one implementation, the non-magnetic regions 2380 in the annular free magnetic layer 2360 can be formed by forming metal diffusion layers 2385 between the adjacent planar non-magnetic insulator layers 2315, 2340. Metal from the metal diffusion 2385 can diffuse into the annular free magnetic layer 2360 during one or more fabrication processes. The diffused metal in the annular free magnetic layer 2360 can form the non-magnetic regions 2380 in the annular free magnetic layer 2360 such that the resulting portions of the annular free magnetic layer 2360 are aligned with the planar reference magnetic layers 2320, 2325, 2330. In another implementation, the metal may be implanted into the annular free magnetic layer between adjacent planar non-magnetic insulator layers to form the non-magnetic regions in the annular free magnetic layer.

Figure 23E:
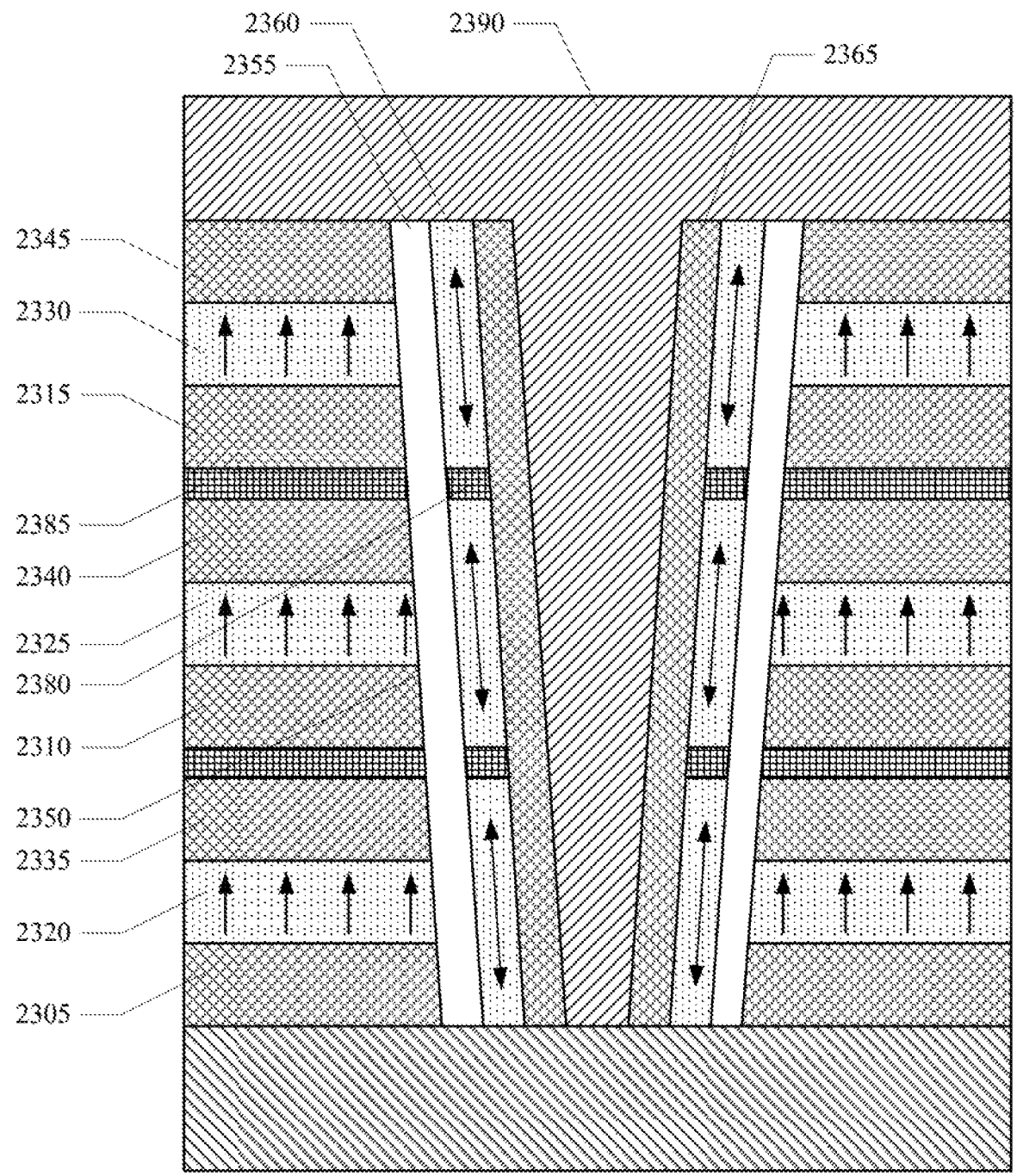
Figure 23F:
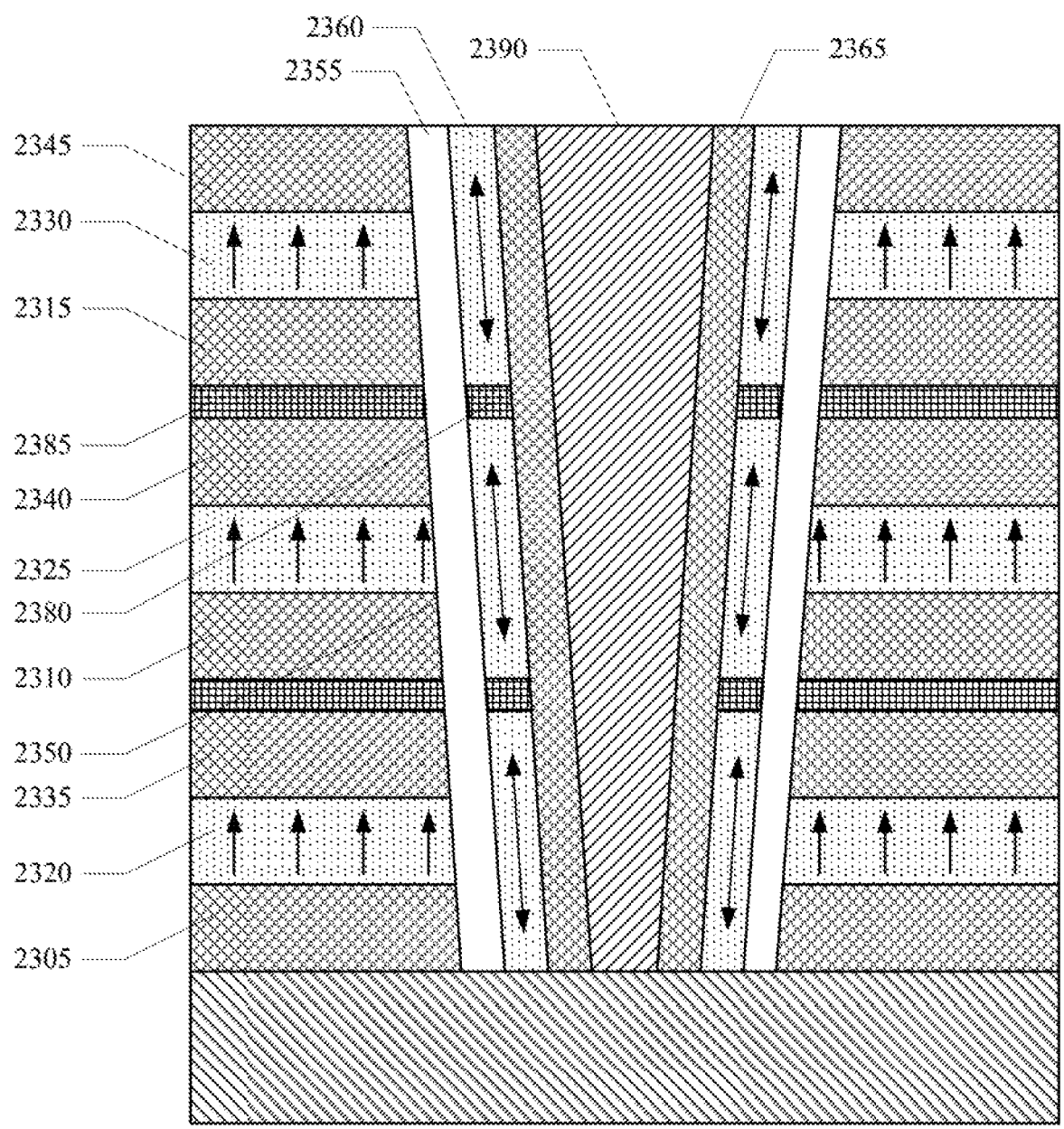

At 2260, annular conductive cores can be formed inside the annular non-magnetic layers in the array of annular openings. Th annular conductive cores in the array of annular openings can be coupled to a corresponding select transistor. In one implementation, an annular conductive core layer 2390 can be deposited on the surface of the annular magnetic layer 2345 inside and outside of the array of annular openings 2350, as illustrated in FIG. 23E. The annular conductive core can include one or more layers of MgO, SiOx, AlOx, are alloys thereof. Excess material of the annular conductive core layer 2390 can be removed by Chemical Mechanical Polishing (CMP) or other similar process to form annular conductive cores 2390 in the array of annular openings 2350, as illustrated in FIG. 23F.

At 2265, portions of one or more planar non-magnetic insulator layers and one or more planar reference magnetic layers can be removed in a periphery region to expose each planar reference magnetic layer. The periphery region can be outside the array of annular openings. In one implementation, a series of one or more etching, milling or the like processes can be used to step down through the planar non-magnetic insulator layers and the planar reference magnetic layers. At 2270, a bit line can be formed on each planar reference magnetic layer. In one implementation, a conductive layer can be deposited. A bit line pattern mask can be formed on the conductive layer and a selective etching process can be performed to remove the portions of the conductive layer exposed by the bit line pattern mask to form the plurality of bit lines on corresponding ones of the planar reference magnetic layers. The bit lines can be disposed as a plurality of substantially parallel traces in a first direction (e.g., rows) on respective planar reference magnetic layers, as illustrated in FIG. 13.

At 2275, one or more bit line vias can optionally be formed. The one or more bit line vias can be coupled to respective bit lines, as illustrated in FIGS. 18A and 18B. There are numerous conductive materials that can be utilized for the bit line vias, and there are numerous deposition, masking, and etching process that can be utilized for forming the plurality of bit line vias. The specific materials and processes are not germane to an understanding of aspects of the present technology and therefore will not be described in further detail.

At 2280, one or more global bit lines can be formed. The one or more global bit lines can be coupled to corresponding bit lines or bit line vias, as illustrated in FIGS. 7, 18A and 18B. In one implementation, two or more bit lines arranged in respective columns can be coupled together by a corresponding global bit line. There are numerous conductive materials that can be utilized for the global bit lines, and there are numerous deposition, masking, and etching process that can be utilized for forming the plurality of global bit lines. The specific materials and processes are not germane to an understanding of aspects of the present technology and therefore will not he described in further detail.

What is claimed is:

1. A device comprising:
a plurality of annular structures, each annular structure including an annular non-magnetic layer disposed about an annular conductive layer, a first annular free magnetic layer and a second annular free magnetic. layer disposed about the annular non-magnetic layer, the first and second annular free magnetic layers separated by a non-magnetic separator layer and an annular tunnel insulator disposed about the first and second of annular free magnetic layers and the non-magnetic separator layer;
a first planar reference magnetic layer disposed about the plurality of annular structures and separated from the respective first annular free magnetic layers of each of the plurality of annular structures by the respective annular tunnel insulator of each of the plurality of annular structures and the first planar reference magnetic layer aligned with the first annular free magnetic layer;
a first non-magnetic insulator layer disposed about the plurality of annular structures and on a first side of the first planar reference magnetic layer;
a second non-magnetic insulator layer disposed about the plurality of annular structures and on a second side of the first planar reference magnetic layers;
a second planar reference magnetic layer disposed about the plurality of annular structures and separated from the respective second annular free magnetic layers of each of the plurality of annular structures by the respective annular tunnel insulator of each of the plurality of annular structures, and the second planar reference magnetic layer aligned with the second annular free magnetic layer;
a third non-magnetic insulator layer disposed about the plurality of annular structures and between the second non-magnetic insulator layer and a first side of the second planar reference magnetic layer; and
a fourth non-magnetic insulator layer disposed about the plurality of annular structures and on a second side of the second planar reference magnetic layer.

2. The device of claim 1, further comprising:
each of the plurality of annular structures including a third annular free magnetic layer disposed about the annular non-magnetic layer, the third annular free magnetic layer separated from the second annular free magnetic layer by a second non-magnetic separator layer;
a third planar reference magnetic layer disposed about the plurality of annular structures and separated from the respective third annular free magnetic layers of each of the plurality of annular structures by the respective annular tunnel insulator of each of the plurality of annular structures, and the third planar reference magnetic layer aligned with the third annular free magnetic layer;
a fifth non-magnetic insulator layer disposed about the plurality of annular structures and between the fourth non-magnetic insulator layer and a first side of the third planar reference magnetic layer; and
a sixth non-magnetic insulator layer disposed about the plurality of annular structures and on a second side of the third planar reference magnetic layer.

3. The device of claim 1, further comprising:
a non-magnetic metal layer disposed between the second non-magnetic insulator layer and the third non-magnetic insulator layer.

4. The device of claim 1, wherein the plurality of non-magnetic separator layers comprise an oxide alloy including Cobalt-Iron-Boron (Co—Fe—B) and a non-magnetic material selected from the group consisting of Copper (Cu), Aluminum (Al), and Ruthenium (Ru).

5. The device of claim 1, wherein each annular structure comprises a conical structure including a conical non-magnetic layer disposed about a conical portion of the conductive layer, first and second conical free magnetic layers disposed about the conical non-magnetic layer, and a conical tunnel insulator disposed about the first and second conical free magnetic layers.

6. The device of claim 5, wherein each conical structure has a taper of approximately 10-45 degrees.

7. The device of claim 1, further comprising;
the plurality of annular structures arranged in columns and rows in the first and second planar reference magnetic layers; and
a plurality of insulator regions disposed in the first and second planar reference magnetic layers between a respective pair of columns of the plurality of annular structures.

8. The device of claim 1, wherein,
a magnetic field of the first and second planar reference magnetic layers has a fixed polarization substantially perpendicular to a major planar orientation of the first and second planar reference magnetic layers; and
a magnetic field of the annular free magnetic layer of each of the plurality of annular structures has a polarization substantially perpendicular to the major planar orientation of the first and second planar reference magnetic layers and selectively switchable between being substantially parallel and substantially antiparallel to the magnetic field of the first and second planar reference layers.

9. The device of claim 8, wherein,
the magnetic field of the first and second annular free magnetic layers of each of the plurality of annular structures is configured to switch to being substantially parallel to the magnetic field of the first and second planar reference magnetic layers in response to a current flow in a first direction through the respective conductive annular layer of the plurality of annular structures and to switch to being substantially antiparallel to the magnetic field of the first and second planar reference magnetic layers in response to a current flow in a second direction through the respective conductive annular layer of the plurality of annular structures.

10. A memory device, comprising:
an array of Magnetic Tunnel Junction (MJT) cells including;
- a plurality of annular structures arranged in columns and rows, each annular structure including an annular non-magnetic layer disposed about an annular conductive layer, a plurality of annular free magnetic layers disposed about the annular non-magnetic layer, the plurality of annular free magnetic layers separated from each other by corresponding ones of a plurality of non-magnetic separator layers, and an annular tunnel insulator disposed about the respective annular free magnetic layers;
- a plurality of planar reference magnetic layers disposed about the respective annular tunnel insulator of each of the plurality of annular structures and aligned with corresponding ones of the plurality of annular free magnetic layers;
- a first plurality of non-magnetic insulator layers disposed about the plurality of annular structures and on a first side of corresponding ones of the plurality of planar reference magnetic layers: and
- a second plurality of non-magnetic insulator layers disposed about the plurality of annular structures and on a second side of corresponding ones of the plurality of planar reference magnetic layers; and
- a planar non-magnetic conductive layer disposed between adjacent ones of the first plurality of non-magnetic insulator layers and the second plurality of non-magnetic insulator layers.

11. The memory device of claim 10, wherein,
a magnetic field of the plurality of planar reference magnetic layers has a fixed polarization substantially perpendicular to a major planar orientation of the plurality of planar reference magnetic layers; and
a magnetic field of the plurality of annular free magnetic layers of each of the plurality of annular structures has a polarization substantially perpendicular to the major planar orientation of the plurality of planar reference magnetic layers and selectively switchable between being substantially parallel and substantially antiparallel to the magnetic field of the plurality of planar reference layers.

12. The memory device of claim 11, wherein,
the magnetic field of the plurality of annular free magnetic layers of each of the plurality of annular structures is configured to switch to being substantially parallel to the magnetic field of the plurality of planar reference layers in response to a current flow in a first direction through the respective conductive annular layer of the plurality of annular structures and to switch to being substantially anti-parallel to the magnetic field of the plurality of planar reference layers in response to a current flow in a second direction through the respective conductive annular layer of the first plurality of annular structures.

13. The memory device of claim 10, further comprising:
the plurality of annular structures arranged in columns and rows in the plurality of planar reference magnetic layers: and
a plurality of insulator regions disposed in the plurality of planar reference magnetic layers between a respective pair of columns of the plurality of annular structures.

14. A memory device comprising:
an array of Magnetic Tunnel Junction (TS) cells arranged in cell columns and cell rows in a plurality of cell levels, wherein the MTJ cells in corresponding cell column and cell row positions in the plurality of cell levels are coupled together in cell strings, the MTJ cells in each cell string include;
- an annular structure including an annular non-magnetic layer disposed about an annular conductive layer, a plurality of annular free magnetic layers disposed about the annular non-magnetic layer, the annular free magnetic layer separated from each other by corresponding ones of a plurality of non-magnetic separator layers, and an annular tunnel insulator disposed about the plurality of annular free magnetic layers;
- a portion of corresponding ones of planar reference magnetic layers disposed about the annular structure and aligned with corresponding ones of the plurality of portions of the annular free magnetic layers;
- a portion of one or more planar non-magnetic insulator layers disposed on a first side of each of the plurality of planar reference magnetic layers and about the annular structure;
- a portion of one or more other planar non-magnetic insulator layers disposed on a second side of each of the plurality of planar reference magnetic layers and about the annular structure; and
a plurality of select elements arranged in select columns and select rows, wherein respective select elements are coupled to respective strings of MTJ cells in corresponding cell column and cell row positions.

15. The memory device of claim 14, further comprising:
a plurality of blocks of the array of cells arranged in block columns and block rows.

16. The memory device of claim 14, wherein the annular structure comprises a conical structure including a conical non-magnetic layer disposed about a conical portion of the conductive layer, a plurality of conical free magnetic layers disposed about the conical non-magnetic layer, and a conical tunnel insulator disposed about the plurality of conical free magnetic layers.

17. The memory device of claim 14, wherein,
a magnetic field of the planar reference magnetic layers have a fixed polarization substantially perpendicular to a major planar orientation of the planar reference magnetic layers; and
a magnetic field of the plurality of annular free magnetic layers have a polarization substantially perpendicular to the major planar orientation of the planar reference magnetic layers and selectively switchable between being substantially parallel and substantially antiparallel to the magnetic field of the planar reference layers.

18. The memory device of claim 17, wherein the magnetic field of the plurality of annular free magnetic layers is configured to switch to being substantially parallel to the magnetic field of the plurality of planar reference layers in response to a current flow in a first direction through the conductive annular layer and to switch to being substantially anti-parallel to the magnetic field of the plurality of planar reference layers in response to a current flow in a second direction through the conductive annular layer.

* * * * *